US012757321B2

(12) United States Patent
Kramer-Bottiglio et al.

(10) Patent No.: US 12,757,321 B2
(45) Date of Patent: Oct. 6, 2026

(54) BIPHASIC MATERIAL AND STRETCHABLE CIRCUIT BOARD

(71) Applicant: YALE UNIVERSITY, New Haven, CT (US)

(72) Inventors: Rebecca Kramer-Bottiglio, Hamden, CT (US); Shanliangzi Liu, New Haven, CT (US); Dylan Shah, New Haven, CT (US); Lina Mercedes Sanchez Botero, New Haven, CT (US); Stephanie Woodman, New Haven, CT (US)

(73) Assignee: YALE UNIVERSITY, New Haven, CT (US)

( * ) Notice: Subject to any disclaimer, the term of this patent is extended or adjusted under 35 U.S.C. 154(b) by 649 days.

(21) Appl. No.: 18/148,500

(22) Filed: Dec. 30, 2022

(65) Prior Publication Data

US 2023/0141247 A1 May 11, 2023

Related U.S. Application Data

(63) Continuation-in-part of application No. 17/357,060, filed on Jun. 24, 2021, now Pat. No. 11,937,372.

(Continued)

(51) Int. Cl.

*H05K 1/09* (2006.01)
*H05K 1/02* (2006.01)

(Continued)

(52) U.S. Cl.

CPC ......... *H05K 1/0283* (2013.01); *H05K 1/0277* (2013.01); *H05K 1/092* (2013.01);

(Continued)

(58) Field of Classification Search

CPC ...... H05K 1/0283; H05K 1/092; H05K 1/115; H05K 1/18; H05K 3/284; H05K 1/0277

See application file for complete search history.

(56) References Cited

U.S. PATENT DOCUMENTS 5,056,706 A 10/1991 Dolbear
5,173,256 A 12/1992 Booth (Continued)

OTHER PUBLICATIONS

Akihito Miyamoto, Sungwon Lee, Nawalage Florence Cooray, Sunghoon Lee, Mami Mori, Naoji Matsuhisa, Hanbit Jin, Leona Yoda, Tomoyuki Yokota, Akira Itoh, Masaki Sekino, Hiroshi Kawasaki, Tamotsu Ebihara, Masayuki Amagai, and Takao Someya. Inflammation-free, gas-permeable, lightweight, stretchable on-skin electronics with nanomeshes. Nature Nanotechnology, 12(9):907-913, 2017.

(Continued)

*Primary Examiner* — Steven T Sawyer
(74) *Attorney, Agent, or Firm* — Riverside Law LLP

(57) ABSTRACT

Provided are biphasic compositions including a quantity of a conductive liquid and a plurality of a particulate suspended in the quantity of conductive liquid, wherein there is sufficient wetting between the solid particles and the conductive liquid and wherein the resistance of the compositions are less than the resistance for a bulk conductor when strained as defined by Pouillet's law. Also provided are stretchable circuit board assemblies including the biphasic compositions and methods of using the stretchable circuit board assemblies including the biphasic compositions.

20 Claims, 58 Drawing Sheets

Related U.S. Application Data

(60) Provisional application No. 63/043,417, filed on Jun. 24, 2020.

(51) Int. Cl.
*H05K 1/11* (2006.01)
*H05K 1/18* (2006.01)
*H05K 3/28* (2006.01)

(52) U.S. Cl.
CPC ............... *H05K 1/115* (2013.01); *H05K 1/18* (2013.01); *H05K 3/284* (2013.01)

(56) References Cited

U.S. PATENT DOCUMENTS

| | | | | |
|---|---|---|---|---|
| 5,198,189 | A | 3/1993 | Booth | |
| 6,339,120 | B1 | 1/2002 | Misra | |
| 9,228,822 | B2 | 1/2016 | Majidi | |
| 10,462,897 | B2 | 10/2019 | Fedder | |
| 10,645,803 | B2 | 5/2020 | Majidi | |
| 10,672,530 | B2 | 6/2020 | Ronay | |
| 10,720,261 | B2 | 7/2020 | Majidi | |
| 10,757,815 | B2 | 8/2020 | Majidi | |
| 10,777,483 | B1 | 9/2020 | Kazem | |
| 10,945,339 | B2 | 3/2021 | Majidi | |
| 11,017,915 | B2 | 5/2021 | Majidi | |
| 11,088,063 | B2 | 8/2021 | Ronay | |
| 11,156,509 | B2 | 10/2021 | Ronay | |
| 11,184,975 | B2 | 11/2021 | Charalambides | |
| 11,222,735 | B2 | 1/2022 | Ronay | |
| 11,232,883 | B2 | 1/2022 | Majidi | |
| 11,335,622 | B2 | 5/2022 | Kazem | |
| 11,395,413 | B2 | 7/2022 | Tavakoli | |
| 11,523,514 | B2 | 12/2022 | Majidi | |
| 11,585,705 | B2 | 2/2023 | Ronay | |
| 11,594,480 | B2 | 2/2023 | Ronay | |
| 11,607,863 | B1 | 3/2023 | Ronay | |
| 11,619,554 | B2 | 4/2023 | Ronay | |
| 11,664,565 | B1 | 5/2023 | Ronay | |
| 11,682,276 | B2 | 6/2023 | Majidi | |
| 11,682,615 | B2 | 6/2023 | Ronay | |
| 11,688,677 | B2 | 6/2023 | Ronay | |
| 2008/0277631 | A1 | 11/2008 | Smela | |
| 2009/0317639 | A1* | 12/2009 | Axisa | H05K 1/0283 428/411.1 |
| 2013/0312541 | A1 | 11/2013 | Majidi | |
| 2016/0234931 | A1 | 8/2016 | Majidi | |
| 2017/0218167 | A1 | 8/2017 | Majidi | |
| 2017/0340279 | A1* | 11/2017 | Feng | H05K 1/0283 |
| 2018/0027661 | A1* | 1/2018 | Ogura | H05K 3/284 361/749 |
| 2018/0077794 | A1* | 3/2018 | Iwase | H05K 3/361 |
| 2018/0206336 | A1 | 7/2018 | Fedder | |
| 2018/0247727 | A1 | 8/2018 | Ronay | |
| 2018/0263114 | A1* | 9/2018 | Ogura | H05K 1/189 |
| 2018/0289946 | A1* | 10/2018 | Hirsch | C22C 1/12 |
| 2018/0315518 | A1 | 11/2018 | Ronay | |
| 2018/0317318 | A1* | 11/2018 | Yamada | H05K 1/0283 |
| 2019/0056277 | A1 | 2/2019 | Ronay | |
| 2019/0082532 | A1 | 3/2019 | Majidi | |
| 2019/0215965 | A1* | 7/2019 | Majidi | H05K 1/09 |
| 2020/0029428 | A1 | 1/2020 | Fedder | |
| 2020/0066628 | A1 | 2/2020 | Ronay | |
| 2020/0105440 | A1* | 4/2020 | Mahajan, Jr. | H01B 7/0225 |
| 2020/0221580 | A1 | 7/2020 | Tavakoli | |
| 2020/0234842 | A1 | 7/2020 | Majidi | |
| 2020/0296825 | A1* | 9/2020 | Ozdoganlar | H01L 23/4985 |
| 2020/0315019 | A1 | 10/2020 | Majidi | |
| 2020/0328007 | A1 | 10/2020 | Majidi | |
| 2020/0362218 | A1 | 11/2020 | Kazem | |
| 2020/0365293 | A1 | 11/2020 | Ronay | |
| 2020/0381349 | A1 | 12/2020 | Ronay | |
| 2020/0386630 | A1 | 12/2020 | Ronay | |
| 2020/0413533 | A1 | 12/2020 | Majidi | |
| 2021/0204410 | A1 | 7/2021 | Majidi | |
| 2021/0209906 | A1 | 7/2021 | Majidi | |
| 2021/0265074 | A1 | 8/2021 | Majidi | |
| 2021/0272873 | A1 | 9/2021 | Kazem | |
| 2021/0280482 | A1 | 9/2021 | Ronay | |
| 2021/0282270 | A1 | 9/2021 | Carbo | |
| 2021/0307165 | A1* | 9/2021 | Kang | H05K 3/4038 |
| 2021/0410283 | A1 | 12/2021 | Bottiglio | |
| 2022/0098461 | A1 | 3/2022 | Majidi | |
| 2022/0346238 | A1 | 10/2022 | Tavakoli | |

OTHER PUBLICATIONS

Ben O'Brien, Todd Gisby, and Iain A. Anderson. Stretch sensors for human body motion. In Proc. SPIE 9056, vol. 9056, p. 905618. International Society for Optics and Photonics, Mar. 2014.

Benjamin C. K. Tee and Jianyong Ouyang. Soft electronically functional polymeric composite materials for a flexible and stretchable digital future. Advanced Materials, 30(47):1802560, 2018.

C. V. Ramana, E. J. Rubio, C. D. Barraza, A. Miranda Gallardo, Samantha McPeak, Sushma Kotru, and J. T. Grant. Chemical bonding, optical constants, and electrical resistivity of sputter-deposited gallium oxide thin films. Journal of Applied Physics, 115(4):043508, Jan. 2014.

Carl Thrasher, Zachary Farrell, Nicholas Morris, Carson Willey, and Christopher Tabor. Mechanoresponsive polymerized liquid metal networks. Advanced Materials, 31:1903864, 2019.

Chang, H. et al. Recoverable liquid metal paste with reversible rheological characteristic for electronics printing. ACS Appl. Mater. Interfaces 12, 14125-14135 (2020).

Chaoyi Yan and Pooi See Lee. Stretchable energy storage and conversion devices. Small, 10(17):3443-3460, 2014.

Christoph Keplinger, Jeong-Yun Sun, Choon Chiang Foo, Philipp Rothemund, George M. Whitesides, and Zhigang Suo. Stretchable, transparent, ionic conductors. Science, 341(6149):984-987, 2013.

Collin Ladd, Ju-Hee So, John Muth, and Michael D Dickey. 3d printing of free standing liquid metal microstructures. Advanced Materials, 25(36):5081-5085, 2013.

Cutinho, J. et al. Autonomous thermal-oxidative composition inversion and texture tuning of liquid metal surfaces. ACS Nano 12, 4744-4753 (2018).

D Zrnic and DS Swatik. On the resistivity and surface tension of the eutectic alloy of gallium and indium. Journal of the less common metals, 18(1):67-68, 1969.

D.S. Gray, J. Tien, and C.S. Chen. High-conductivity elastomeric electronics. Advanced Materials, 16:No. 5, 2004. 5 pages.

Daalkhaijav, U., Yirmibesoglu, O. D., Walker, S. & Mengüç, Y. Rheological modification of liquid metal for additive manufacturing of stretchable electronics. Adv. Mater. Technol. 3, 1700351 (2018).

Dae-Hyeong Kim, Nanshu Lu, Rui Ma, Yun-Soung Kim, Rak-Hwan Kim, Shuodao Wang, Jian Wu, Sang Min Won, Hu Tao, Ahmad Islam, et al. Epidermal electronics. Science, 333(6044):838-843, 2011.

Dae-Hyeong Kim, Roozbeh Ghaffari, Nanshu Lu, and John A. Rogers. Flexible and stretchable electronics for biointegrated devices. Annual Review of Biomedical Engineering, 14(1):113-128, 2012.

Daniel Green Marques, Pedro Alhais Lopes, Anibal T. de Almeida, Carmel Majidi, and Mahmoud Tavakoli. Reliable interfaces for EGaIn multi-layer stretchable circuits and microelectronics. Lab on a Chip, 19:897-906, 2019.

Dickey Michael D. Stretchable and soft electronics using liquid metals. Advanced Materials, 29(27):1606425, 2017.

Dustin Chen and Qibing Pei. Electronic muscles and skins: A review of soft sensors and actuators. Chemical Reviews, 117(17):11239-11268, 2017.

Edward L. White, Michelle C. Yuen, Jennifer C. Case, and Rebecca K. Kramer. Low-cost, facile, and scalable manufacturing of capacitive sensors for soft systems. Advanced Materials Technologies, 2(9):1700072, 2017.

Ethan B Secor, Alexander B Cook, Christopher E Tabor, and Mark C Hersam. Wiring up liquid metal: Stable and robust electrical contacts enabled by printable graphene inks. Advanced Electronic Materials, 4(1):1700483, 2018.

(56) References Cited

OTHER PUBLICATIONS

F Scharmann, G Cherkashinin, V Breternitz, Ch Knedlik, G Hartung, Th Weber, and JA Schaefer. Viscosity effect on gainsn studied by xps. Surface and Interface Analysis: An International Journal devoted to the development and application of techniques for the analysis of surfaces, interfaces and thin films, 36(8):981-985, 2004.
G.K. Reeves and H.B. Harrison. Obtaining the specific contact resistance from transmission line model measurements. IEEE Electron Device Letters, 3(5):111-113, 1982.
Hristiyan Stoyanov, Matthias Kollosche, Sebastian Risse, Rémi Waché, and Guggi Kofod. Soft conductive elastomer materials for stretchable electronics and voltage controlled artificial muscles. Advanced Materials, 25(4):578-583, 2013.
Ishan D Joshipura, Hudson R Ayers, Carmel Majidi, and Michael D Dickey. Methods to pattern liquid metals. Journal of materials chemistry c, 3(16):3834-3841, 2015.
J. A. Rogers, T. Someya, and Y. Huang. Materials and mechanics for stretchable electronics. Science, 327(5973):1603-1607, 2010.
Jae-Woong Jeong, Woon-Hong Yeo, Aadeel Akhtar, James J. S. Norton, Young-Jin Kwack, Shuo Li, Sung-Young Jung, Yewang Su, Woosik Lee, Jing Xia, Huanyu Cheng, Yonggang Huang, Woon-Seop Choi, Timothy Bretl, and John A. Rogers. Materials and optimized designs for human-machine interfaces via epidermal electronics. Advanced Materials, 25(47):6839-6846, 2013.
Jiajie Liang, Kwing Tong, and Qibing Pei. A water-based silver-nanowire screen-print ink for the fabrication of stretchable conductors and wearable thin-film transistors. Advanced Materials, 28(28):5986-5996, 2016.
Jiangxin Wang and Pooi See Lee. Progress and prospects in stretchable electroluminescent devices. Nanophotonics, 6(2):435-451, 2016.
John A. Rogers, Roozbeh Ghaffari, and Dae-Hyeong Kim. Stretchable Bioelectronics for Medical Devices and Systems. Springer, 2016. 317 pages.
Kyoung-Yong Chun, Youngseok Oh, Jonghyun Rho, Jong-Hyun Ahn, Young-Jin Kim, Hyouk Ryeol Choi, and Seunghyun Baik. Highly conductive, printable and stretchable composite films of carbon nanotubes and silver. Nature Nanotechnology, 5(12):853-857, 2010.
Liu, S., Shah, D.S. & Kramer-Bottiglio, R. Highly stretchable multilayer electronic circuits using biphasic gallium-indium. Nat. Mater. 20, 851-858 (2021).
Mahmoud Tavakoli, Mohammad H. Malakooti, Hugo Paisana, Yunsik Ohm, Daniel Green Marques, Pedro Alhais Lopes, Ana P. Piedade, Anibal T. de Almeida, and Carmel Majidi. EGaIn-assisted room-temperature sintering of silver nanoparticles for stretchable, inkjet-printed, thin-film electronics. Advanced Materials, 30:1801852, 2018.
Marcel Pourbaix. Atlas of electrochemical equilibria in aqueous solution. NACE, 307, 1974.
Markvicka, E. J., Bartlett, M. D., Huang, X. & Majidi, C. An autonomously electrically self-healing liquid metal-elastomer composite for robust soft-matter robotics and electronics. Nat. Mater. 17, 618-624 (2018).
Matteo Stoppa and Alessandro Chiolerio. Wearable electronics and smart textiles: A critical review. Sensors, 14(7):11957-11992, 2014.
Michael D. Bartlett, Eric J. Markvicka, and Carmel Majidi. Rapid Fabrication of Soft, Multilayered Electronics for Wearable Biomonitoring. Advanced Functional Materials, 26(46):8496-8504, Dec. 2016.
Minwoo Park, Jungkyun Im, Minkwan Shin, Yuho Min, Jaeyoon Park, Heesook Cho, Soojin Park, Mun-Bo Shim, Sanghun Jeon, Dae-Young Chung, Jihyun Bae, Jongjin Park, Unyong Jeong, and Kinam Kim. Highly stretchable electric circuits from a composite material of silver nanoparticles and elastomeric fibres. Nature Nanotechnology, 7(12):803-809, 2012.
N. F. Uvarov. Estimation of composites conductivity using a general mixing rule. Solid State Ionics, 136-137:1267-1272, Nov. 2000.
Nanshu Lu and Dae-Hyeong Kim. Flexible and stretchable electronics paving the way for soft robotics. Soft Robotics, 1(1):53-62, 2014.
Naoji Matsuhisa, Daishi Inoue, Peter Zalar, Hanbit Jin, Yorishige Matsuba, Akira Itoh, Tomoyuki Yokota, Daisuke Hashizume, and Takao Someya. Printable elastic conductors by in situ formation of silver nanoparticles from silver flakes. Nature Materials, 16(8):834-840, 2017.
Naoji Matsuhisa, Martin Kaltenbrunner, Tomoyuki Yokota, Hiroaki Jinno, Kazunori Kuribara, Tsuyoshi Sekitani, and Takao Someya. Printable elastic conductors with a high conductivity for electronic textile applications. Nature Communications, 6(1):1-11, 2015.
Naoji Matsuhisa, Xiaodong Chen, Zhenan Bao, and Takao Someya. Materials and structural designs of stretchable conductors. Chemical Society Reviews, 48(11):2946-2966, 2019.
Office Action (Non-Final Rejection) dated Feb. 15, 2023 for U.S. Appl. No. 17/357,060 (pp. 1-5).
Ozutemiz Kadri Bugra, Wissman James, Ozdoganlar Osman Burak, and Majidi Carmel. EGaIn-metal interfacing for liquid metal circuitry and microelectronics integration. Advanced Materials Interfaces, 5:1701596, 2018.
Raymond Adam Bilodeau, Amir Mohammadi Nasab, Dylan Sanjay Shah, and Rebecca Kramer-Bottiglio. Uniform conductivity in stretchable silicones via multiphase inclusions. Soft Matter, 2020. 14 pages.
Shanliangzi Liu, Michelle C. Yuen, Edward L. White, J. William Boley, Biwei Deng, Gary J. Cheng, and Rebecca Kramer-Bottiglio. Laser sintering of liquid metal nanoparticles for scalable manufacturing of soft and flexible electronics. ACS Applied Materials & Interfaces, 10(33):28232-28241, 2018.
Shanliangzi Liu, Serrae N.Reed, Matthew J.Higgins, Michael S.Titus, and Rebecca Kramer-Bottiglio. Oxide rupture-induced conductivity in liquid metal nanoparticles by laser and thermal sintering. Nanoscale, 11(38):17615-17629, 2019.
Shantonu Biswas, Andreas Schoeberl, Yufei Hao, Johannes Reiprich, Thomas Stauden, Joerg Pezoldt, and Heiko O Jacobs. Integrated multilayer stretchable printed circuit boards paving the way for deformable active matrix. Nature communications, 10(1):1-8, 2019.
Shigeo Ohira and Naoki Arai. Wet chemical etching behavior of β-ga2o3 single crystal. physica status solidi c, 5(9):3116-3118, 2008.
Shu Zhu, Ju-Hee So, Robin Mays, Sharvil Desai, William R. Barnes, Behnam Pourdeyhimi, and Michael D. Dickey. Ultrastretchable fibers with metallic conductivity using a liquid metal alloy core. Advanced Functional Materials, 23(18):2308-2314, 2013.
A Novel Strategy for Preparing Stretchable and Reliable Biphasic Liquid Metal, Wu et al., Adv. Funct. Mater. 2019, 29, 1903840.
Liquid-Metal-Coated Magnetic Particles toward Writable, Nonwettable, Stretchable Circuit Boards, and Directly Assembled Liquid Metal-Elastomer Conductors, Kim et al., ACS Appl. Mater. Interfaces 2022, 14, 37110-37119.
Office Action (Notice of Allowance and Fees Due (PTOL-85)) dated Jan. 31, 2024 for U.S. Appl. No. 17/357,060 (pp. 1-8).
Sin-Liang Ou, Dong-Sing Wuu, Yu-Chuan Fu, Shu-Ping Liu, Ray-Hua Horng, Lei Liu, and Zhe-Chuan Feng. Growth and etching characteristics of gallium oxide thin films by pulsed laser deposition. Materials Chemistry and Physics, 133(2-3):700-705, 2012.
Steven I. Rich, Robert J. Wood, and Carmel Majidi. Untethered soft robotics. Nature Electronics, 1(2):102-112, 2018.
Suin Kim, Jihye Oh, Dahee Jeong, and Joonbum Bae. Direct wiring of eutectic gallium-indium to a metal electrode for soft sensor systems. ACS Applied Materials & Interfaces, 11(22):20557-20565, 2019.
Sumin Lim, Donghee Son, Jaemin Kim, Young Bum Lee, Jun-Kyul Song, Suji Choi, Dong Jun Lee, Ji Hoon Kim, Minbaek Lee, Taeghwan Hyeon, and Dae-Hyeong Kim. Transparent and stretchable interactive human machine interface based on patterned graphene heterostructures. Advanced Functional Materials, 25(3):375-383, 2015.
Tong Lu, Eric J. Markvicka, Yichu Jin, and Carmel Majidi. Soft-matter printed circuit board with UV laser micropatterning. ACS Applied Materials & Interfaces, 9(26):22055-22062, 2017.
Tsuyoshi Sekitani, Hiroyoshi Nakajima, Hiroki Maeda, Takanori Fukushima, Takuzo Aida, Kenji Hata, and Takao Someya. Stretchable active-matrix organic light-emitting diode display using printable elastic conductors. Nature Materials, 8(6):494-499, 2009.

(56) References Cited

OTHER PUBLICATIONS

Wang Jiangxin, Cai Guofa, Li Shaohui, Gao Dace, Xiong Jiaqing, and Lee Pooi See. Printable superelastic conductors with extreme stretchability and robust cycling endurance enabled by liquid-metal particles. Advanced Materials, 30:1706157, 2018.
William F Reus, Martin M Thuo, Nathan D Shapiro, Christian A Nijhuis, and George M Whitesides. The sam, not the electrodes, dominates charge transport in metal-monolayer//ga2o3/gallium-indium eutectic junctions. ACS nano, 6(6):4806-4822, 2012.
Yakov I Rabinovich, Madhavan S Esayanur, and Brij M Moudgil. Capillary forces between two spheres with a fixed volume liquid bridge: theory and experiment. Langmuir, 21(24):10992-10997, 2005.
Young-Joo Lee, Seung-Min Lim, Seol-Min Yi, Jeong-Ho Lee, Sung-gyu Kang, Gwang-Mook Choi, Heung Nam Han, Jeong-Yun Sun, In-Suk Choi, and Young-Chang Joo. Auxetic elastomers: Mechanically programmable meta-elastomers with an unusual poissons ratio overcome the gauge limit of a capacitive type strain sensor. Extreme Mechanics Letters, 31:100516, 2019.
Yue Wang, Chenxin Zhu, Raphael Pfattner, Hongping Yan, Lihua Jin, Shucheng Chen, Francisco Molina-Lopez, Franziska Lissel, Jia Liu, Noelle I. Rabiah, Zheng Chen, Jong Won Chung, Christian Linder, Michael F. Toney, Boris Murmann, and Zhenan Bao. A highly stretchable, transparent, and conductive polymer. Science Advances, 3(3):e1602076, 2017.
Yuhao Liu, Matt Pharr, and Giovanni Antonio Salvatore. Lab-on-skin: A review of flexible and stretchable electronics for wearable health monitoring. ACS Nano, 11(10):9614-9635, 2017.
Yun-hui Wu, Zhi-fu Deng, Ze-fei Peng, Rong-min Zheng, Shu-qi Liu, Shu-ting Xing, Jun-yun Li, De-qun Huang, and Lan Liu. A novel strategy for preparing stretchable and reliable biphasic liquid metal. Advanced Functional Materials, 29(36):1903840, 2019.
Zhenlong Huang, Yifei Hao, Yang Li, Hongjie Hu, Chonghe Wang, Akihiro Nomoto, Taisong Pan, Yue Gu, Yimu Chen, Tianjiao Zhang, Weixin Li, Yusheng Lei, NamHeon Kim, Chunfeng Wang, Lin Zhang, Jeremy W. Ward, Ayden Maralani, Xiaoshi Li, Michael F. Durstock, Albert Pisano, Yuan Lin, and Sheng Xu. Three-dimensional integrated stretchable electronics. Nature Electronics, 1(8):473-480, 2018.
Characterization and Manipulation of Interfacial Activity for Aqueous Galinstan Dispersions, Koh et al., Adv. Mater. Interfaces 2018, 5, 1701240.
Office Action (Non-Final Rejection) dated Aug. 10, 2023 for U.S. Appl. No. 17/357,060 (pp. 1-5).

* cited by examiner

| Sample 1 | Weight ($g$) | Density ($g/cm^3$) | Volume ($mm^3$) | $V_s^0/V_l$ |
|---|---|---|---|---|
| Liquid | 0.0187 | 6.25 (eGaIn) | 2.992 | |
| Solid | 0.0104 | 5.88 ($\beta$-$Ga_2O_3$) | 1.769 | 0.591 |
| **Sample 2** | **Weight ($g$)** | **Density ($g/cm^3$)** | **Volume ($mm^3$)** | **$V_s^0/V_l$** |
| Liquid | 0.0225 | 6.25 (eGaIn) | 3.6 | |
| Solid | 0.011 | 5.88 ($\beta$-$Ga_2O_3$) | 1.871 | 0.520 |
| | | | | $V_s^0/V_l$ |
| | | | Average | 0.555 |

Fig. 9C

BIPHASIC MATERIAL AND STRETCHABLE CIRCUIT BOARD

CROSS-REFERENCE TO RELATED APPLICATIONS

This application is a continuation-in-part of U.S. patent application Ser. No. 17/357,060, filed Jun. 24, 2021, which claims priority to U.S. provisional application No. 63/043,417, filed on Jun. 24, 2020, each of which is incorporated herein by reference in its entirety.

STATEMENT REGARDING FEDERALLY SPONSORED RESEARCH OR DEVELOPMENT

This invention was made with government support under 1812948, 1830870, 1454284, and 1954591 awarded by National Science Foundation and under 80NSSC17K0164 awarded by National Aeronautics and Space Administration. The government has certain rights in the invention.

BACKGROUND OF THE INVENTION

Soft and stretchable electronics are being integrated into next-generation electronic devices in a broad range of emerging fields, including soft robotics, wearable electronics, biomedical devices, and human-machine interfaces. Encouraging progress has been made in developing novel materials and architectures for stretchable sensors, displays, heaters, energy storage devices, and integrated circuits. However, the field still lacks highly stretchable, multilayer electronic circuits with integrated computation, efficient data transmission, and minimal electrical losses. Commercial electronics can provide a wide range of unobtrusive, inexpensive, high-performance integrated circuits (ICs), ranging from microcontrollers to amplifiers, but creating stretchable circuits with these ICs requires a robust interface between each circuit element.

Three common strategies to enable stretchable electronics are structure-based stretchable conductors, intrinsically stretchable conductors, and conductive composites. Highly conductive, inextensible thin metal films can be geometrically patterned to gain out-of-plane deformability and linear stretchability. Although such films interface well with traditional electronic components, their stretchability and component areal density are often limited. Intrinsically stretchable conductors—such as room temperature liquid metals (e.g. eutectic gallium-indium or eGaIn), ionic conductors, and conducting polymers—do not require sophisticated patterning, but each suffers from a range of problems, including leaking, dehydration embrittlement, or low conductivity. Conductive inclusion polymer composites are also stretchable without complex patterning, but usually suffer from low maximum strains and high resistance.

Significant effort has been devoted to making reliable junctions between stretchable parts and commercially available, high performance ICs. One popular approach, placing conventional electronic components onto strain-isolating (rigid) islands, reduces both the stretchability and durability of the resulting circuits. Another approach uses liquid metal droplets or solder paste to make temporary connections, but stretchability of these solutions is usually limited to less than 100%, without consistent cyclic performance. Overall, a facile and scalable process to attain reliable conductor-component interfaces under large repetitive strain is still missing.

Thus, there is a need in the art for materials and processes for creating stretchable versions of conventional printed circuit board (PCB) assemblies, to create highly stretchable conductive traces and robust interfaces between soft and rigid electronic components. A suitable material should be a printable material that maintains a near-constant resistance under extreme strains, maintains direct, consistent, and stretchable electrical connections with conventional electronic components, and is mechanically stable when applied onto numerous soft materials.

SUMMARY OF THE INVENTION

In one aspect, the present invention provides a biphasic composition. The composition comprises a conductive liquid and a particulate suspended in the conductive liquid, wherein the composition has a maximum normalized resistance of about 1 to about 15 at 400% strain. In some embodiments, the composition has a maximum normalized resistance of about 5 to about 8 at 400% strain. In some embodiments, the conductive liquid comprises at least one of an alkali metal, an alkaline earth metal, a post-transition metal, and a late transition metal. In some embodiments, the conductive liquid comprises gallium, indium, lead, mercury, tin, zinc, silver, gold, copper, silicon, bismuth, a non-eutectic mixture thereof, or a eutectic mixture thereof. In some embodiments, the conductive liquid comprises gallium and indium. In some embodiments, the particulate is selected from the group consisting of gallium oxide, a lithium oxide, a metal oxide, a group 13 oxide, silicon, doped silicon, a silicon oxide, germanium, indium antimonide, indium oxide, chromium oxide, silver, gold, nickel, copper, tin, and metal flakes. In some embodiments, the particulate is gallium oxide. In some embodiments, the particulate has a median particle size between 100 nm and 200 microns. In some embodiments, the volumetric ratio of particulate to conductive liquid is between 0.02 and 0.70. In some embodiments, the volumetric ratio of particulate to conductive liquid is between 0.45 and 0.55. In some embodiments, at least 50% of the particulate deviate no more than between 100 nm and 400 nm from the median particle size. In some embodiments, at least 65% of the particulate deviate no more than between 100 nm and 400 nm from the median particle size. In some embodiments, the particulate is crystalline. In some embodiments, the particulate is amorphous. In some embodiments, the particulate comprises both a crystalline and an amorphous particulate. In some embodiments, the particulate is semi-conductive. In some embodiments, the particulate is non-conductive. In some embodiments, the particulate is conductive.

In another aspect, the present invention provides a stretchable circuit board assembly. The assembly comprises at least one stretchable substrate layer, at least one conductive trace comprising any of the biphasic compositions described herein and positioned over at least one surface of the stretchable substrate, at least one electrical component electrically connected to the at least one conductive trace and positioned over the at least one surface of the stretchable substrate, optionally at least one stretchable encapsulating layer positioned over the at least one stretchable substrate, the at least one trace, and the at least one electrical component, configured to cover the at least one trace and the at least one electrical component, and optionally at least one vertical interconnected access (VIA) connecting at least two traces across at least one stretchable substrate layer, at least one encapsulating layer or a combination thereof. In some embodiments, the assembly further comprises an adhesive configured to secure the at least one electrical component to the stretchable substrate, and at least one electrical lead electrically connected to the at least one trace, the electrical lead configured to electrically connect the at least one trace to at least one external electrical system. In some embodiments, the at least one stretchable substrate is selected from the group consisting of VHB tape, paper, high-porosity foam, rubber, tape, silicone, polyimide, fabric, spandex, latex and combinations thereof. In some embodiments, the at least one stretchable substrate is porous. In some embodiments, the at least one stretchable substrate is modified by drilling, cutting, or a combination thereof of the stretchable substrate. In some embodiments, the stretchable encapsulating layer is porous. In some embodiments, the stretchable encapsulating layer is modified by drilling, cutting, or a combination thereof of the stretchable encapsulating layer. In some embodiments, the assembly further comprises a second stretchable encapsulating layer positioned over the at least one trace, at least one second trace positioned over the second stretchable encapsulating layer, electrically connected to the at least one electrical component, and at least one vertical interconnect access (VIA) electrically connected to the at least one trace and the at least one second trace. In some embodiments, the at least one stretchable substrate comprises at least one additive, at least one tackifier, at least one adhesive, or a combination thereof. In some embodiments, the at least one additive is selected from the group consisting of silanes, primers, coupling agents, tactile mutators, oxidizers, acids, bases and combinations thereof. In some embodiments, the assembly further includes surface treating the at least one stretchable substrate or the at least one electrical component. In some embodiments, the surface treating is plasma treatment. In some embodiments, the at least one electrical component is surface treated on at least a portion of at least one surface. In some embodiments, the at least one surface treated electrical component is plasma treated or coated with silanes, coupling agents, adhesives, oxidizers, acids, bases or combinations thereof. In some embodiments, the at least one electrical component is selected from the group consisting of copper pads, integrated circuits, silicon dies, resistors, capacitors, inductors, wires, optical components, antennas, displays, user interfaces, sensors, actuators, other circuit board assemblies and combinations thereof.

In another aspect, the present invention provides a method of using a stretchable circuit board assembly. The method includes the steps of providing at least one stretchable circuit board assembly comprising at least one stretchable substrate layer, at least one conductive trace comprising any of the biphasic compositions described herein and positioned over at least one surface of the stretchable substrate, at least one electrical component electrically connected to the at least one conductive trace and positioned over the at least one surface of the stretchable substrate, optionally at least one stretchable encapsulating layer positioned over the at least one stretchable substrate, the at least one trace, and the at least one electrical component, configured to cover the at least one trace and the at least one electrical component, and optionally at least one vertical interconnected access (VIA) connecting at least two traces across at least one stretchable substrate layer, at least one encapsulating layer or a combination thereof, and incorporating the at least one stretchable circuit board assembly into a wearable garment for sleep studies, diagnosis of sleep disorders, health tracking, fitness tracking, physical rehabilitation or combinations thereof.

In another aspect, the present invention provides a method of using a stretchable circuit board assembly including the steps of providing at least one stretchable circuit board assembly comprising at least one stretchable substrate layer, at least one conductive trace comprising any of the biphasic compositions described herein and positioned over at least one surface of the stretchable substrate, at least one electrical component electrically connected to the at least one conductive trace and positioned over the at least one surface of the stretchable substrate, optionally at least one stretchable encapsulating layer positioned over the at least one stretchable substrate, the at least one trace, and the at least one electrical component, configured to cover the at least one trace and the at least one electrical component, and optionally at least one vertical interconnected access (VIA) connecting at least two traces across at least one stretchable substrate layer, at least one encapsulating layer or a combination thereof, and incorporating the at least one stretchable circuit board assembly into a robotic system comprising one or more robots, robot-robot interfaces, human-robot interfaces, or combinations thereof.

In another aspect, the present invention provides a method of using a stretchable circuit board assembly comprising the steps of providing at least one stretchable circuit board assembly comprising at least one stretchable substrate layer, at least one conductive trace comprising any of the biphasic compositions described herein and positioned over at least one surface of the stretchable substrate, at least one electrical component electrically connected to the at least one conductive trace and positioned over the at least one surface of the stretchable substrate, optionally at least one stretchable encapsulating layer positioned over the at least one stretchable substrate, the at least one trace, and the at least one electrical component, configured to cover the at least one trace and the at least one electrical component, and optionally at least one vertical interconnected access (VIA) connecting at least two traces across at least one stretchable substrate layer, at least one encapsulating layer or a combination thereof, and incorporating the at least one stretchable circuit board assembly into an electronic device selected from the group consisting of a cell phone, a haptic device, a tablet, a display, a virtual reality headset, a handset, a sensor, an array of sensors, a gaming device, and combinations thereof.

BRIEF DESCRIPTION OF THE DRAWINGS

The foregoing purposes and features, as well as other purposes and features, will become apparent with reference to the description and accompanying figures below, which are included to provide an understanding of the invention and constitute a part of the specification, in which like numerals represent like elements, and in which:

FIG. 9C shows a table of experimental data for measuring the initial volume fraction of solid particles, $$V_s^0/V_l.$$

(a), and the conductivity of bGaIn as a function of strain (b) predicted with the experimental data (bGaIn films on PDMS, blue, and bGaIn films on VHB, pink).

Figure 10A:
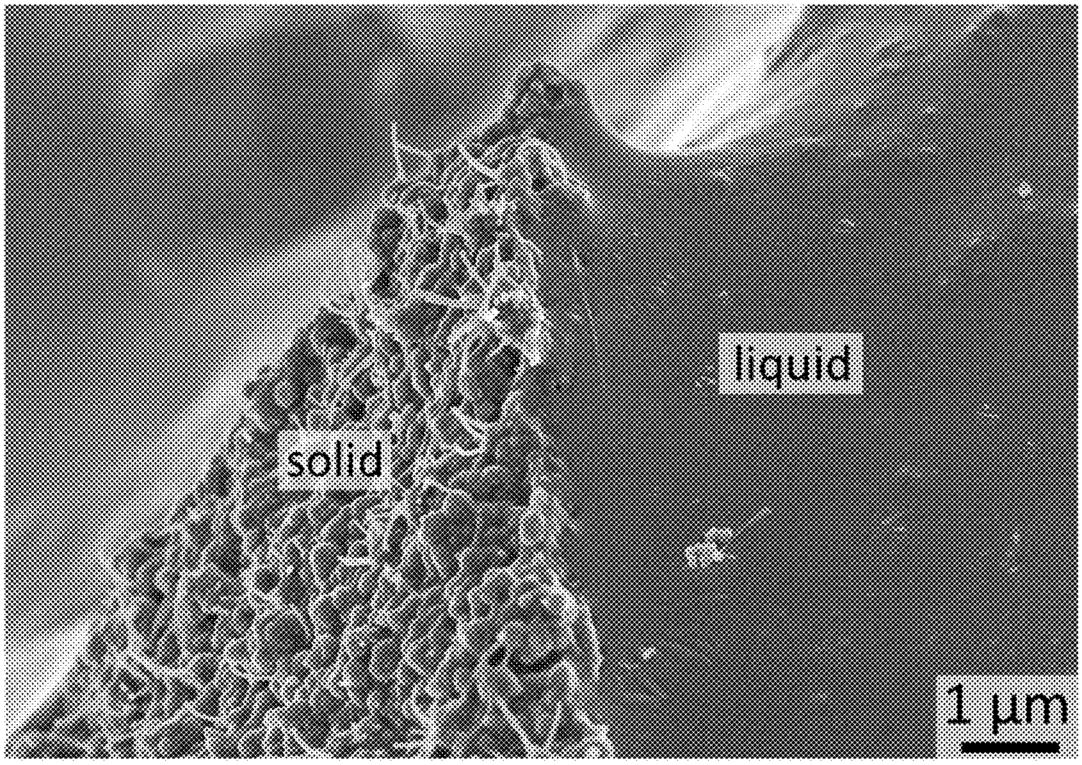
Figure 10B:
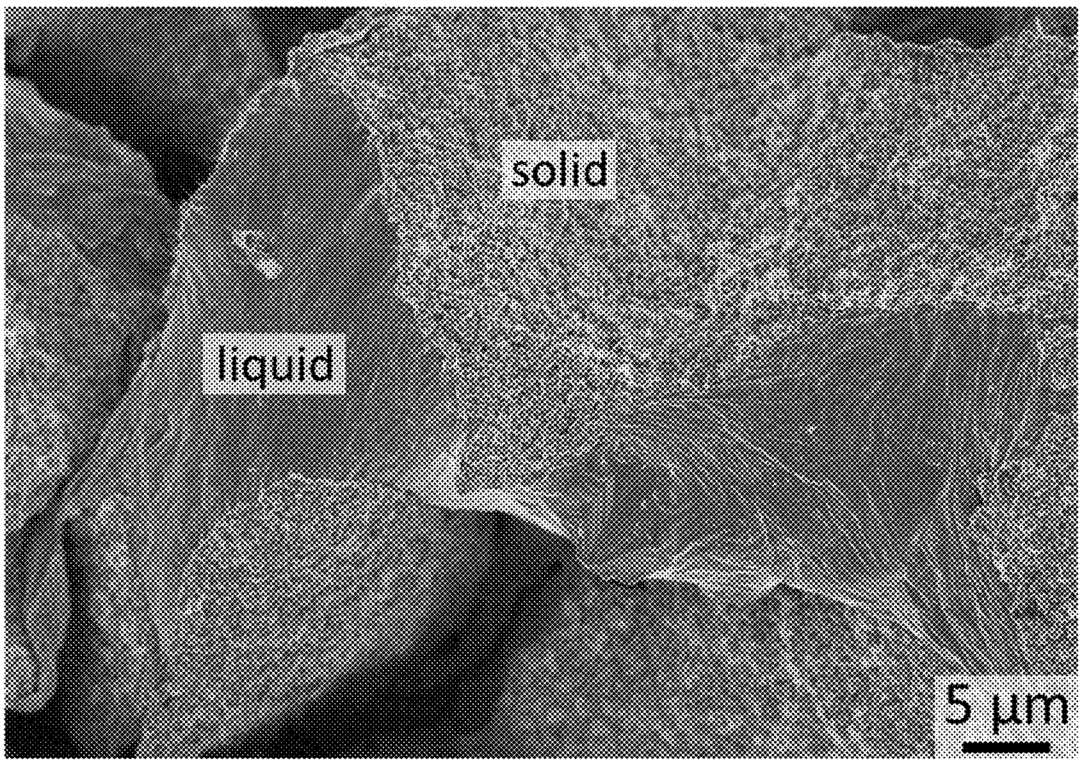

FIG. 10A and FIG. 10B show SEM images showing superior wetting of the liquid to the solid particles.

Figure 10C:
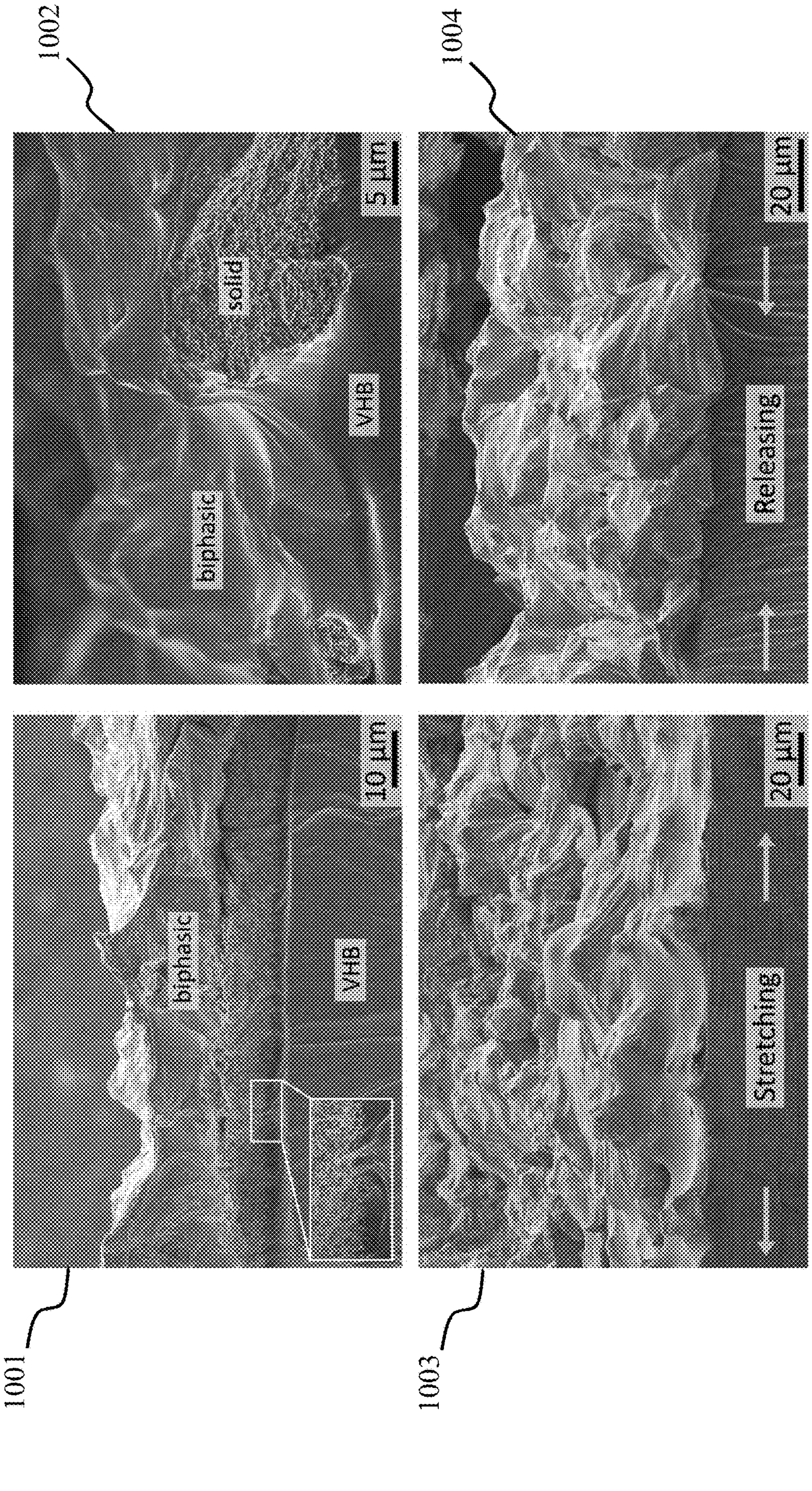

FIG. 10C shows SEM images of the cross-section of bGaIn films at different stretching states.

Figure 11A:
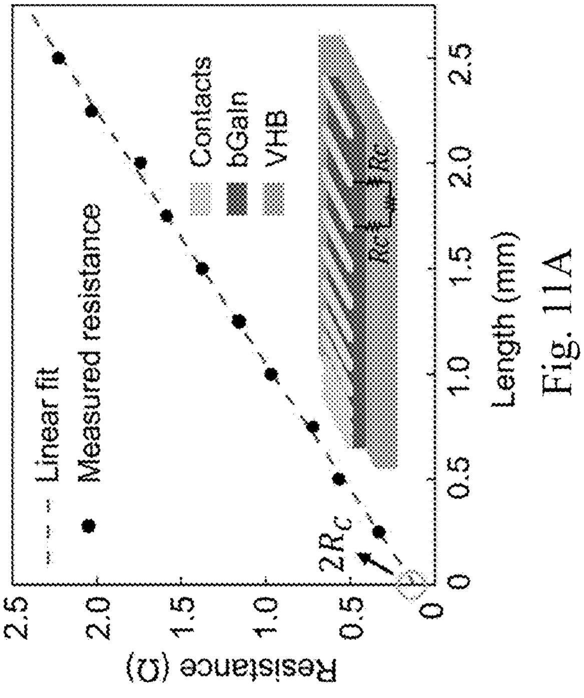

FIG. 11A shows a graph of the contact resistance measurement for a bGaIn-component interface using the transmission line method (Rc=0.06Ω, $R^2$=0.9986).

Figure 11B:
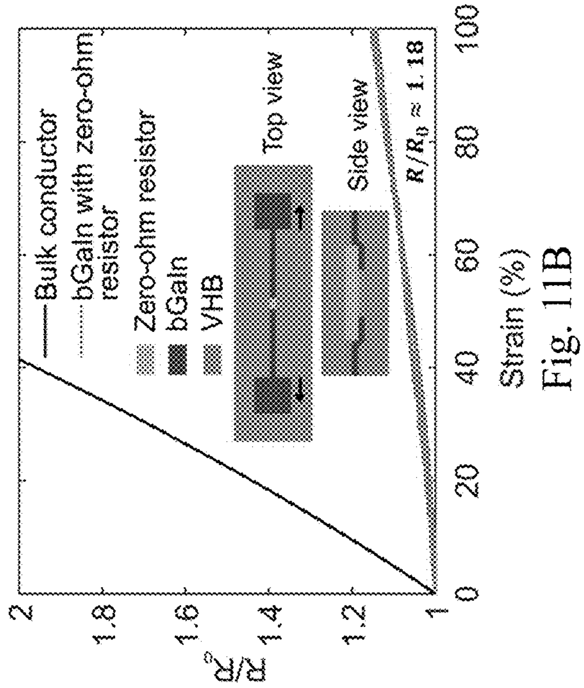
Figure 11C:
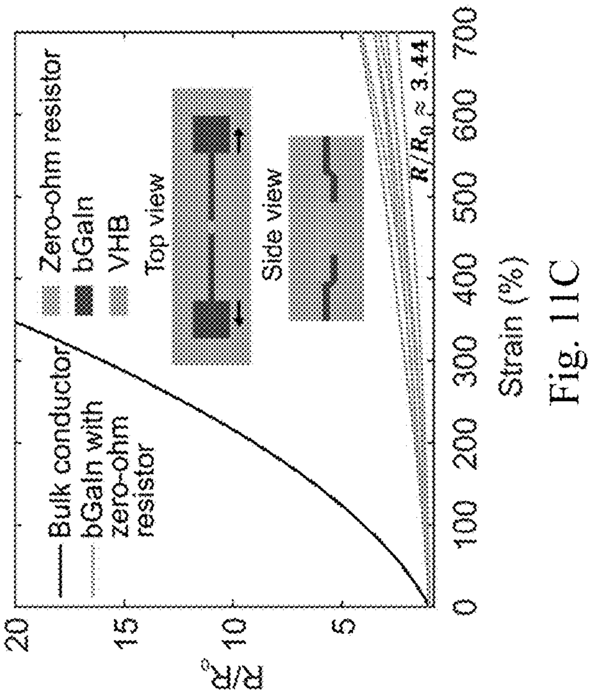

FIG. 11B and FIG. 11C show the relative change in resistance as a function of uniaxial tensile strain of the bGaIn traces with embedded zero-ohm resistor on PDMS in FIG. 11B: $R/R_0=1.18 \pm 0.04$, 5 samples) and VHB in FIG. 11C ($R/R_0=3.44 \pm 0.61$, 7 samples), and theoretical prediction based on bulk conductor assumptions (black).

Figure 11D:
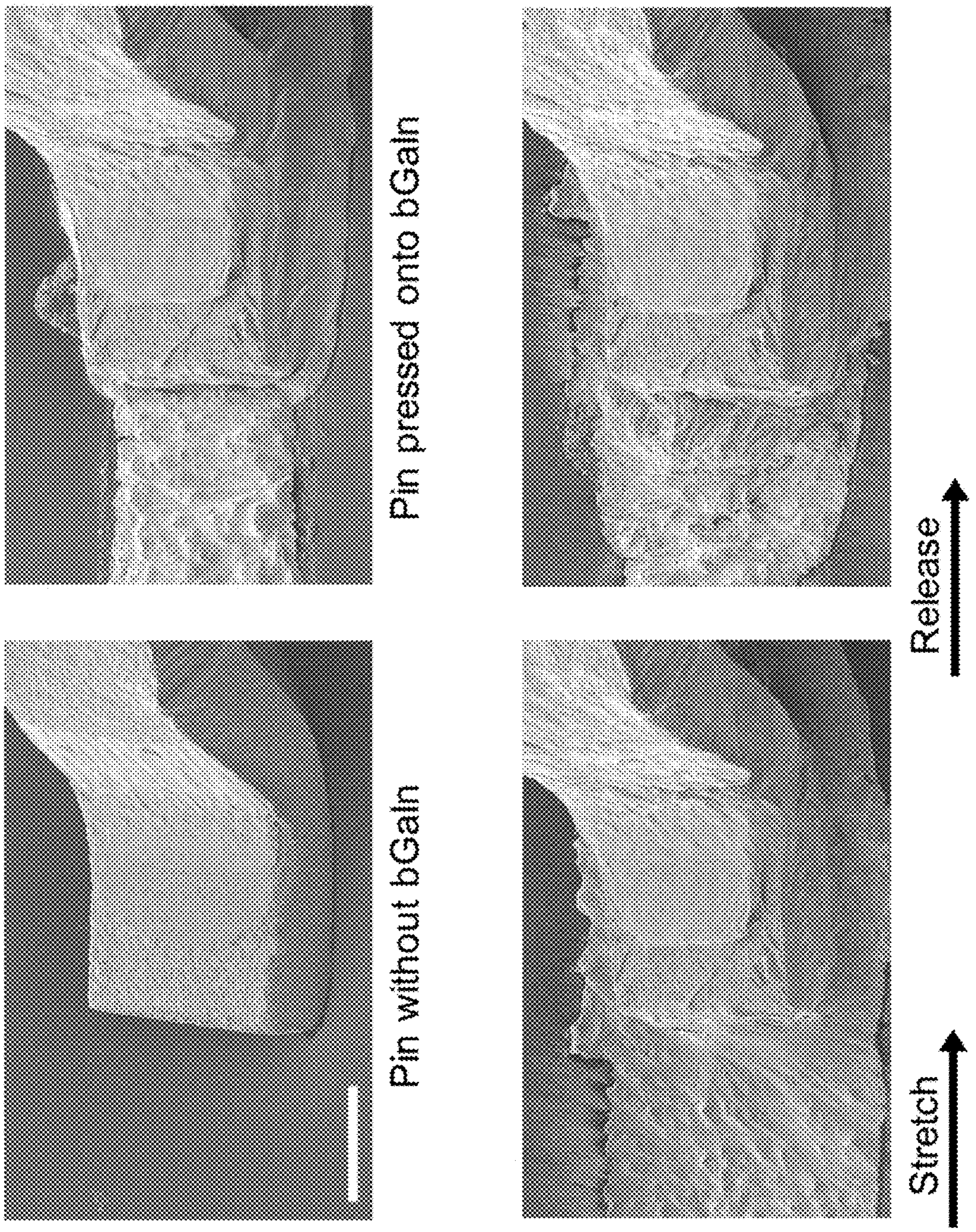

FIG. 11D shows SEM images of the microstructure of a bGaIn-component interface at different stretching states (unstretched, stretched to 30% and released). The top left image of the electronic pin is included as a comparison. Scale bars are 200 μm.

Figure 11E:
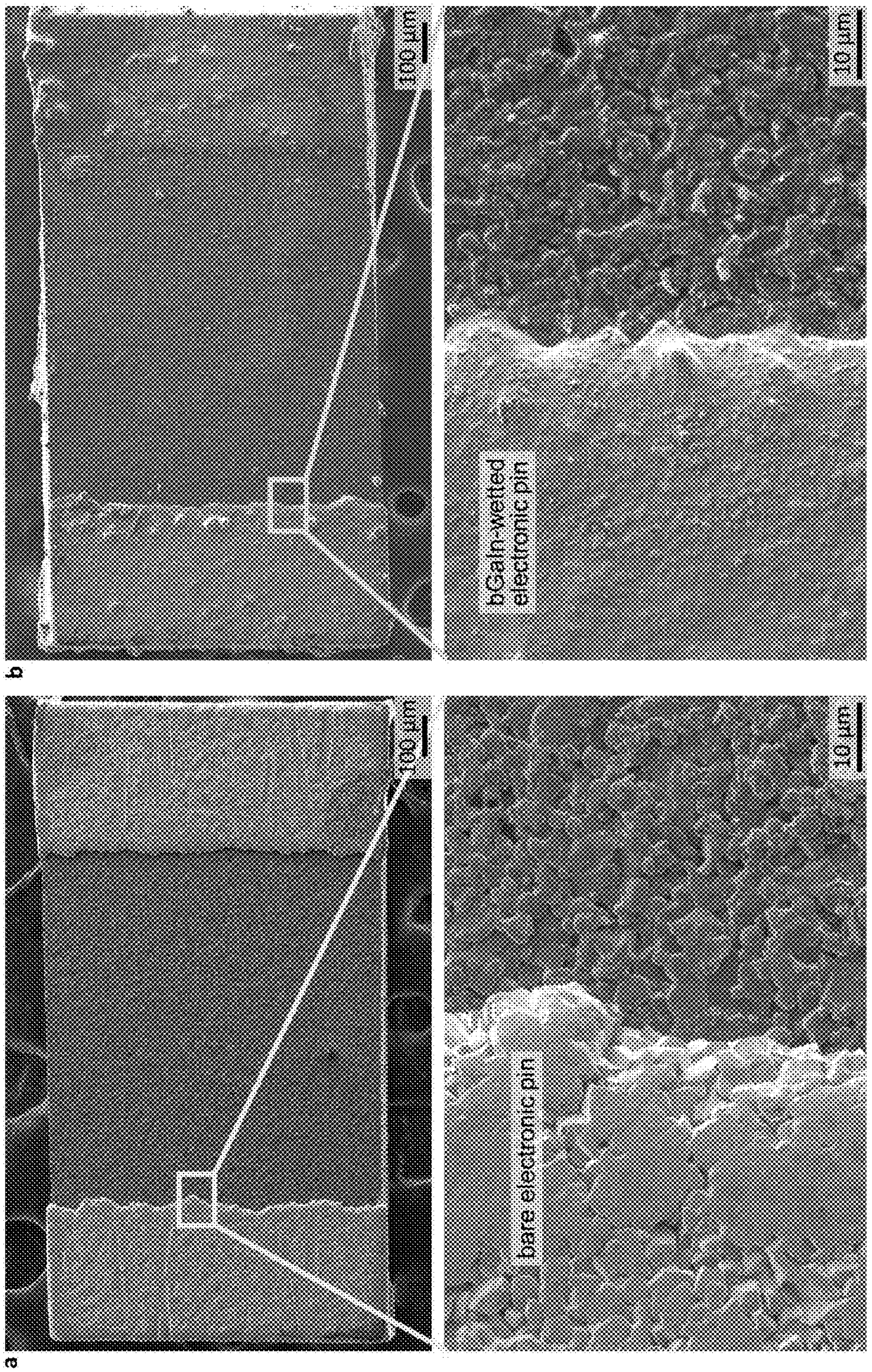

FIG. 11E shows SEM images of a bare electronic pin (a), and an electronic pin after pressing to a bGaIn film (b). The images exhibit the strong wettability of bGaIn to rigid pins of electronic components after application of pressure.

Figure 11G:
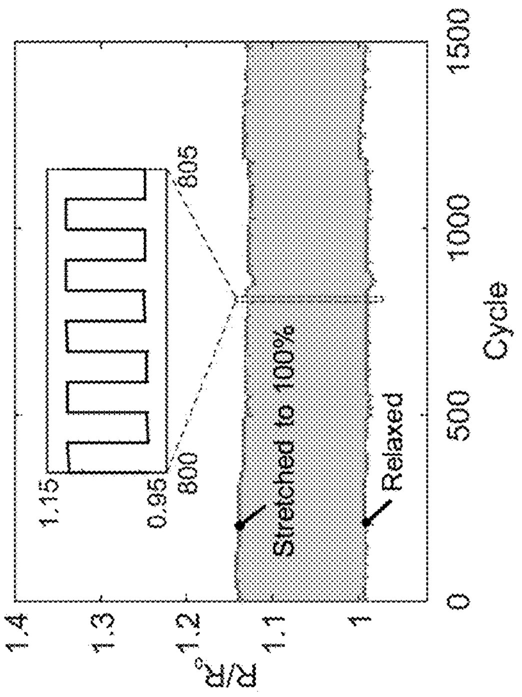
Figure 11F:
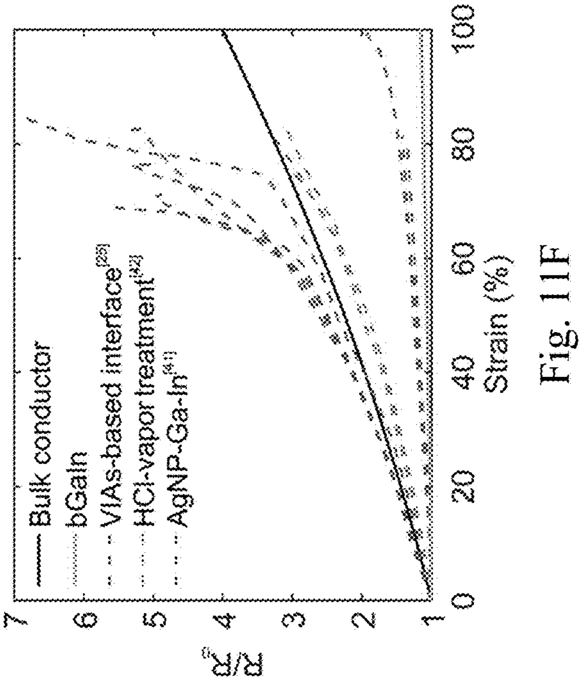

FIG. 11F shows a graph of the comparison of relative resistance change over strains with other liquid-metal based interfacing approaches: AgNP—Ga—In, HCl-vapor treatment, and VIAs-based interface.

Figure 11H:
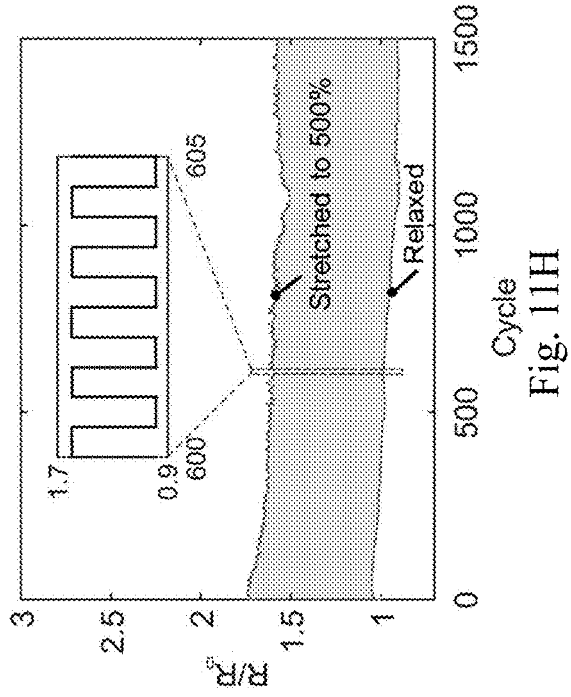

FIG. 11G and FIG. 11H show the relative resistance change of the bGaIn traces with embedded zero-ohm resistor subjected to uniaxial tensile cyclic loading to 100% on PDMS (FIG. 11G) and 500% on VHB (FIG. 11H), up to 1500 cycles.

Figure 11J:
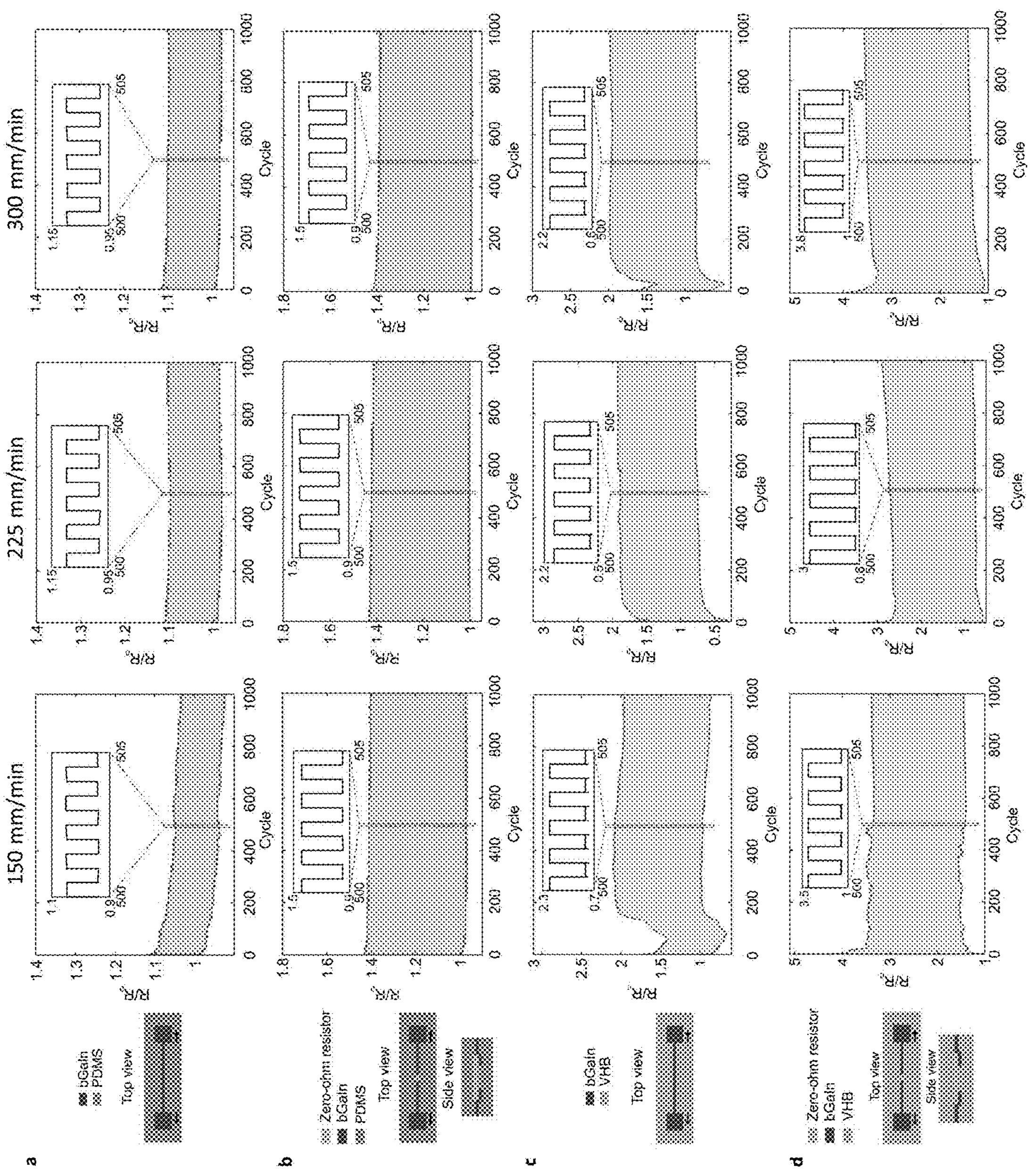

FIG. 11J shows graphs of the relative change in resistance as a function of uniaxial tensile strain of the bGaIn traces with and without embedded zero-ohm resistors on PDMS (100% strain, a-b) and VHB (500% stain, c-d) substrates at three faster stain rates (150 mm/min, 225 mm/min, and 300 mm/min) for 1000 loading cycles. The insets show detailed electrical resistances as a response to uniaxial strains. The results indicate that strain rate has negligible effect on the electromechanical performance of bGaIn circuits.

Figure 11K:
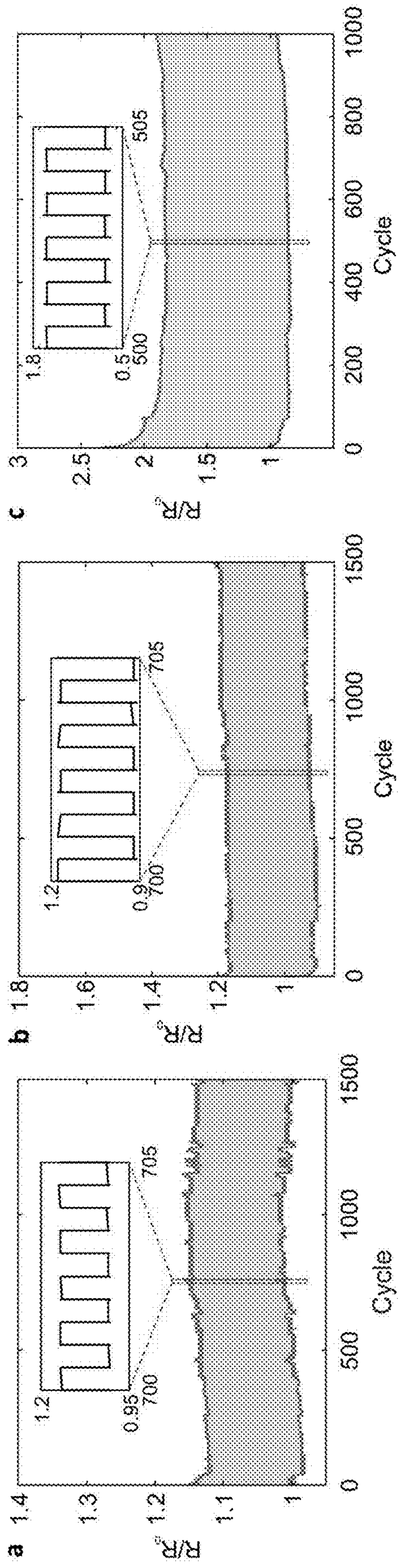

FIG. 11K shows graphs of the relative resistance change over strain of old bGaIn samples (with and without zero-ohm resistors) on PDMS (a-b) and VHB substrates (c) for over 1000 loading cycles. The insets show detailed electrical resistances as a response to uniaxial strains. All the samples were fabricated more than 6 months prior to testing. The stable electromechanical response indicates the long-term reliability of bGaIn circuits.

Figure 12A:
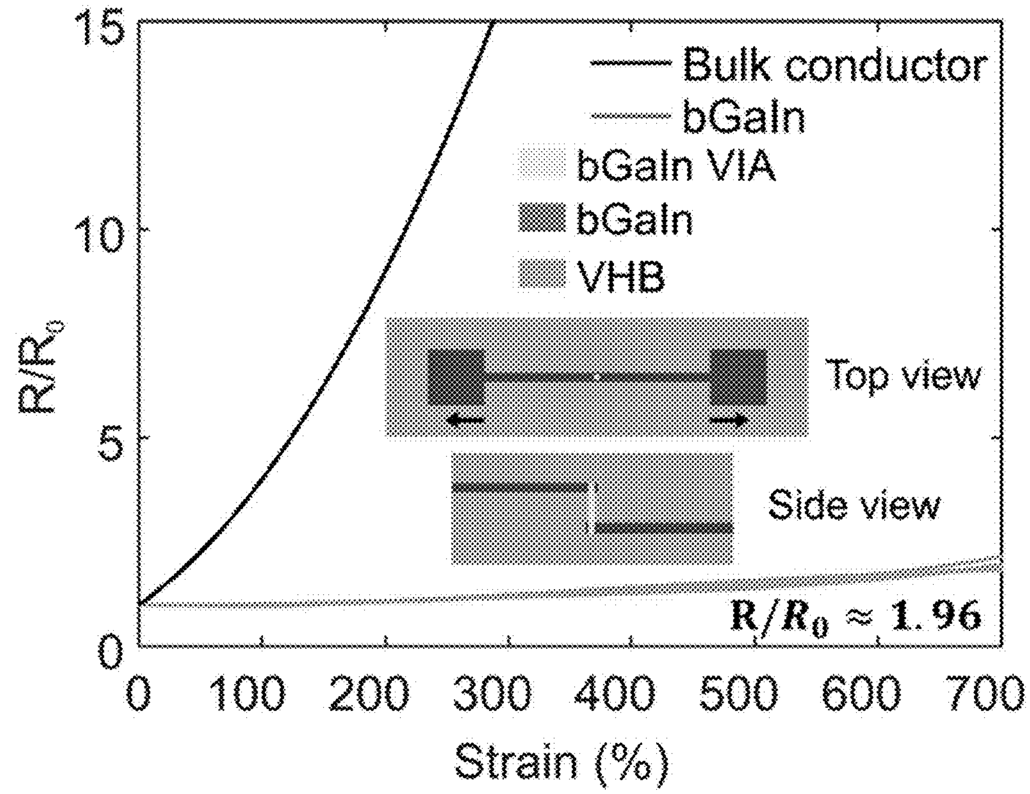

FIG. 12A shows the relative change in resistance as a function of uniaxial tensile strain of two bGaIn traces connected by a single VIA on VHB ($R/R_0 \approx 1.96 \pm 0.136$, 3 samples and theoretical prediction based on bulk conductor assumptions.

Figure 12B:
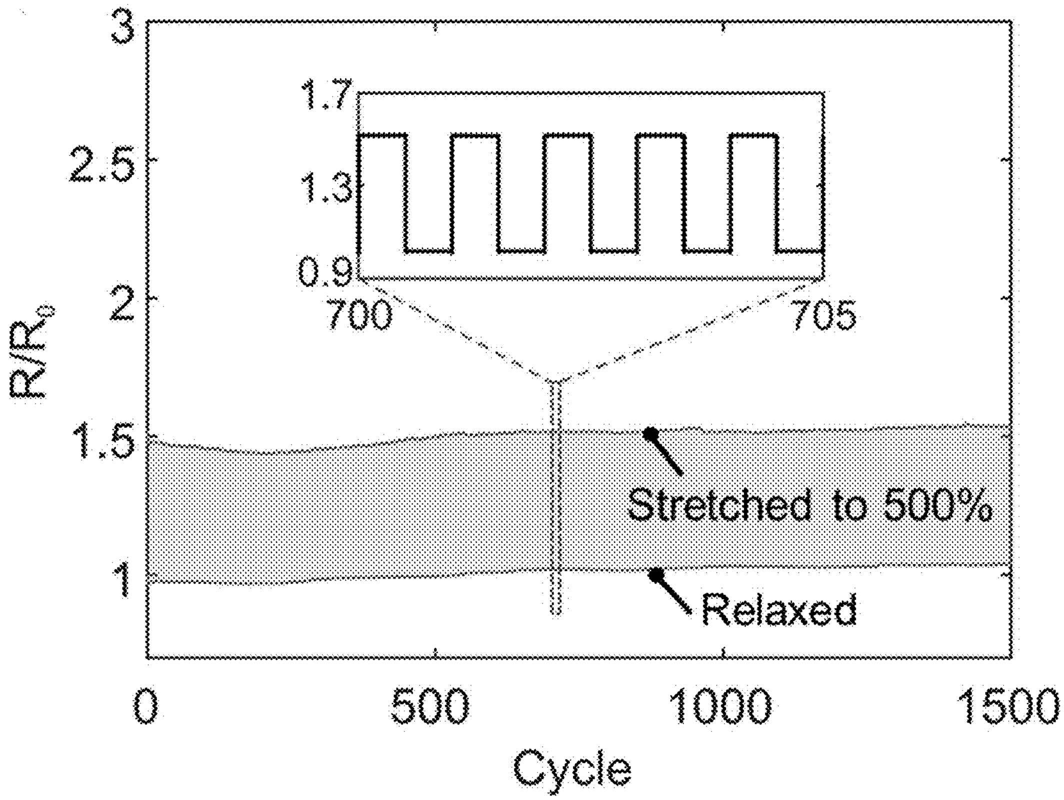

FIG. 12B shows the relative resistance change of two bGaIn traces connected by a single VIA subjected to uniaxial tensile cyclic loading to 500% on VHB up to 1500 cycles.

Figure 12C:
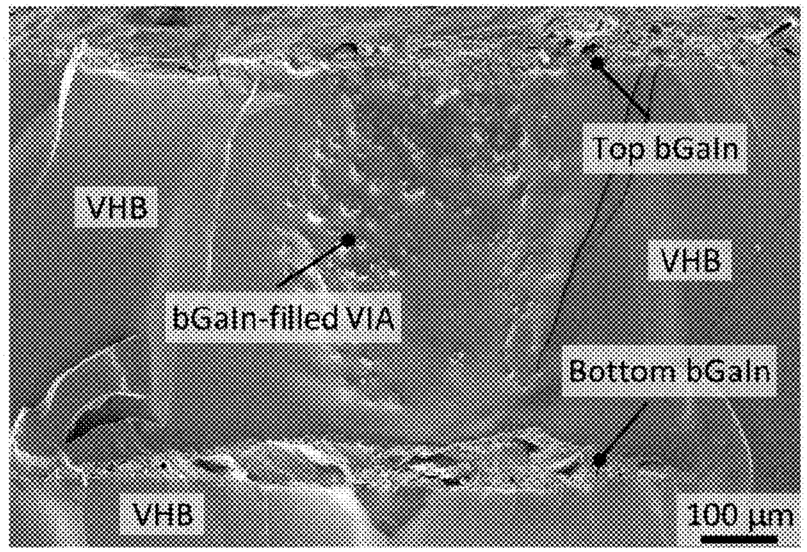

FIG. 12C shows an example SEM image of the cross-section a bGaIn-filled VIA. The image shows that the bGaIn strongly wets and adheres to the cavity, bridging the traces at the top and bottom.

Figure 12D:
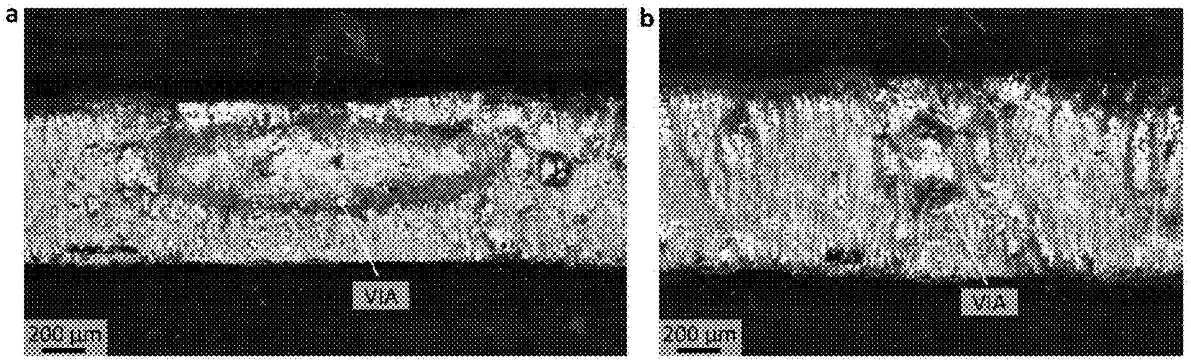

FIG. 12D shows example optical images of a bGaIn-filled VIA. (a) A photo showing the bGaIn circuit subjected to uniaxial tensile loading to 100% (without encapsulation). The bGaIn stayed connected with both the top and the bottom traces even when stretched. (b) A photo showing the same circuit when it was released after stretching.

Figure 13A:
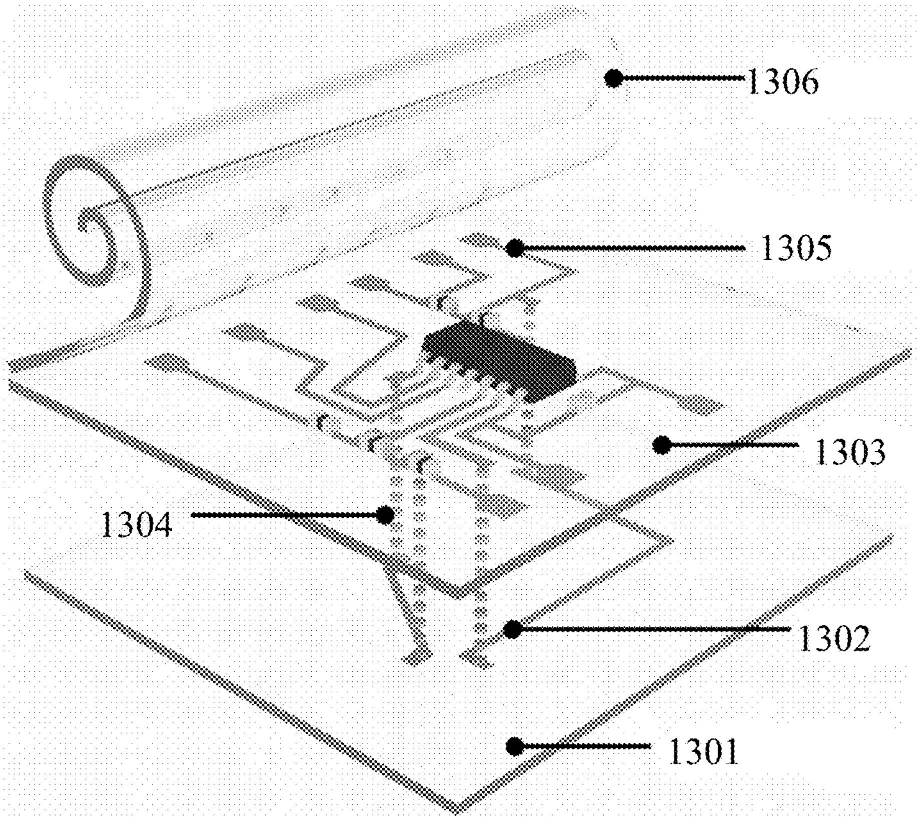
Figure 13B:
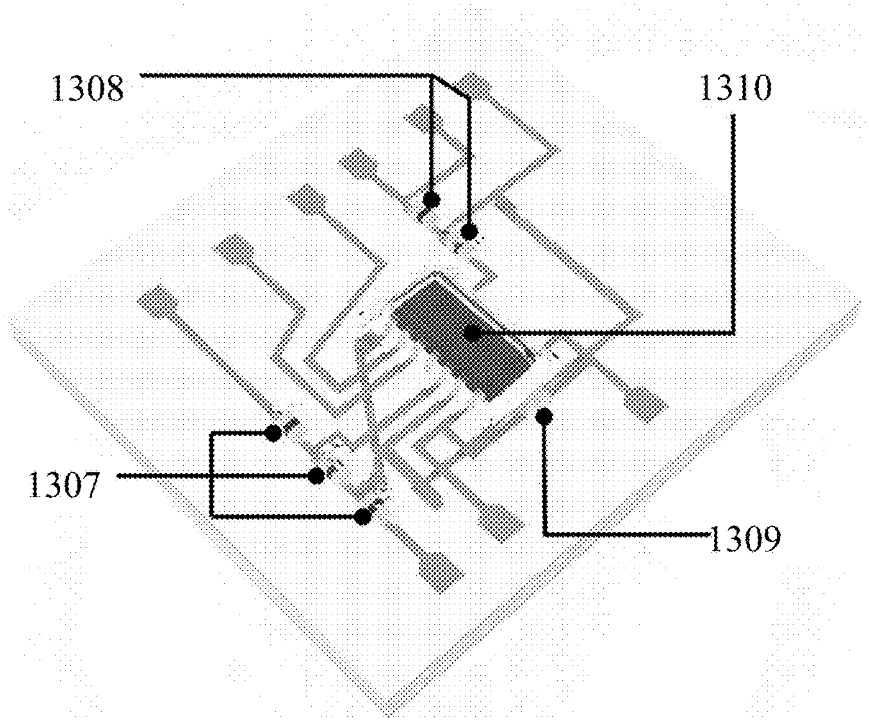

FIG. 13A and FIG. 13B show different views of a multi-layer SCBA.

Figure 14A:
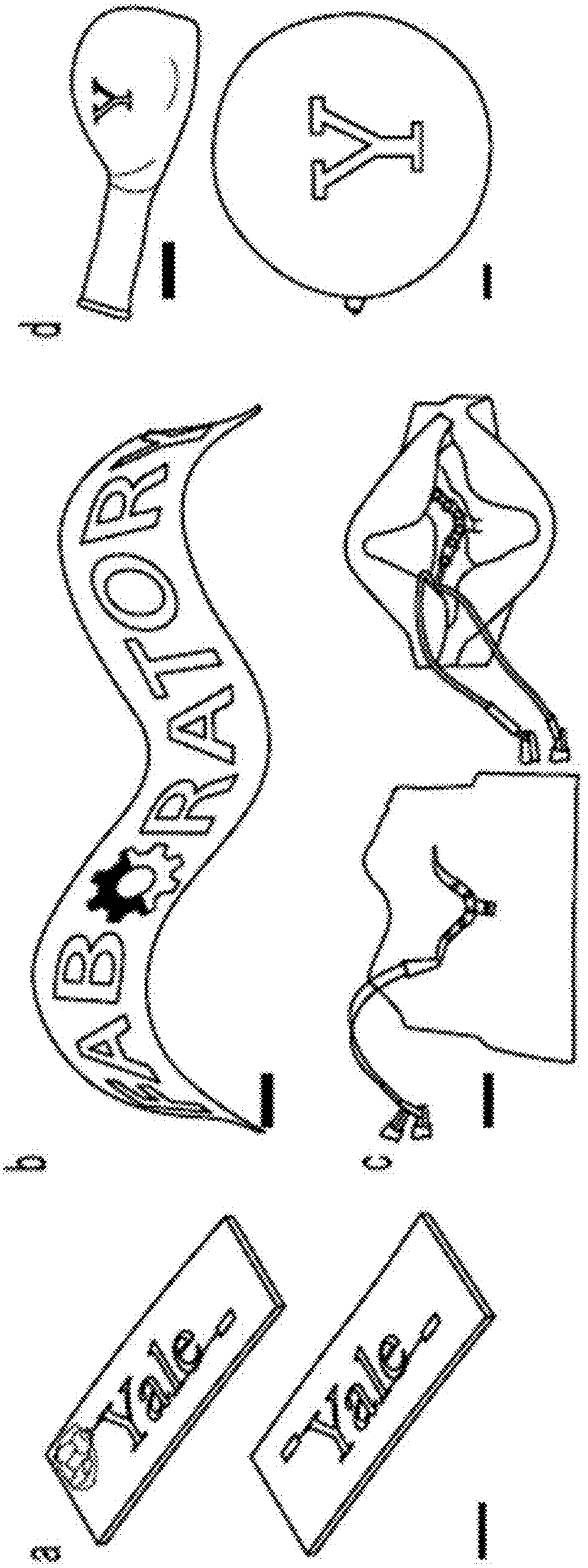

FIG. 14A shows examples of printable patterns and stretchable vias. (a,b) Stencil-printed bGaIn circuits on VHB tape (a; scale bar, 5 mm) and paper (b; scale bar, 2 cm). (c,d) Hand-written bGaIn circuits on high-porosity foam (c) and a latex balloon (d); scale bar, 2 cm.

Figure 14B:
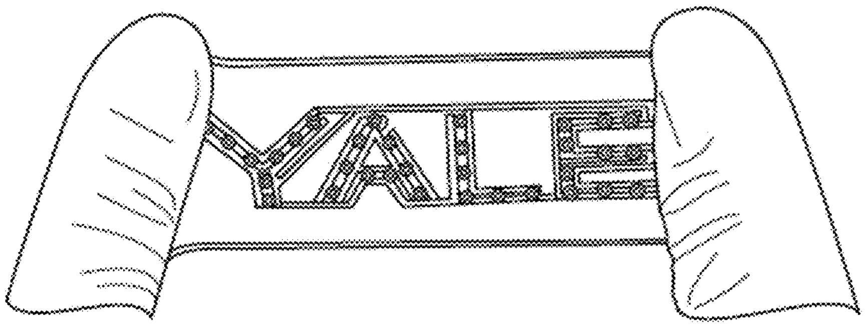
Figure 14C:
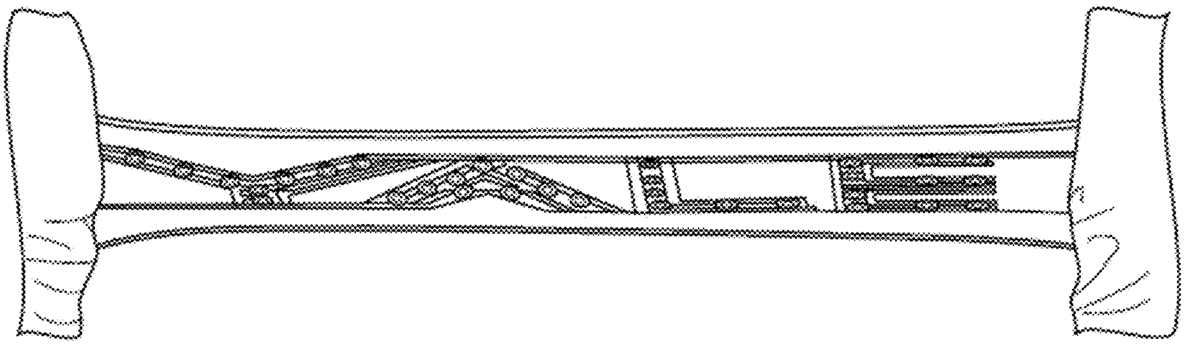

FIG. 14B and FIG. 14C show an SCBA with an LED array before and after stretching to 250% strain.

Figure 14D:
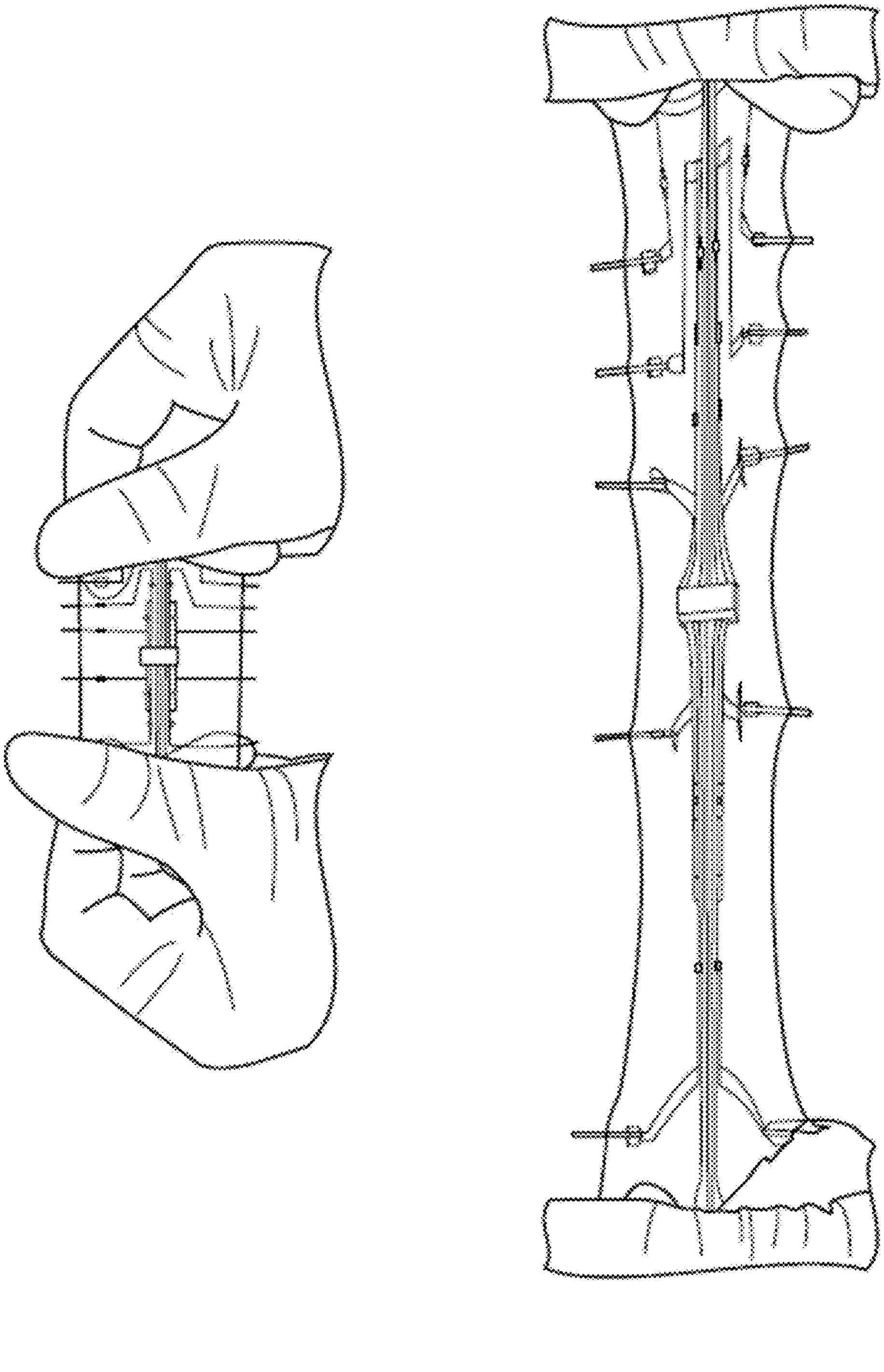

FIG. 14D shows an example amplifier circuit before and after stretching to 400% strain.

Figure 15:
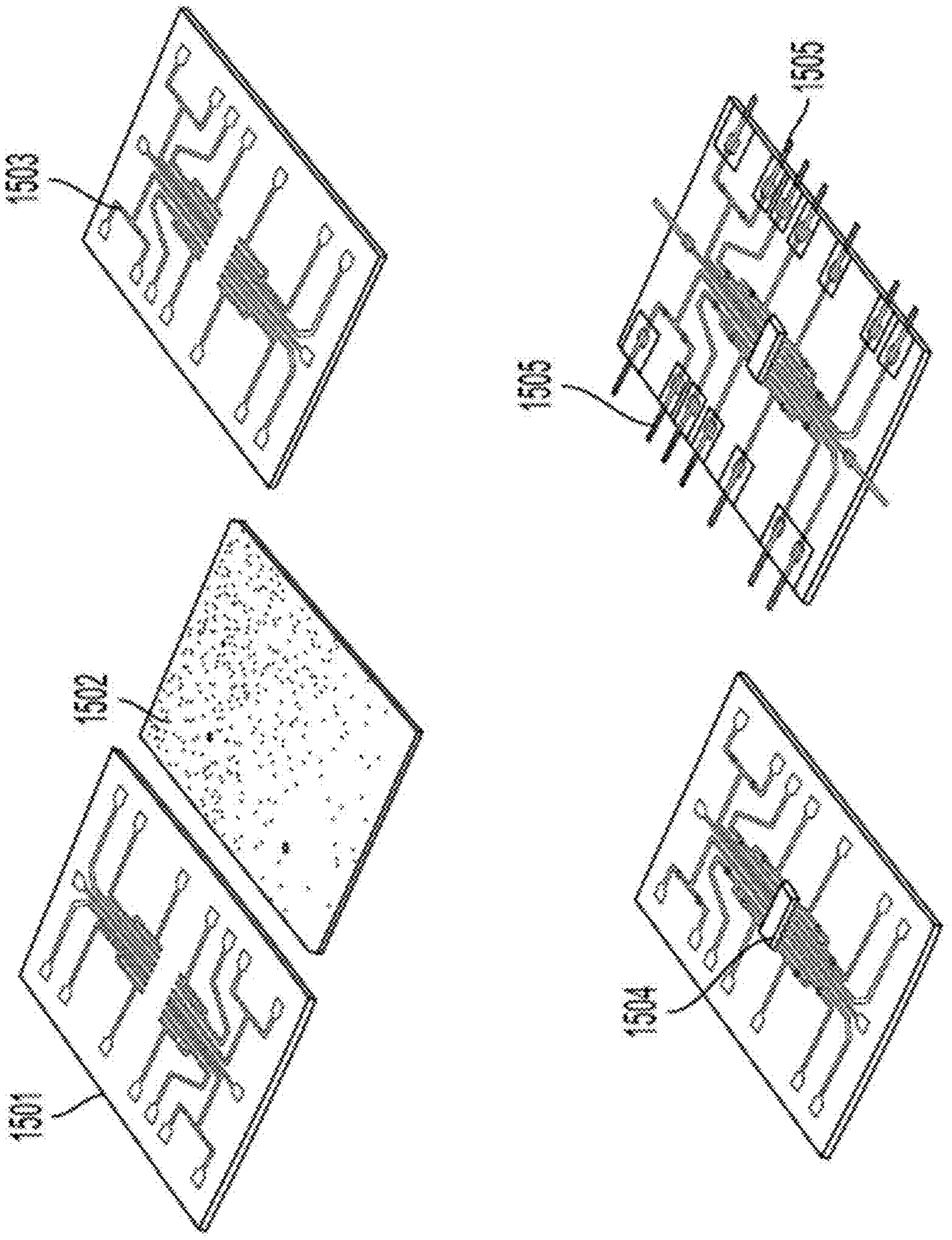

FIG. 15 shows a fabrication process for a single-layer SCBA.

Figure 16A:
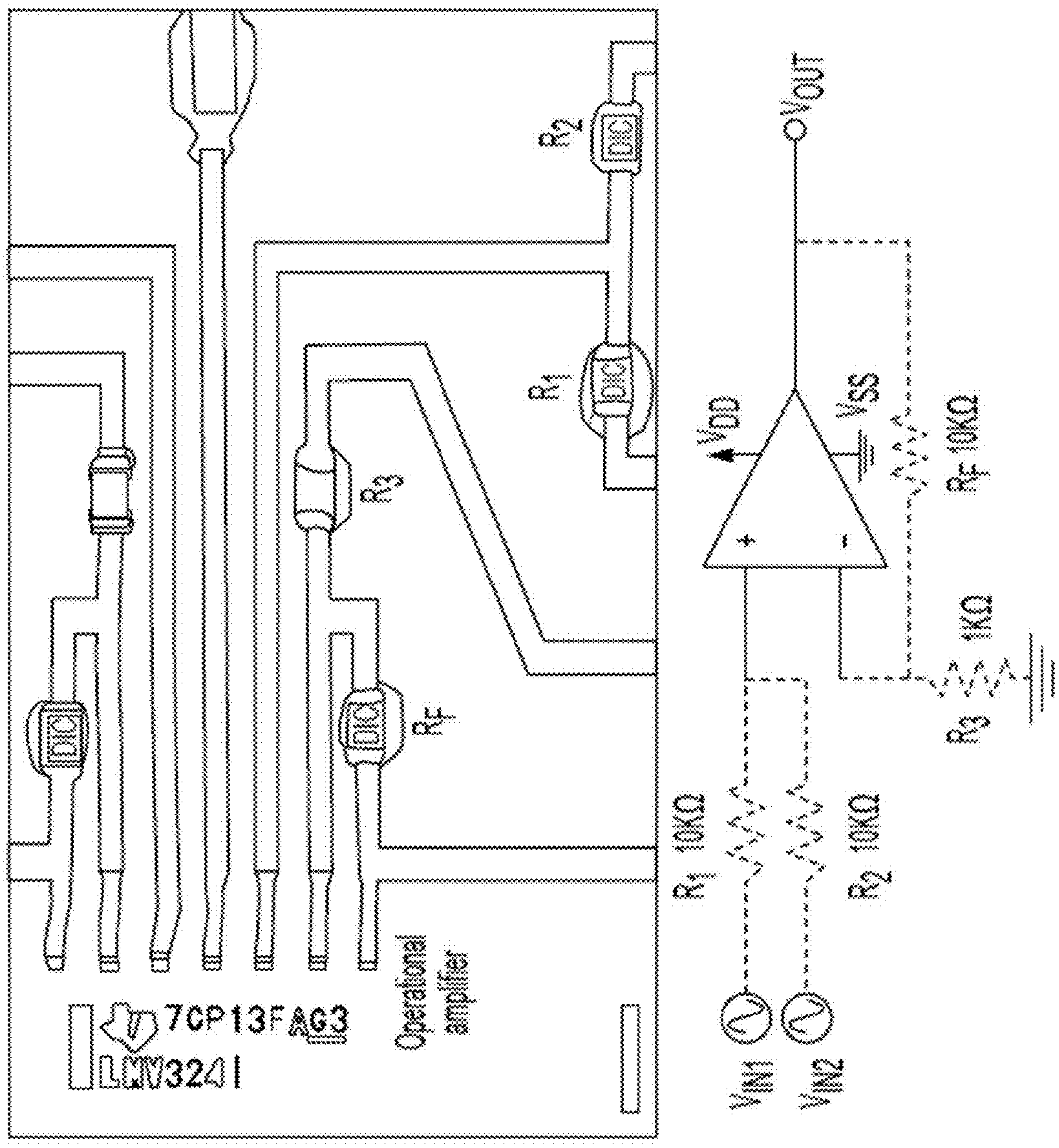

FIG. 16A shows a photograph and a schematic diagram of a summing amplifier circuit.

Figure 16B:
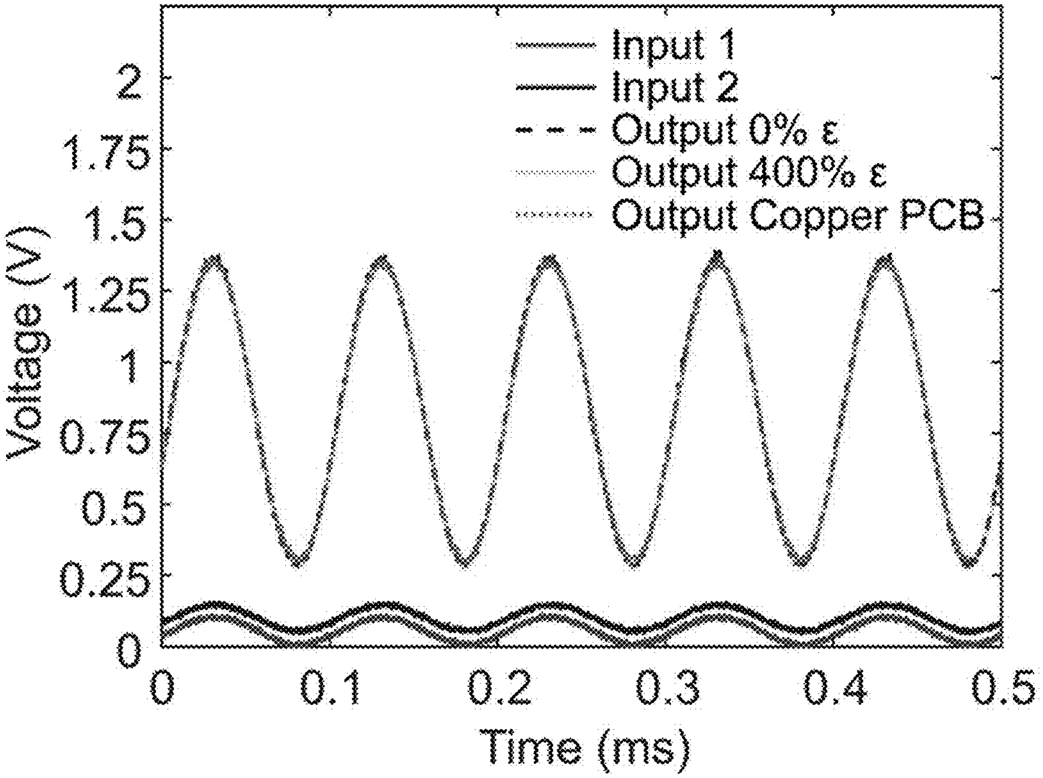

FIG. 16B shows input sinusoidal voltage signals (100 mVpp, 100 mVpp offset), along with output signals after amplification when the amplifier circuit is at 0% and 400% strain, as well as the same circuit built with copper traces as a control group.

Figure 16C:
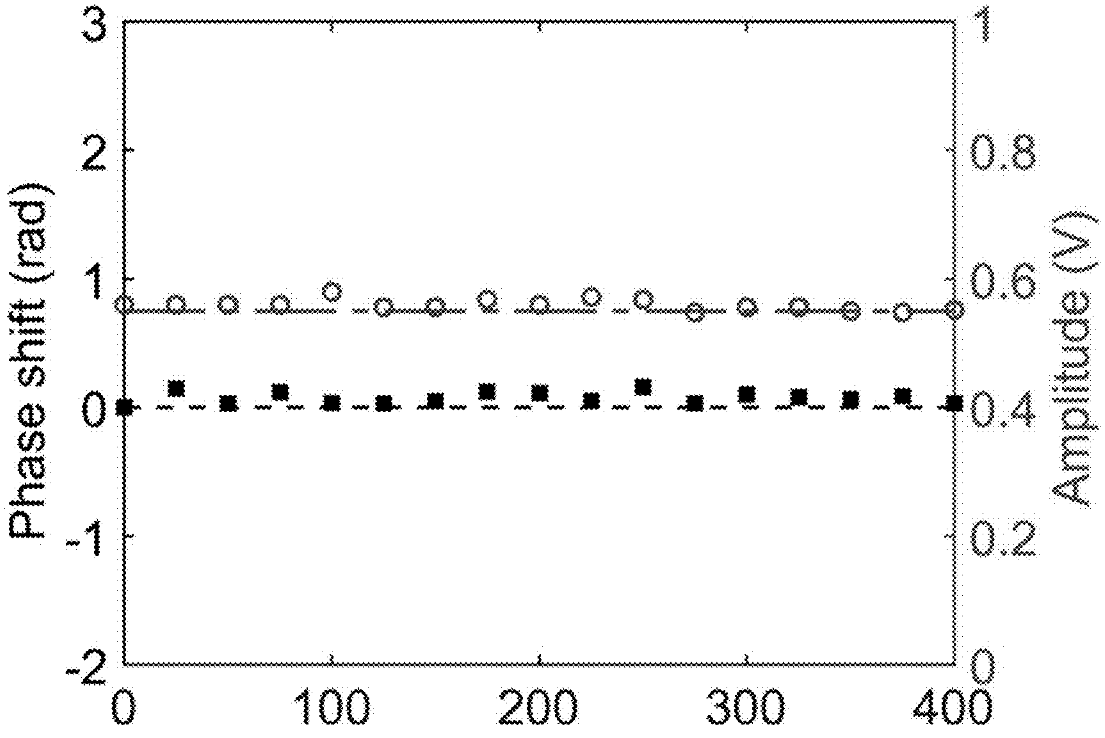

FIG. 16C shows phase shift and amplitude of the amplifier circuit output signals as a function of applied strain. The dash-dot line (red) and dashed line (black) represent the theoretical amplitude value (0.55 V) and phase shift (0 rad) respectively.

Figure 16D:
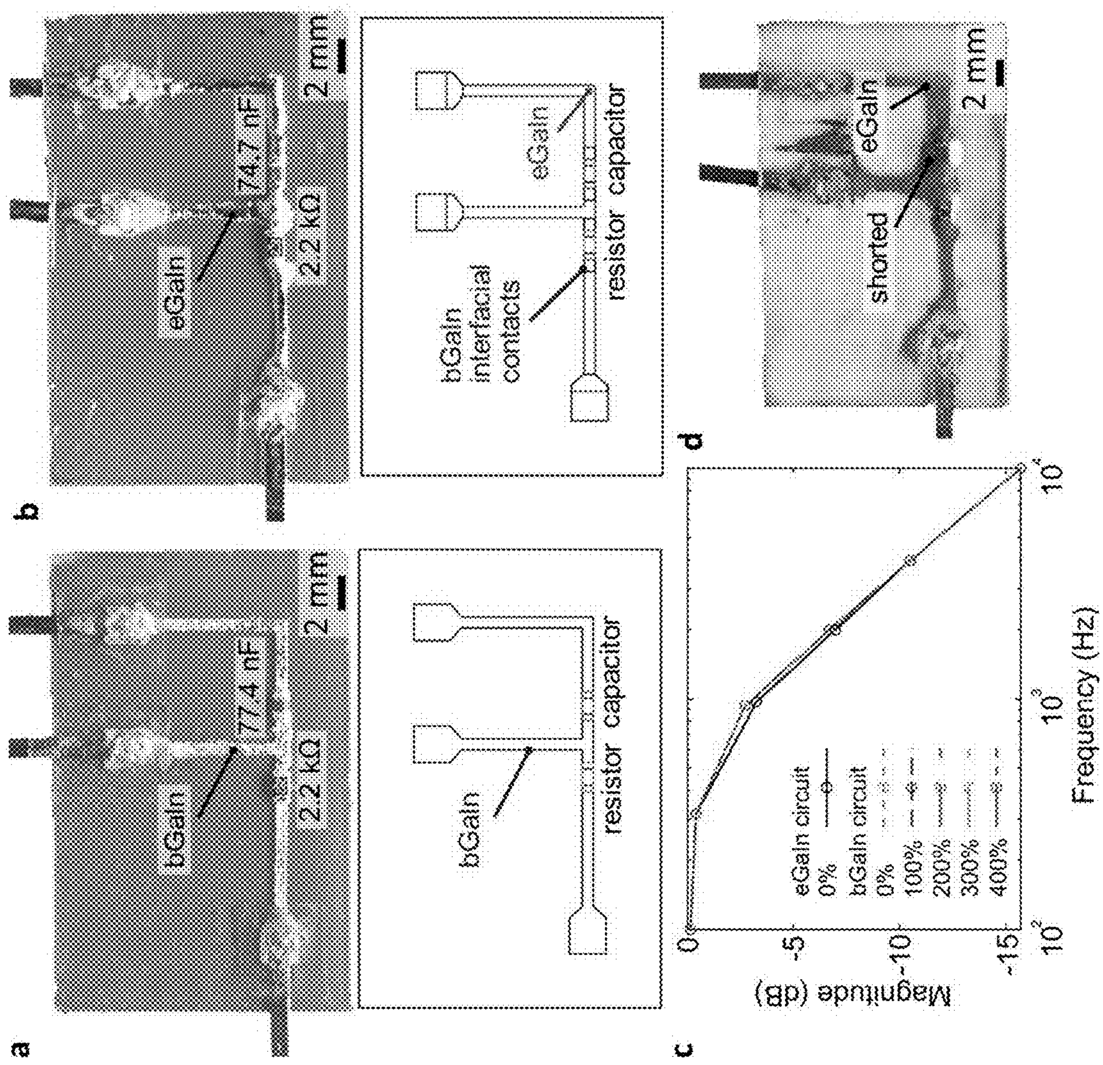

FIG. 16D shows first order resistor-capacitor (RC) low pass filter circuits using bGaIn (a) and bulk eGaIn (b) as electrical interconnects. bGaIn was patterned as interfacial contacts for the eGaIn circuit to ensure stable connections to rigid electronic components (b). The circuit output voltage $$V_{out} = V_{in} * \frac{X_C}{\sqrt{X_C^2 + R^2}},$$

where the capacitive reactance $$X_C = \frac{1}{2\pi f C},$$

and cutoff frequency $$\left(f_c = \frac{1}{2\pi RC}\right)$$

are both directly correlated with the resistance value. (c) The magnitude in dB $$\left(20\log\left(\frac{V_{out}}{V_{in}}\right)\right)$$

as a function as a function of frequency of the bGaIn circuit at different strains (0%-400%) and the eGaIn circuit at 0% strain. Stretching the bGaIn circuit to different strains had a negligible impact on the output signal and cutoff frequency (~936 Hz). (d) Shorted eGaIn circuit after stretching to less than 100% strain due to the low mechanical stability of the eGaIn trace.

Figure 16E:
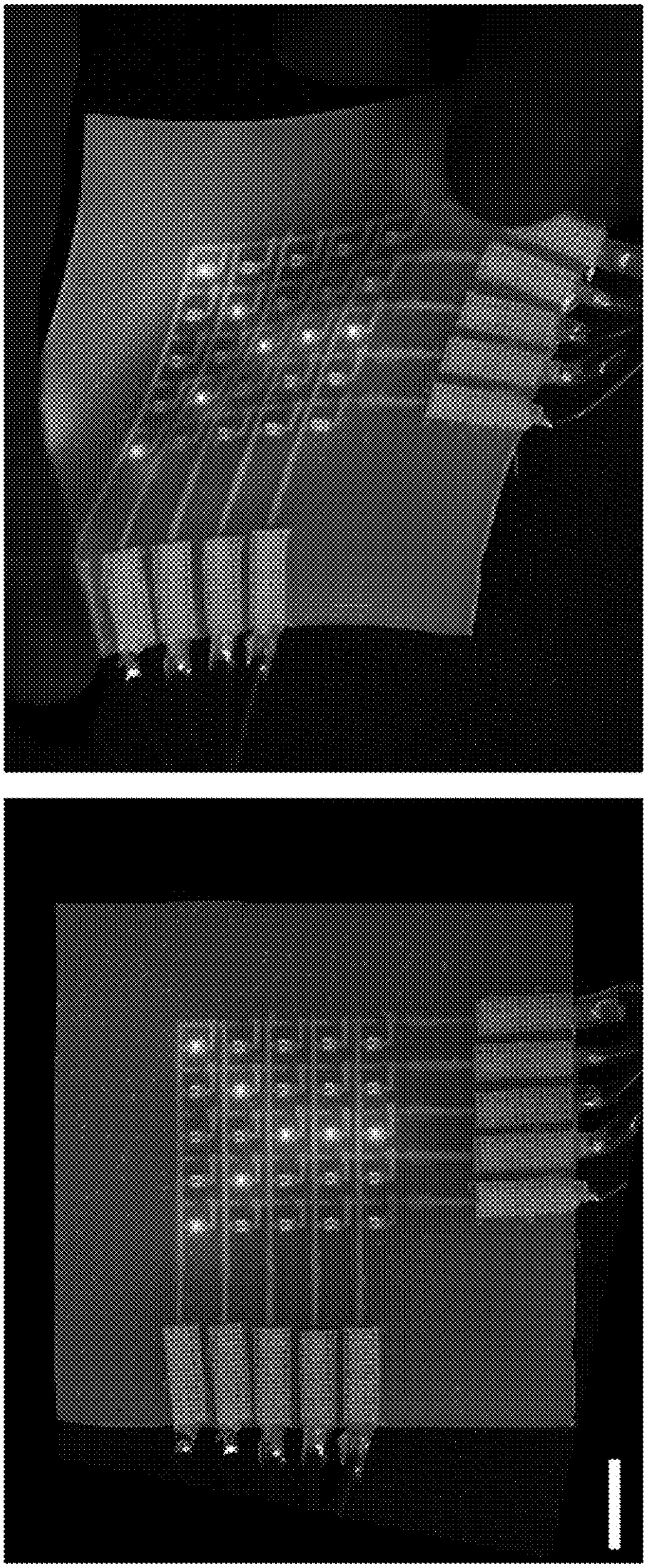

FIG. 16E shows a SCBA with a 5×5 LED display.

Figure 16F:
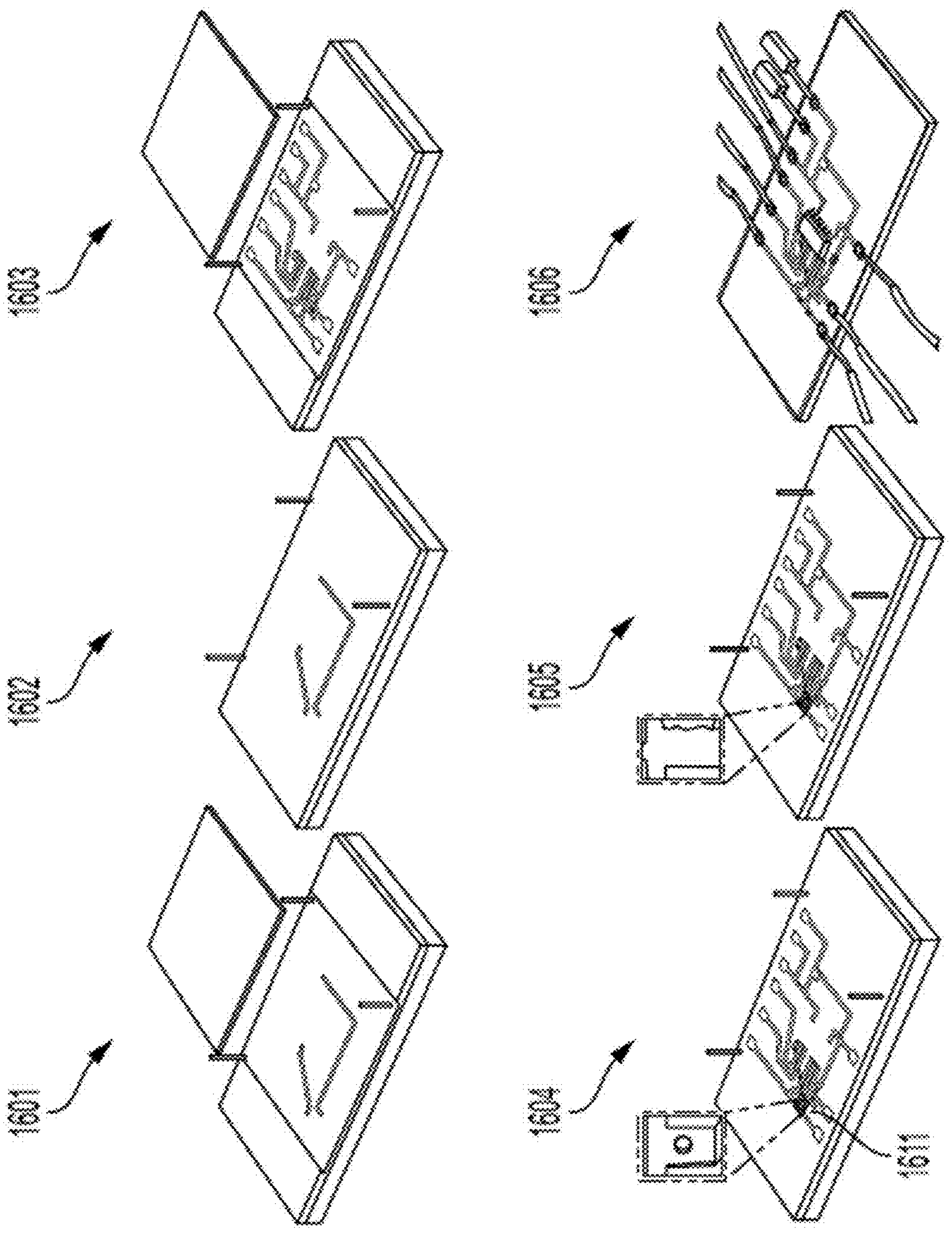

FIG. 16F shows a fabrication process for a multi-layer SCBA.

Figure 16G:
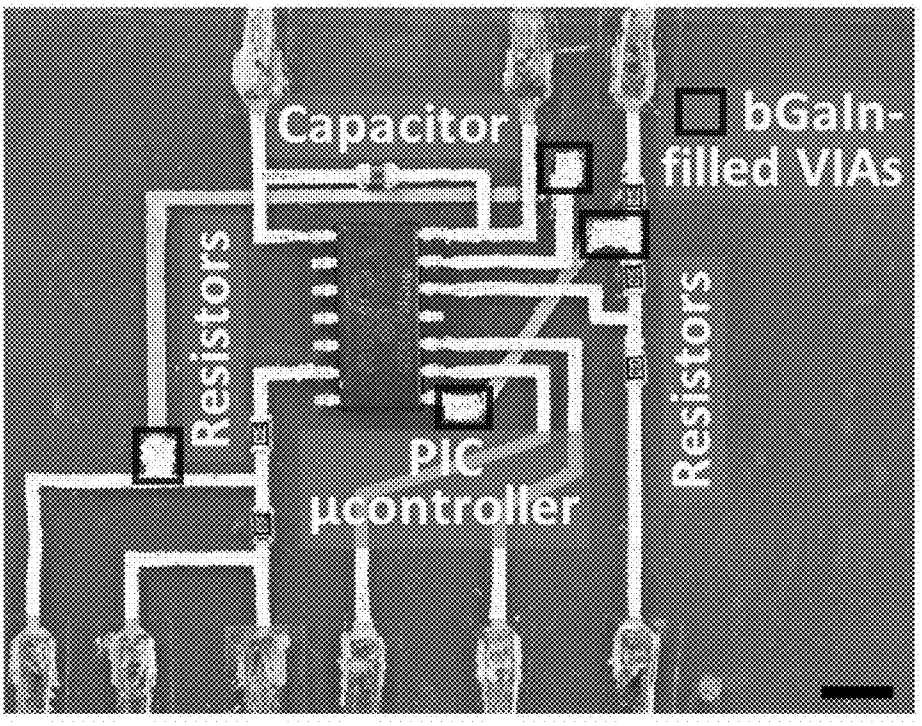

FIG. 16G shows a top view of the signal conditioning circuit board, the scale bar is 5 mm.

Figure 16H:
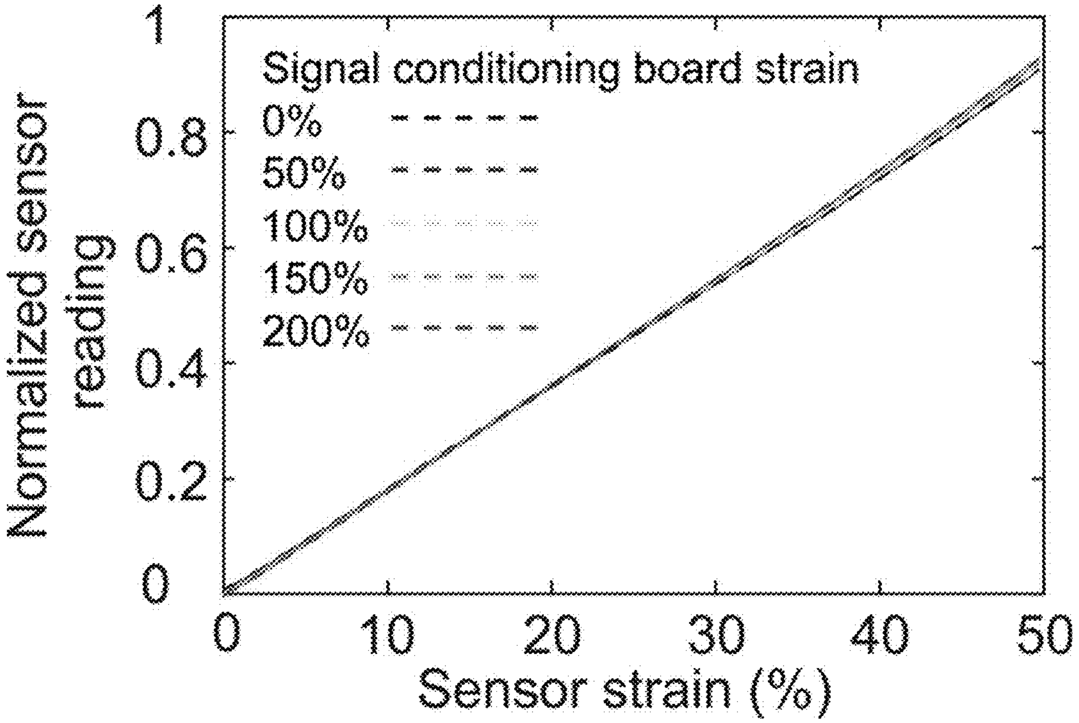

FIG. 16H shows a normalized sensor reading as a function of the capacitive sensor strain up 50% for 10 cycles at different strains of the signal conditioning circuit board (0%, 50%, 100%, 150%, 200%); the data are presented as means with one standard deviation bounds.

Figure 16J:
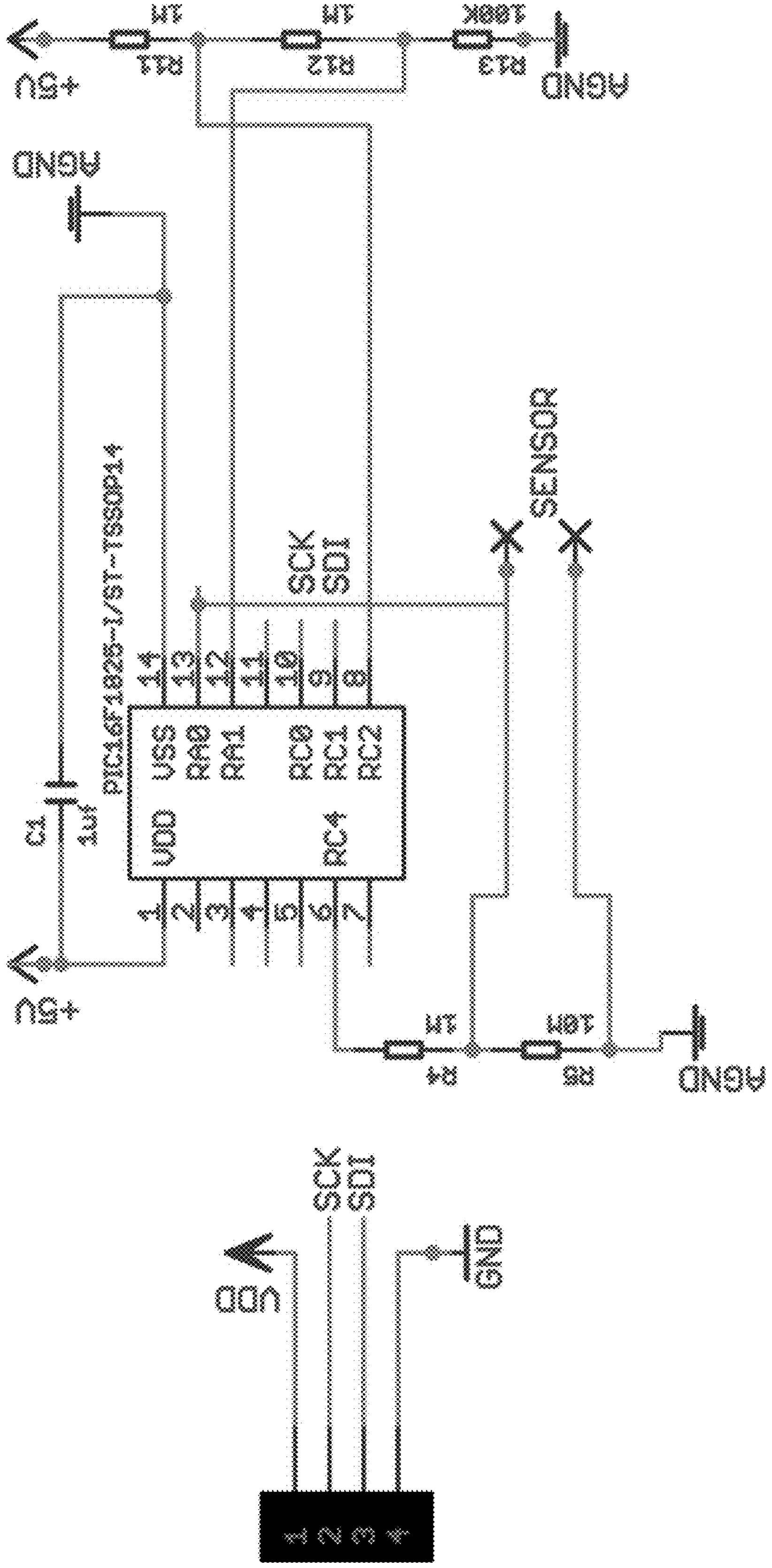

FIG. 16J shows a schematic of the signal conditioning circuit board.

Figure 16K:
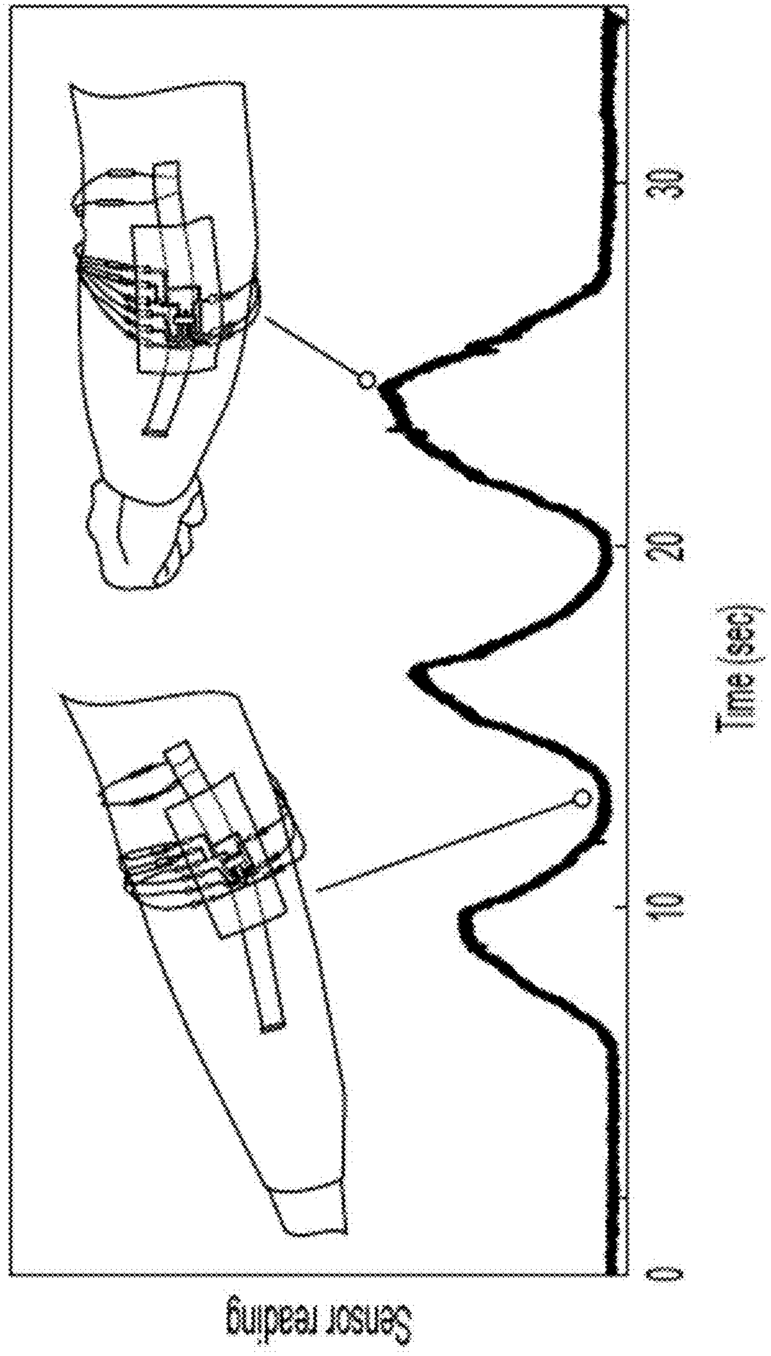

FIG. 16K shows the acquired sensor data during elbow flexion with the sensor and the circuit board stretched simultaneously; the insets are the sensor-circuit assembly attached to the surface of a user's shirt sleeve, in both bent and unbent positions.

Figure 17A:
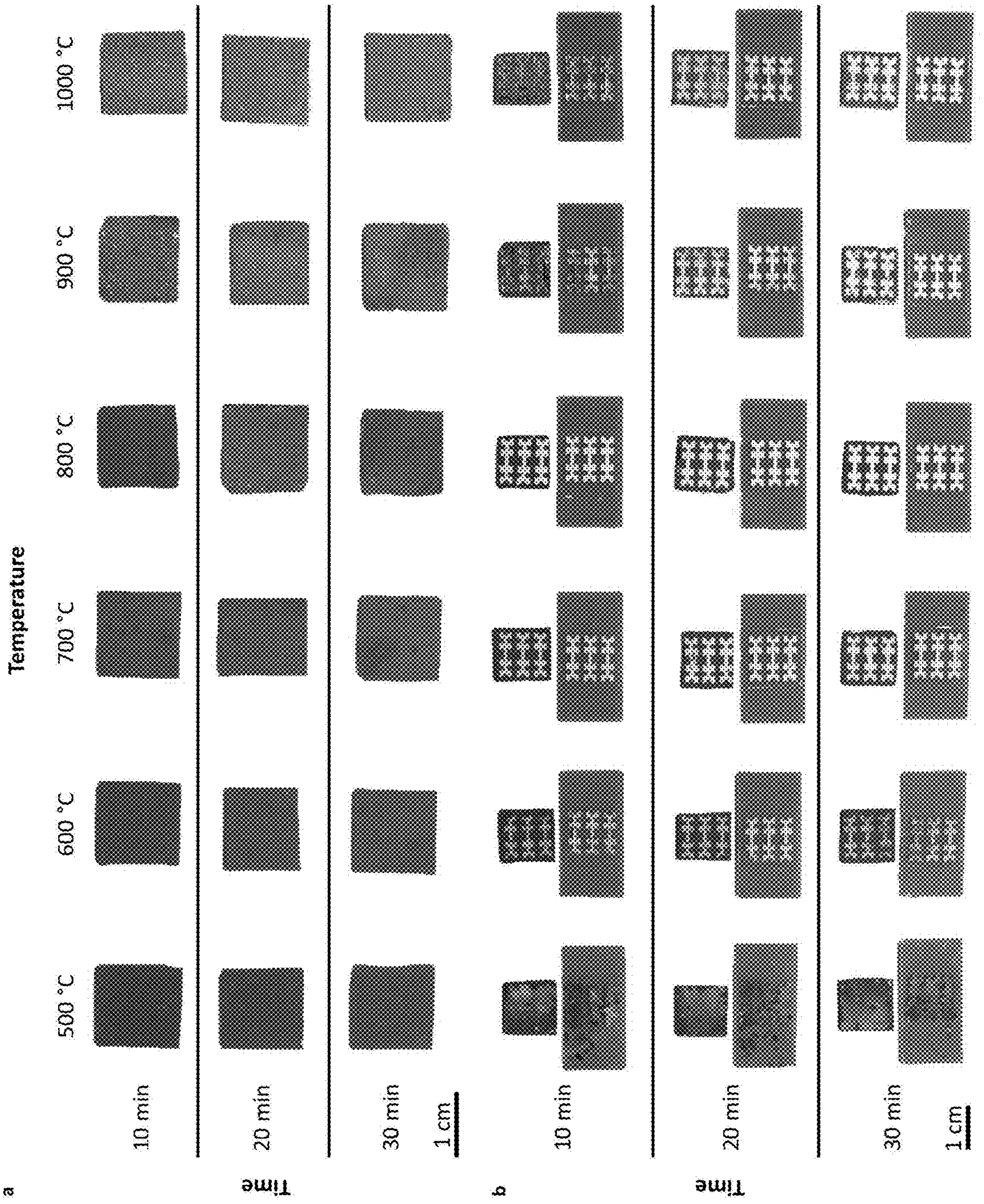

FIG. 17A shows example optical images showing liquid metal nanoparticle films processed under different thermal conditions (500-1000° C.; 10-30 min) before (a) and after (b) transfer.

Figure 17B:
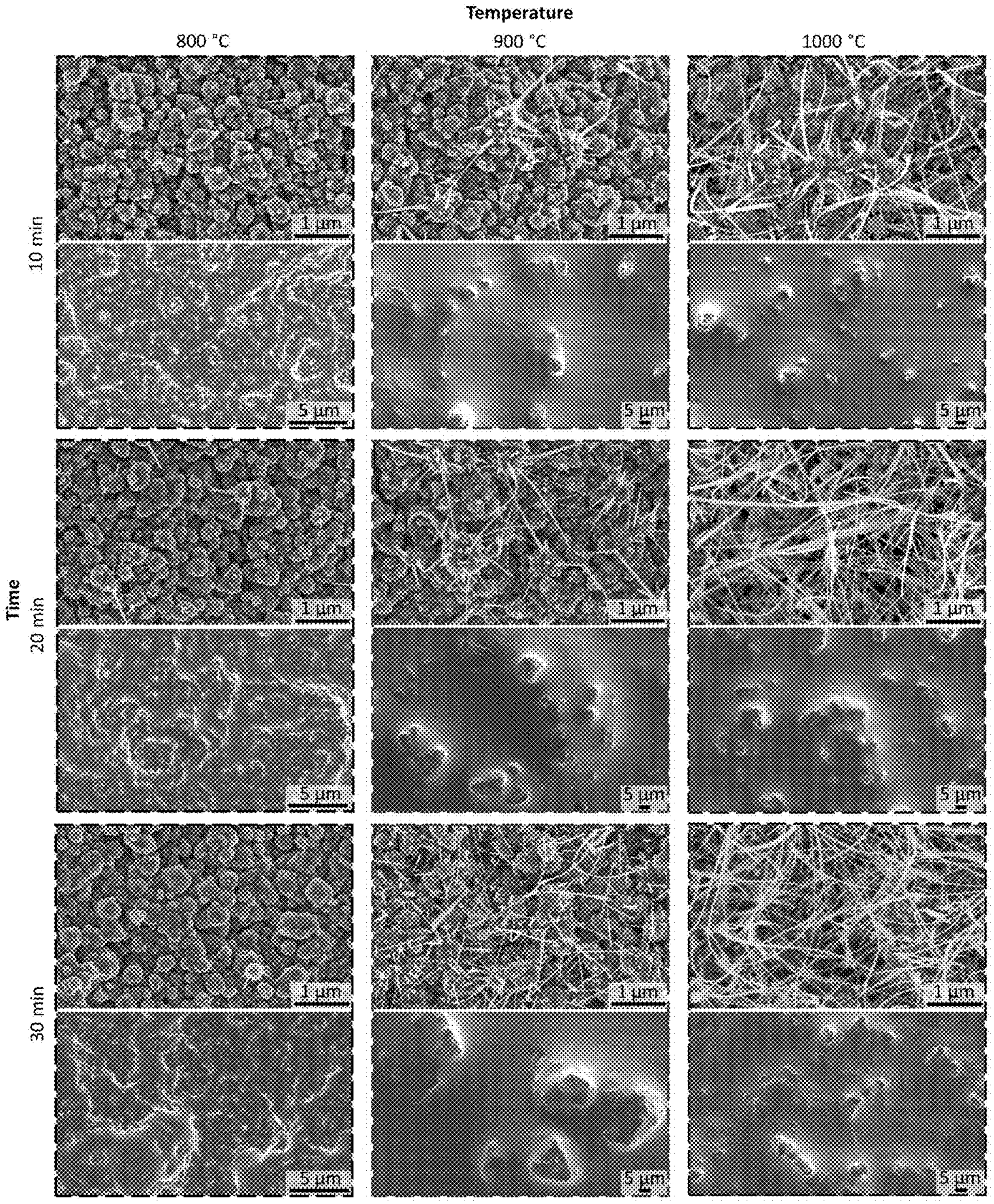

FIG. 17B shows example SEM images showing the surface morphologies of liquid metal nanoparticle films processed under different thermal conditions (black: 800° C., red: 900° C., blue: 1000° C.; 10-30 minutes of heating), including the top solid film and the biphasic portion. The films processed at 800° C. show non-coalesced small particles embedded in a small amount of liquid. The films processed at 900° C. and 1000° C. exhibit large crystalline solids embedded in a thick liquid. As the heating temperature or duration increased, the formation of nanowires on the solid side of the biphasic films increased.

Figure 17C:
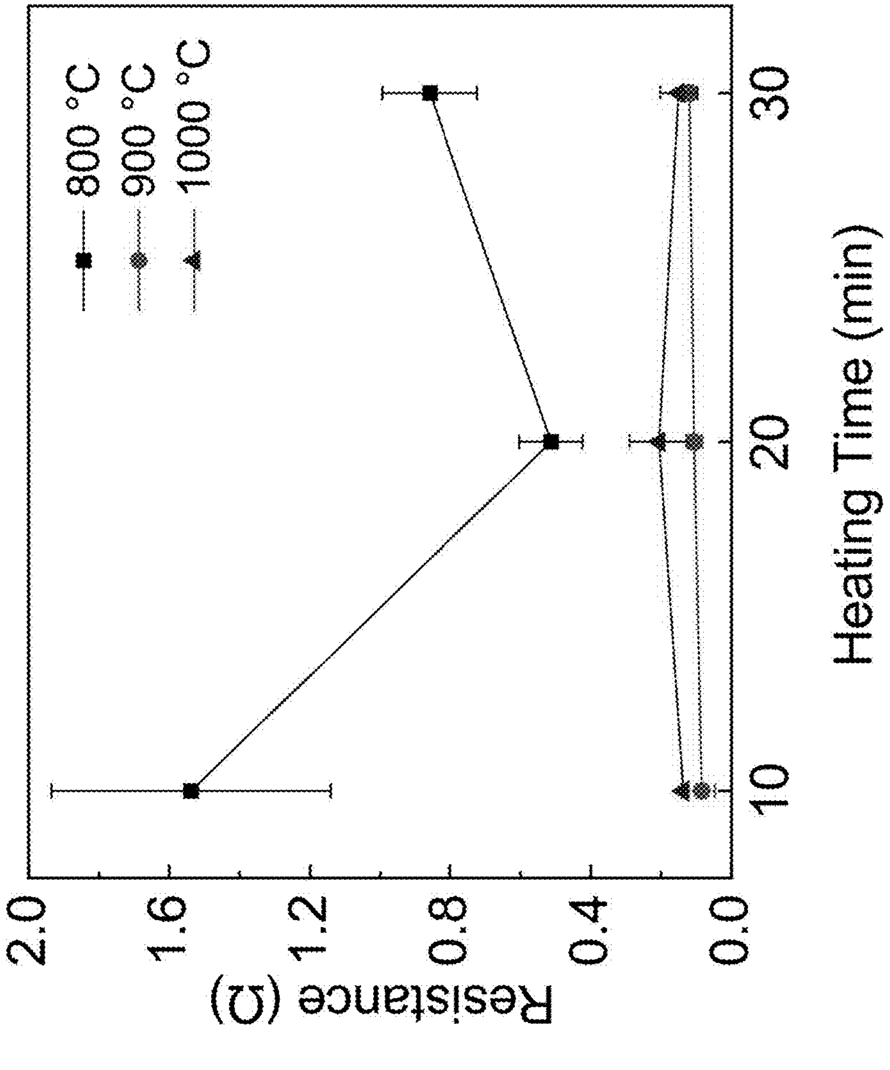

FIG. 17C shows example resistance measurements of liquid metal nanoparticle films processed under different thermal conditions (black squares: 800° C., red circles: 900° C., blue triangles: 1000° C.; 10-30 minutes of heating. The error bars represent one standard deviation of the measured resistance values. The films processed at 900° C. exhibit the smallest resistance values and variances.

Figure 18:
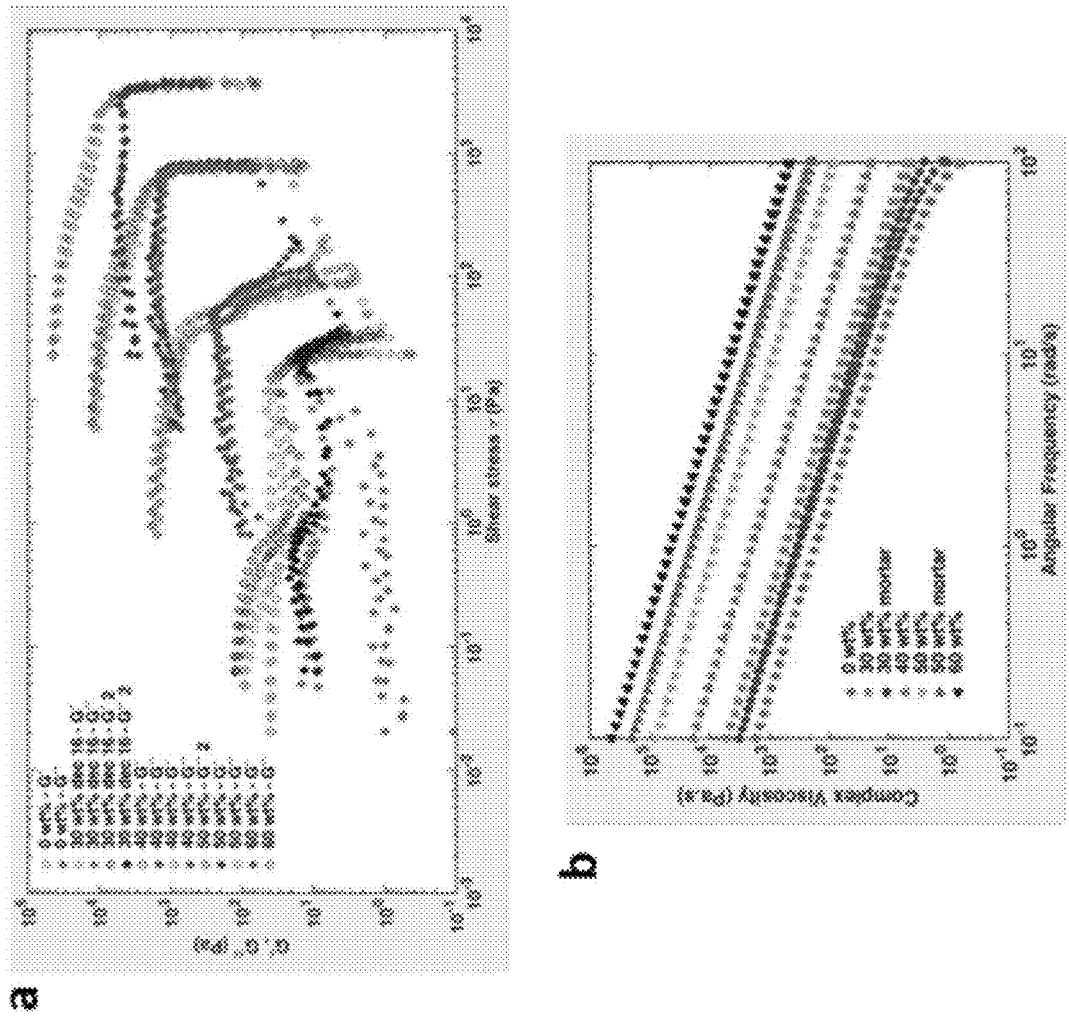

FIG. 18 shows plots of the example experimental rheology.

Figure 19:
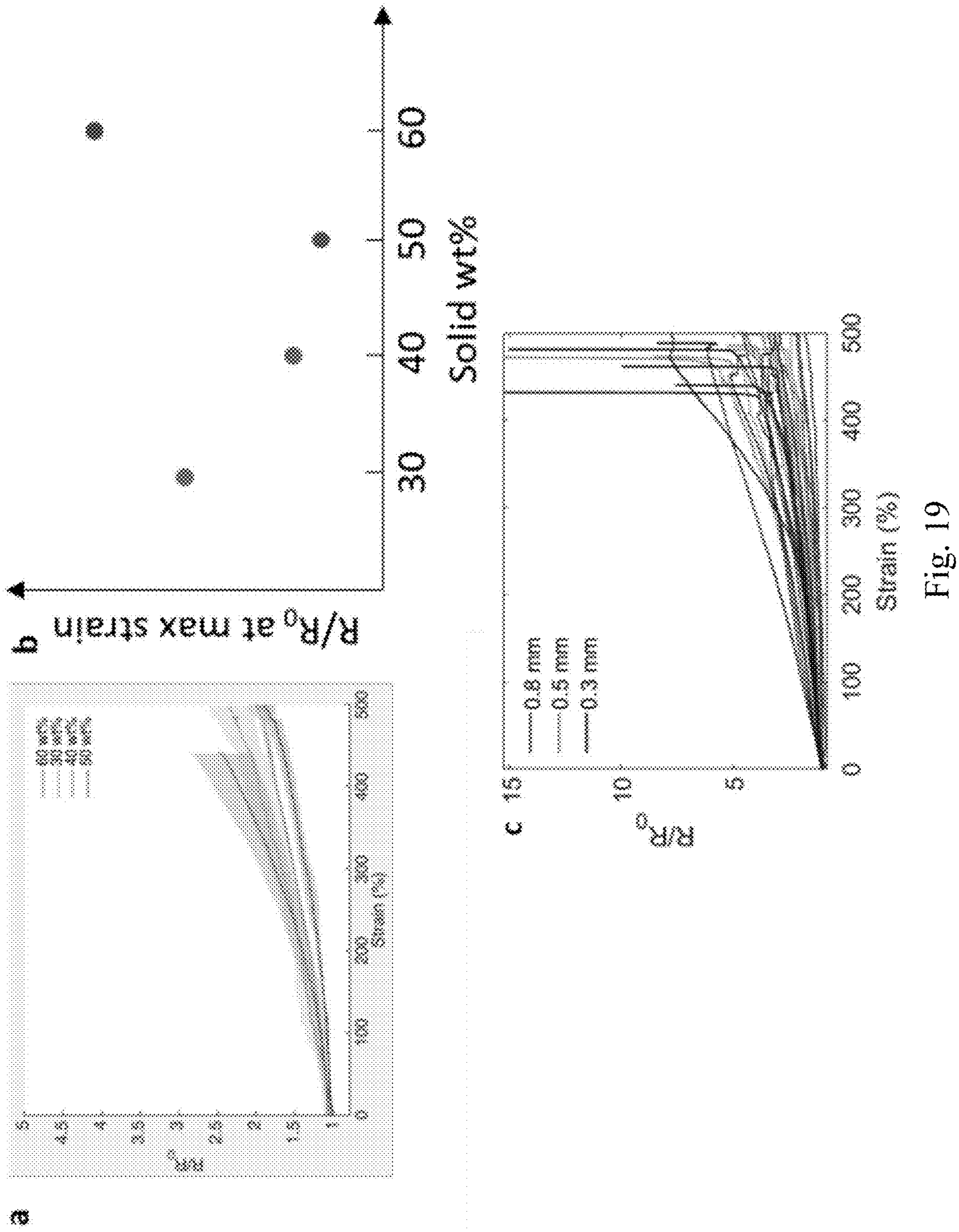

FIG. 19 shows plots of the example experimental electromechanical properties. (a) Trace data of $R/R_0$ vs strain for different S/L ratios of 30, 40, 50, and 60 wt %. (b) Trace data of $R/R_0$ at max strain vs S/L ratio. (c) Interface data of $R/R_0$ for different trace widths and component sizes of 0.2, 0.3, 0.5 and 0.8 mm.

Figure 20:
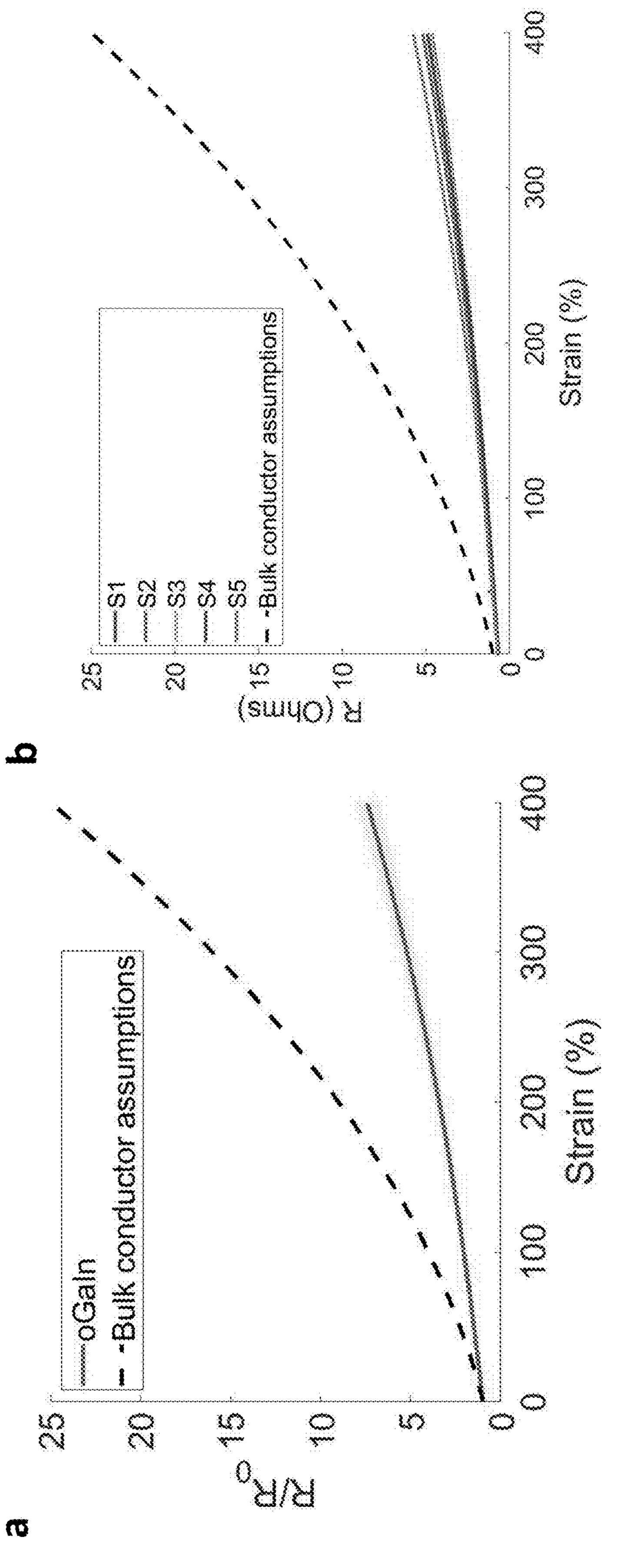

FIG. 20 shows plots of example experimental electromechanical properties. (a) Trace data of $R/R_0$ vs strain of a liquid metal nanoparticle film and theoretical bulk conductor assumptions based on Pouillet's law. (b) Trace data of R (Ohms) vs strain for five samples of liquid metal nanoparticle films and theoretical bulk conductor assumptions based on Pouillet's law.

Figure 21:
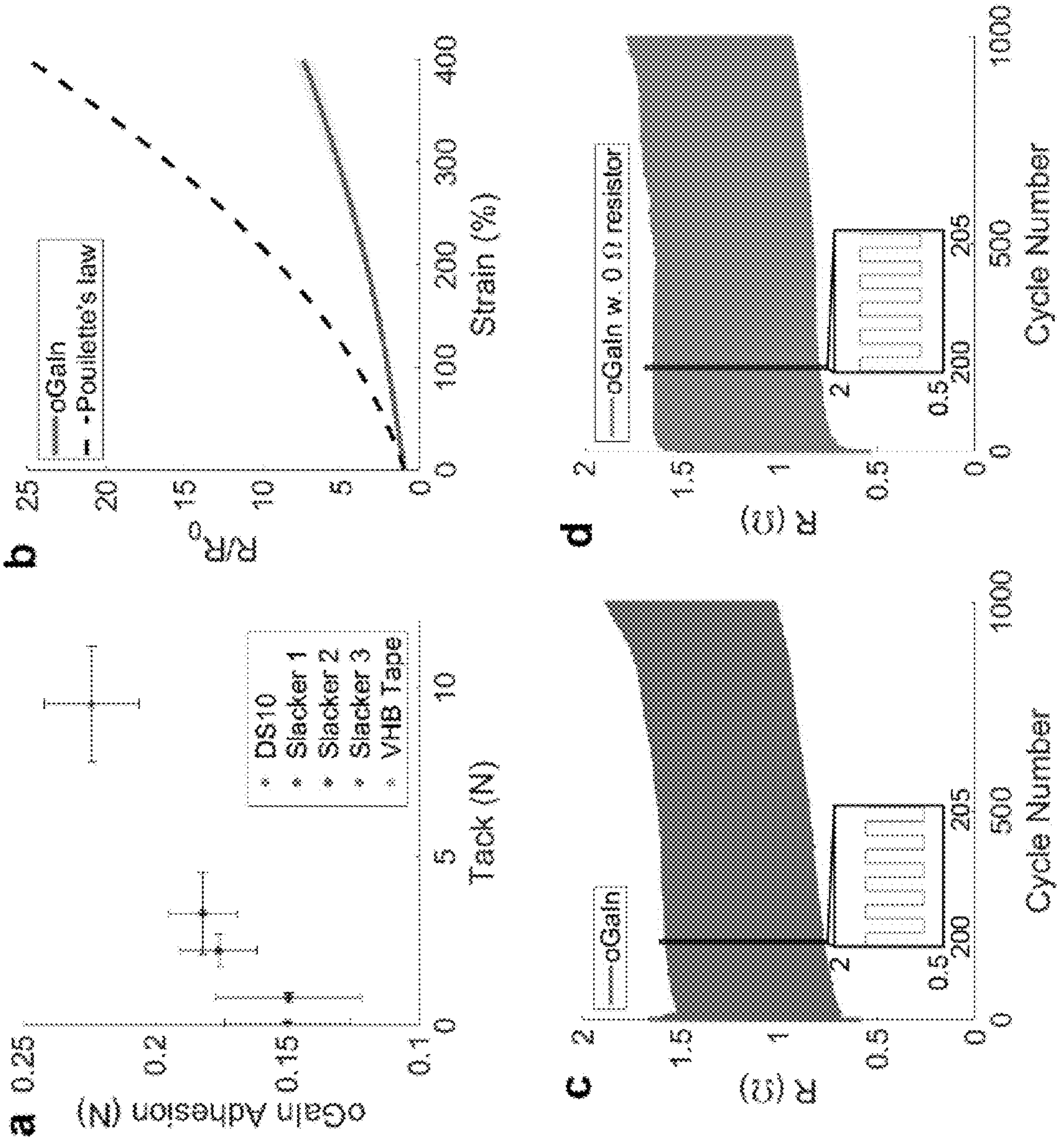

FIG. 21 shows electromechanical performance of oGaIn, another biphasic LM with suppressed strain response, under high strains (b), cyclic strains (c), cyclic strains across an electromechanical component (d), and the tackiness of possible circuit substrates, and how well that correlates to oGaIn adhesion (a).

FIG. 22 shows an instantiation of a stretchable circuit board assembly using oGaIn, in the form of an Arduino Pro Mini circuit (a), testing the circuit on a mechanical testing device (b), the results of each mechanical test (pull-to-failure and cyclic testing) (c), the point on the force displacement curve at which each sample failed when being pulled to serial connection failure (SCF) (d), and the force displacement curves of the circuit substrate with the addition of the circuitry (e).

FIG. 23 shows three demonstrations of stretchable circuit board assemblies with oGaIn traces being used to 1) control a soft quadruped robot (a-c); 2) create a multi-agent system of soft robots that can sense contact between the robots (d-f); and 3) measure the strain across an elbow joint and process that data to provide feedback to a user, as part of a wearable electronic device (g-h).

Figures 24A, 24B, 24C, 24D, 24E, 24F, 24G, 24H, 24I, 24J, 24K, 24L:
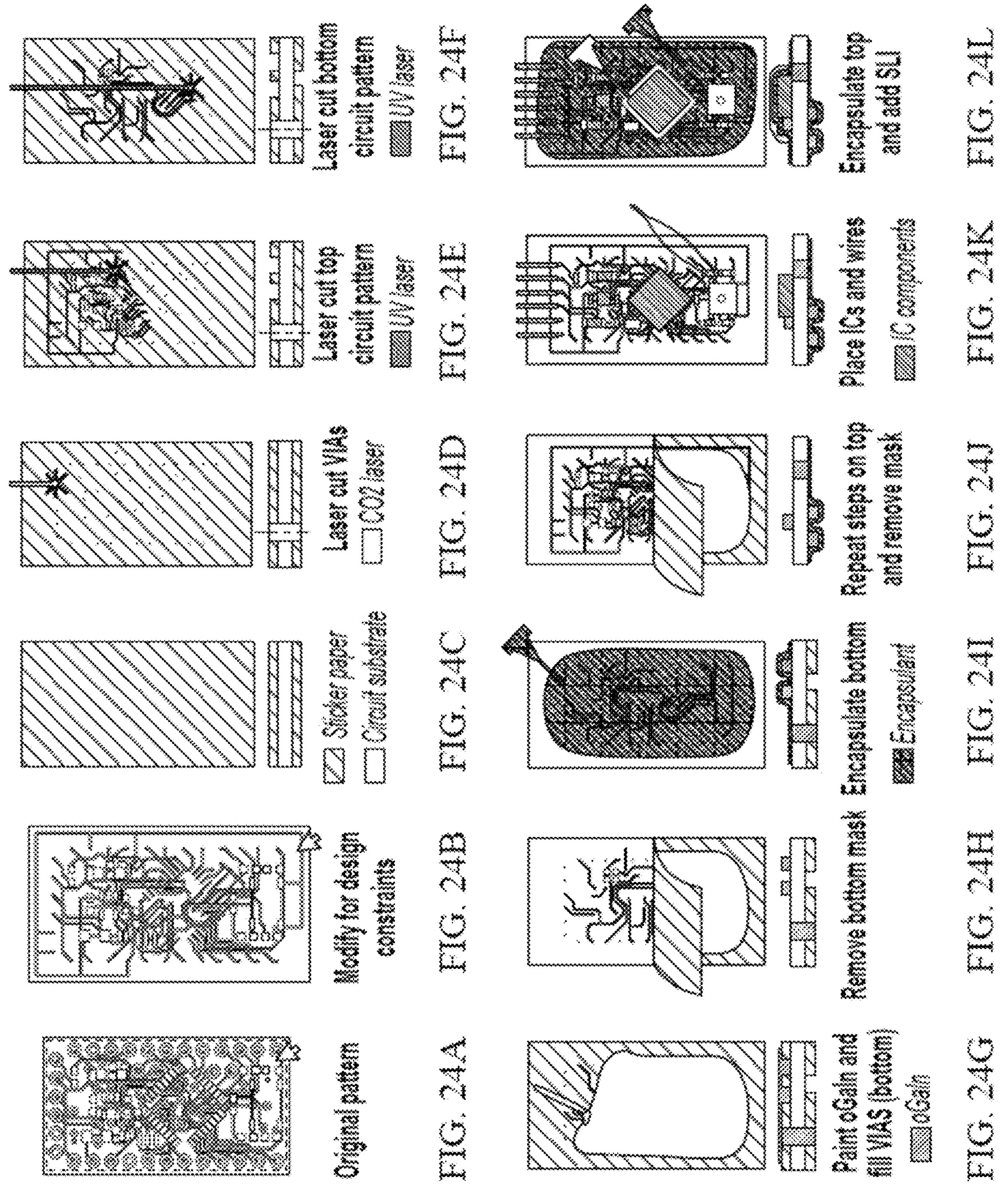

FIG. 24 shows a fabrication process for a 2-layer stretchable circuit board assembly with oGaIn traces, and a process for transferring commercial circuits into a stretchable form.

Figure 25:
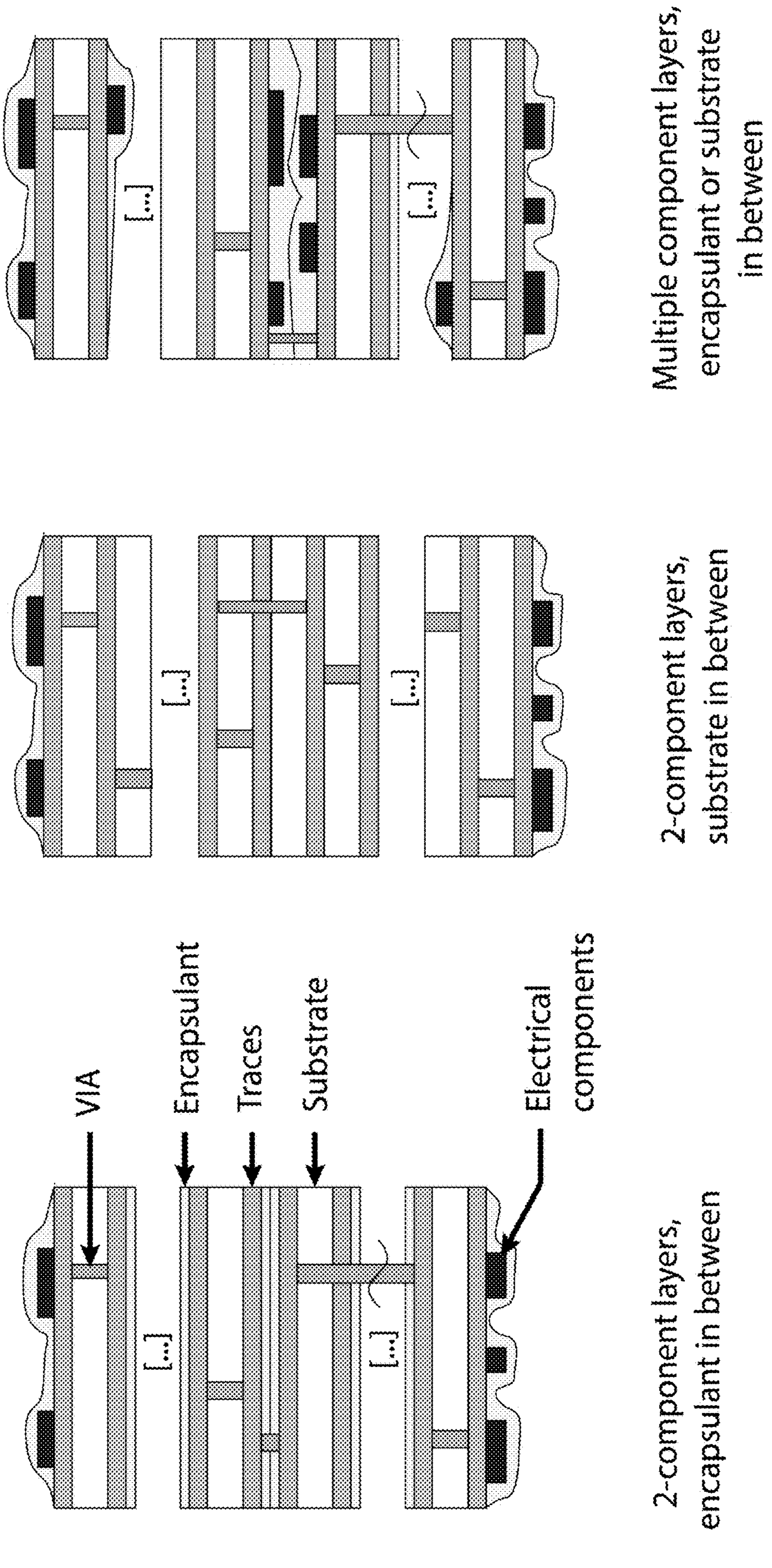

FIG. 25 shows three alternative embodiments of an n-layer circuit board assembly, where n is any number greater than or equal to two.

DETAILED DESCRIPTION

It is to be understood that the figures and descriptions of the present invention have been simplified to illustrate elements that are relevant for a clear understanding of the present invention, while eliminating, for the purpose of clarity, many other elements found in related systems and methods. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, exemplary methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

In one aspect, the present disclosure relates to a strain insensitive conductive material comprising a conductive liquid and a suspended particulate. The disclosed material is less resistive upon strain when compared to bulk conductors, such as copper, as defined by Pouillet's law: R/R0=(1+ε)1+2v, where R/R0 is the relative (normalized) resistance change, ε is the applied strain, and v is the Poisson's ratio, which is most often assumed to be 0.5 for incompressibility. Pouillet's law predicts large increases in resistance even at moderate strains for bulk conductors, which is ideal for resistive sensors, but prohibits the use of stretchable bulk conductors for power circuits, computational circuits, etc. In various embodiments, the material maintains a resistance of less than about 5 Ohms at about 400% strain.

In one embodiment, the conductive liquid is a liquid metal. Exemplary conductive liquids may include but are not limited to, gallium, indium, lead, mercury, tin, zinc, silver, gold, copper, silicon, a biphasic mixture thereof, and a eutectic mixture thereof. In one embodiment, the conductive liquid comprises an alkali metal. In one embodiment, the conductive liquid comprises an alkali earth metal. In one embodiment, the conductive liquid comprises a post-transition metal. In one embodiment, the conductive liquid comprises a late transition metal. In one embodiment, the eutectic mixture of Ga and In includes 75.5 wt % Ga and 24.5 wt % In. In another embodiment, non-eutectic mixtures of Ga and In may be utilized with the Ga ranging from 70 to 93 wt % and the indium ranging from 7 to 30%. In another embodiment, the conductive liquid may be solid at room temperature and have another specified melting temperature ranging from 15 deg. C. to 110 deg. C., or 15 deg. C. to 37 deg. C.

In one embodiment, the particulate is a metal oxide. Exemplary particulates may include but are not limited to, a gallium oxide, a lithium oxide, a metal oxide, a group 13 oxide, silicon, doped silicon, a silicon oxide, germanium, indium antimonide. In one embodiment, the particulate is crystalline. In one embodiment, the particulate is amorphous. In one embodiment, the particulate is both crystalline and amorphous. In one embodiment, the particulate is non-conductive. In one embodiment, the particulate is semi-conductive. In one embodiment, the particulate has a median particle size between 0 and 50 μm, wherein at least 80% of the particles deviate no more than between 0 and 20 μm from the median particle size.

In one embodiment, the volumetric ratio of particulate to conductive liquid is between 0.02 and 0.70. In one embodiment, the volumetric ratio of particulate to conductive liquid is between 0.02 and 0.10. In one embodiment, the volumetric ratio of particulate to conductive liquid is between 0.05 and 0.10. In one embodiment, the volumetric ratio of particulate to conductive liquid is between 0.10 and 0.70. In one embodiment, the volumetric ratio of particulate to conductive liquid is between 0.20 and 0.70. In one embodiment, the volumetric ratio of particulate to conductive liquid is between 0.30 and 0.70. In one embodiment, the volumetric ratio of particulate to conductive liquid is between 0.40 and 0.50. In one embodiment, the volumetric ratio of particulate to conductive liquid is between 0.40 and 0.60. In one embodiment, the volumetric ratio of particulate to conductive liquid is between 0.40 and 0.70. In one embodiment, the volumetric ratio of particulate to conductive liquid is between 0.50 and 0.60. In one embodiment, the volumetric ratio of particulate to conductive liquid is between 0.50 and 0.70. In one embodiment, the volumetric ratio of particulate to conductive liquid is between 0.60 and 0.70.

Sufficient wetting is achieved between the conductive liquid and particulate to stabilize the liquid. For the purposes of this disclosure, "sufficient" means that the liquid metal can percolate through the interstices of solid particles, without seeing any separations between liquid and solid. Sufficient wetting may be achieved by heating liquid metal particles at high temperature (800 deg. C. or higher) to create biphasic material in situ. As a comparison, directly mixing solid particles with liquid metal can lead to separations. In another embodiment, the solid particles may be created in situ, and for example, by letting the liquid metal react with a specified environment in order to create solid particles within the liquid metal. Traditional patterning of thin films is challenging because of the high surface tension of conductive liquids which causes beading and subsequent deviation from the desired deposition pattern. Sufficient wetting between the conductive liquid and particulate has been shown to circumvent these challenges by preventing unwanted beading of the conductive liquid, providing ease in processing and patterning of thin films.

Most circuitry is made of copper. As a constant-conductivity bulk conductor, copper theoretically follows Pouillet's law when strained: $R/R0=(1+\varepsilon)1+2v$, where $R/R0$ is the relative (normalized) resistance change, $\varepsilon$ is the applied strain, and $v$ is the Poisson's ratio, which is most often assumed to be 0.5 for incompressibility. Pouillet's law predicts large increases in resistance even at moderate strains for bulk conductors, which is ideal for resistive sensors, but prohibits the use of stretchable bulk conductors for power circuits, computational circuits, etc. The disclosed material given sufficient wetting between the conductive liquid and particulate is a strain-insensitive stretchable conductor.

One embodiment of the disclosed material shows a maximum normalized resistance of about 7 at 400% strain. One embodiment of the disclosed material shows a maximum normalized resistance that is 10% of the maximum normalized resistance of copper at 400% strain. One embodiment of the disclosed material shows a maximum normalized resistance that is 15% of the maximum normalized resistance of copper at 400% strain. One embodiment of the disclosed material shows a maximum normalized resistance that is 20% of the maximum normalized resistance of copper at 400% strain. One embodiment of the disclosed material shows a maximum normalized resistance that is 25% of the maximum normalized resistance of copper at 400% strain. One embodiment of the disclosed material shows a maximum normalized resistance that is 30% of the maximum normalized resistance of copper at 400% strain. One embodiment of the disclosed material shows a maximum normalized resistance that is 35% of the maximum normalized resistance of copper at 400% strain. One embodiment shows maximum normalized resistance of up to 12 at 400% strain.

One embodiment of the disclosed material relates to a biphasic gallium-indium alloy, referred to herein as "bGaIn." In one embodiment, bGaIn is produced by thermally treating eGaIn nanoparticles to create a mixture of liquid and crystalline solids. One embodiment of bGaIn shows a high initial conductivity of $2.06\times10^{6}$ S $m^{-1}$, and near-constant resistance at strains over 1000%. BGaIn may be employed as a stretchable interconnect to interface with commercial electronic components, including but not limited to resistors, capacitors, light-emitting diodes (LEDs), operational amplifiers, and microcontrollers, by simply placing the electronics onto the bGaIn trace. One embodiment of the disclosed material is a simple, non-toxic solution for making stretchable conductors with robust interfaces to conventional electronic components, opening up opportunities to mass-manufacture stretchable circuits.

Although certain exemplary embodiments of methods, compositions, and systems are discussed herein using a particular liquid metal (for example GaIn), it is understood that in various embodiments other room temperature liquid metals could be used, for example Galinstan. In one aspect, a method of making the formulation comprises depositing a quantity of nanoparticles onto a substrate or into a crucible, heating the quantity of nanoparticles in an enclosed furnace to a temperature between 800° and 1000° C. for a time duration between 5 minutes and 60 minutes to form a film comprising a conductive liquid and a particulate suspended in the conductive liquid, and cooling the film in ambient conditions. In some embodiments, a temperature range of 800° to 1000° C. and a time duration of 10 to 30 min is preferred.

In another aspect, a method of making the formulation comprises depositing a first quantity of nanoparticles onto a first substrate or into a crucible, heating the first quantity of nanoparticles in an enclosed furnace to a temperature between 800° and 1000° C. for a time duration between 5 minutes and 60 minutes to form a first film comprising a conductive liquid and a particulate suspended in the quantity of conductive liquid, and cooling the first film in ambient conditions. In some embodiments, a temperature range of 800° to 1000° C. and a time duration of 10 to 30 min is preferred.

In one embodiment, the method comprises transferring at least a portion of the film to a second stretchable substrate to form at least one conductive trace, securing one or more electrical components to the at least one trace, and encapsulating the one or more electrical components and the at least one trace with a stretchable encapsulating layer.

In one embodiment, the method comprises positioning a mask over a second stretchable substrate, transferring the film to the unmasked portion of the second stretchable substrate to form at least one conductive metal trace, and removing the mask.

In one embodiment, the method comprises transferring the film to the portion of the second stretchable substrate by means which comprise at least one of: pressing the film against the substrate; scraping the film off the first substrate, mixing the film, and spreading the mixed film over the substrate; printing; spraying; and direct writing.

In one embodiment, the method comprises the steps of: after transferring the film to the portion of the second stretchable substrate, depositing a third stretchable insulating layer over the second stretchable substrate and the film;

transferring a second portion of the film to a portion of the third stretchable insulating layer to form at least one second trace; cutting at least one cavity through the at least one trace and the at least one second trace; and filling the at least one cavity with conductive liquid to form a VIA.

In one embodiment, the method comprises depositing a second quantity of particles onto a second substrate, heating the second quantity of particles in an enclosed furnace to a temperature between 800 and 1000° C. for a time duration between 5 minutes and 60 minutes or alternatively 5 to 30 minutes to form a second film comprising a conductive liquid and a particulate suspended in the quantity of conductive liquid, cooling the second film in ambient conditions, transferring at least a portion of the first film to a first surface of a stretchable substrate to form at least one first trace, transferring at least a portion of the second film to a second surface of a stretchable substrate to form at least one second trace, wherein the second surface is opposite the first surface, securing one or more electrical components to the at least one first and second traces, encapsulating the one or more electrical components and the at least one first trace with a first stretchable encapsulating layer, encapsulating the one or more electrical components and the at least one second trace with a second stretchable encapsulating layer, cutting at least one cavity through the at least one first trace and the at least one second trace, and filling the at least one cavity with conductive liquid to form a VIA.

In one embodiment, the method comprises positioning a first mask over the first surface of the stretchable substrate, transferring the first film to the unmasked portion of the first surface to form at least one first trace, removing the first mask, positioning a second mask over the second surface of the stretchable substrate, transferring the second film to the unmasked portion of the second surface to form at least one second trace, and removing the second mask.

Material Characteristics

EGaIn is a favorable material for stretchable electronics due to its high conductivity, intrinsic stretchability, and printability. However, when exposed to oxygen, eGaIn develops a near-instantaneous gallium oxide layer composed primarily of $Ga_2O_3$, which allows liquid metal to adhere to surfaces and adopt stable non-spherical shapes, but also imparts high surface tension (~624 $mN \cdot m^{-1}$), making the material challenging to process. To overcome the limitations posed by the high surface tension of liquid metal, in one embodiment, a liquid metal nanoparticle ink was created by sonicating bulk eGaIn in ethanol, and then printing those inks into thin films (see S. Liu, et al., "Laser sintering of liquid metal nanoparticles for scalable manufacturing of soft and flexible electronics," *ACS Applied Materials & Interfaces,* 10(33):28232-28241, 2018, incorporated herein by reference). The electrically insulating oxide layer in eGaIn prevents spontaneous particle coalescence and makes the film non-conductive. To reactivate the liquid metal in micron-scale traces, a laser was used to rupture the oxide skins of the nanoparticles and coalesce them into conductive paths. However, it was discovered that, due to severe oxidation and phase segregation, high-temperature thermal sintering often depletes liquid cores of the nanoparticles, creating a pure solid film.

Figure 1:
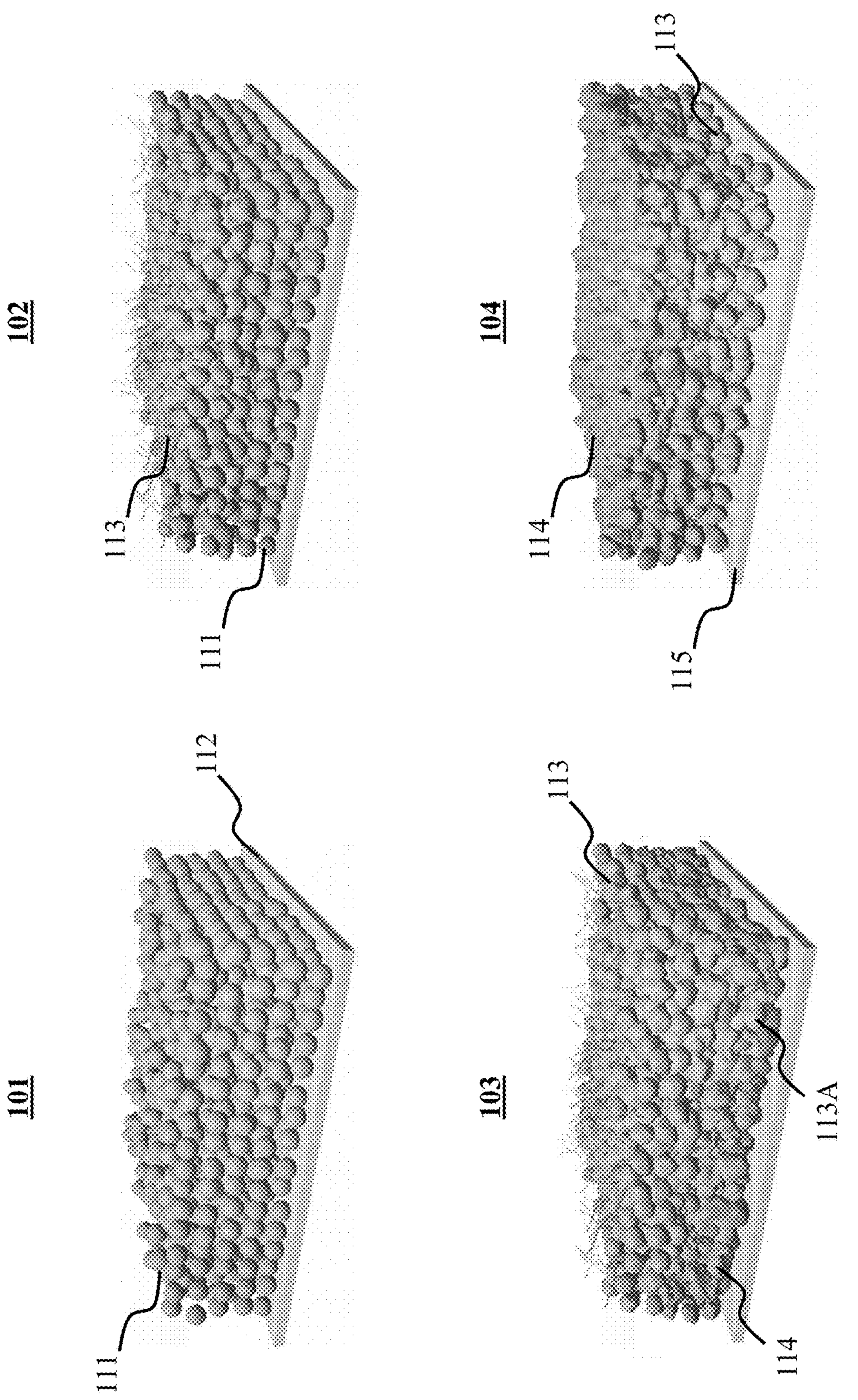
FIG. 1 shows the process used to create and print bGaIn.
Figure 3A:
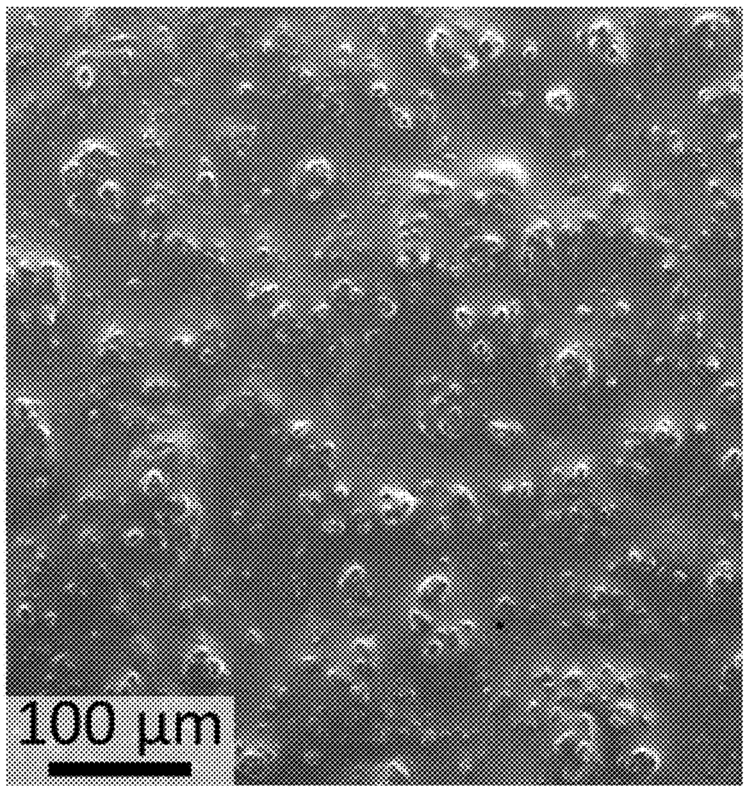
FIG. 3A and FIG. 3B show SEM images of the top surface of a bGaIn film after transferal to VHB tape.
Figure 3B:
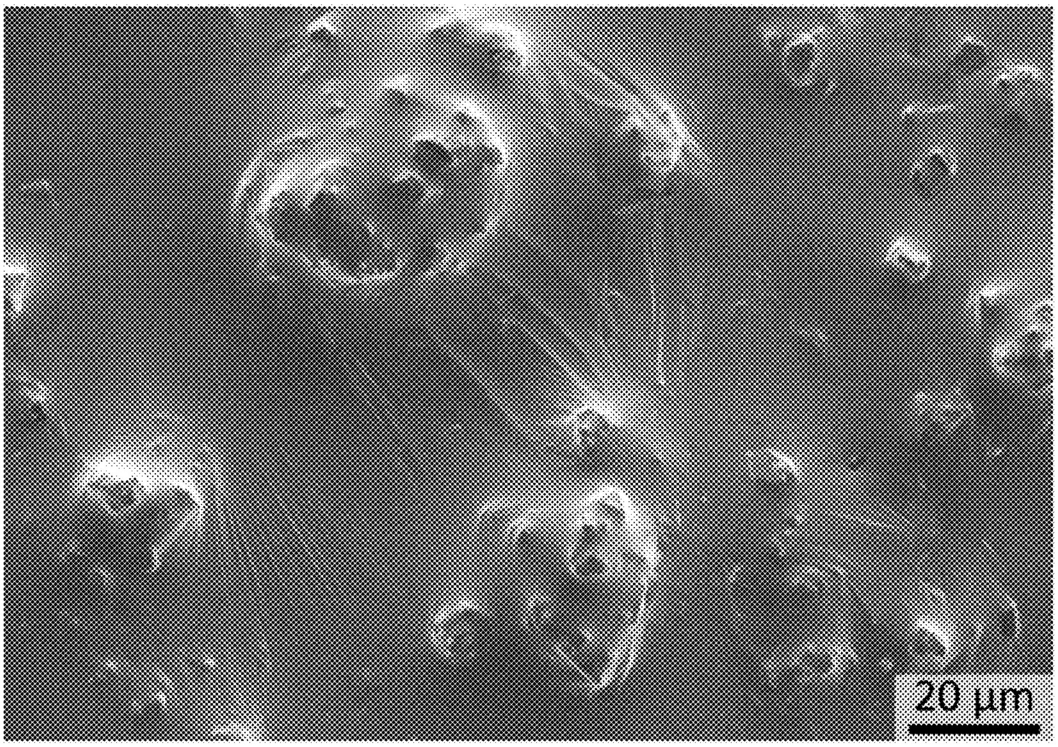
Figure 3C:
FIG. 3C shows an SEM image of the top thin solid layer of a bGaIn film on silicon.

By contrast, the disclosed bGaIn material is in one embodiment created by a general thermal treatment of eGaIn nanoparticles, as shown in FIG. 1. In one embodiment, the sonication time is about 2 hours. In one embodiment, the eGaIn nanoparticles may have a diameter of between 100 nm and 300 nm, or between 150 nm and 280 nm, or between 180 nm and 250 nm, or between 200 nm and 250 nm, or between 210 nm and 230 nm. With reference to FIG. 1, an exemplary process to create and deposit bGaIn is shown. In the first step 101, a thick layer of eGaIn nanoparticles 111 are spray printed on a silicon wafer 112. In some embodiments, the thick layer may have a thickness of at least 200 nm, at least 500 nm, at least 1 μm, at least 2 μm, at least 5 μm, at least 10 μm, or at least 20 μm. Next, in step 102, thermal sintering is applied by heating the deposited film in an enclosed furnace for 30 minutes at 900° C., then cooling the film in ambient conditions. During this process, particles at the top surface 113 form heterogeneously structured crystalline solids due to oxidation and phase segregation (FIG. 3C). In one embodiment, the thin solid film of structured crystalline solids has a thickness of about 500 nm. In step 103, below the solid film, a small number of particles are oxidized into solids 113A (primarily $Ga_2O_3$), while the majority of the eGaIn particles coalesce into a conductive liquid 114. In one embodiment, this thick biphasic portion has a thickness of about 24 μm. In step 104, the resulting bGaIn is transferred to a stretchable substrate 115, which in one embodiment comprises VHB or silicone. The volumetric ratio of solid particles to liquid GaIn in the biphasic layer may differ in various embodiments, and the volumetric ratio may be between 0.4 and 0.7, or between 0.5 and 0.6, or between 0.55 and 0.6, or about 0.57. In one embodiment, the solid particles 113A may have a particle size of between 3 μm and 30 μm, or between 8 μm and 24 μm, or 15.9 μm±7.9 μm. Solid particles may comprise $Ga_2O_3$ and/or indium crystals.

In some embodiments the rheology of the bGaIn is tunable to select favorable electromechanical properties and/or to fit within different printability maps and parameters (FIG. 18). For example, with lower solid content the bGaIn can be extruded (direct write), while with more solid content the bGaIn can be molded. In some embodiments re-emulsifying of the bGaIn is utilized to produce bGaIn suitable for use in inkjet printing and/or laser sintering. In some embodiments, the volumetric ratio of solid particles to liquid GaIn content can be used to produce bGaIn compatible with inkjet printing, extrusion printing, screen printing, and/or molding.

Although the disclosed thermal sintering process is presented with the exemplary duration of 30 minutes, in some embodiments, the heating could have a duration of between 5 and 60 minutes, or between 10 and 45 minutes, or between 15 and 40 minutes, or between 20 and 35 minutes, or between 25 and 32 minutes, or about 30 minutes. Similarly, although the exemplary heating stage of the thermal sintering process is conducted at 900° C., in other embodiments the process could take place at a temperature between 700 and 1200° C., or between 800 and 1000° C., or between 825 and 975° C., or between 850 and 950° C., or between 875 and 925° C., or between 890 and 910° C., or between 895 and 905° C., or about 900° C.

Although the disclosed exemplary result of the thermal sintering process 103 shown in FIG. 1 recites a thin solid film of structured crystalline solids having a thickness of about 500 nm, it is understood that in some embodiments the film may have a thickness of between 100 nm and 1500 nm, or between 200 nm and 1200 nm, or between 250 nm and 750 nm, or between 300 nm and 700 nm, or between 400 nm and 600 nm, or between 450 nm and 550 nm, or about 500 nm, or any range in between.

The biphasic portion underneath is recited as being about 24 μm thick, but could in other embodiments have any suitable thickness as needed for the application, including but not limited to 500 nm to 100 μm, or between 1 μm and 50 μm, or between 5 μm and 40 μm, or between 20 μm and 30 μm, or between 22 μm and 26 μm, or any range in between.

Figure 2:
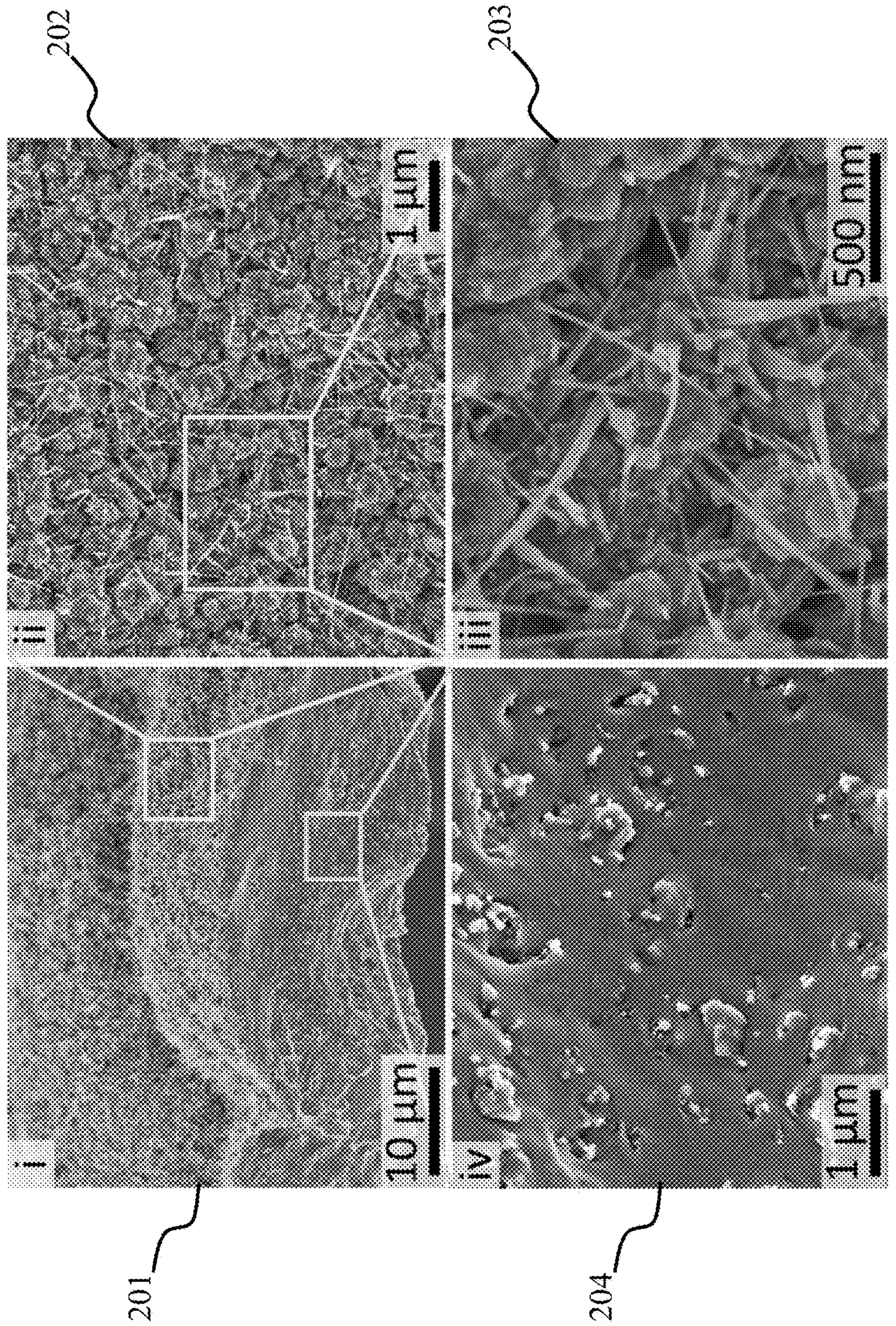
FIG. 2 shows SEM images showing the cross-section of a bGaIn film.

With reference to FIG. 2, a series of SEM images are shown at different levels of magnification, depicting the top solid film (113) in 201, 202, and 203, and the biphasic portion (113A/114) in 204. The dense oxide layer largely prevents further oxygen penetration into the particles that lie deeper in the film, which in some embodiments yields a consistent thickness. Meanwhile, the liquid particles underneath this solid layer experience significant internal thermal stresses, owing to a larger thermal expansion of the liquid cores relative to the oxide shells, rupturing the oxide skins and coalescing the particles (see 103 in FIG. 1, 204 in FIG. 2).

Figure 4A:
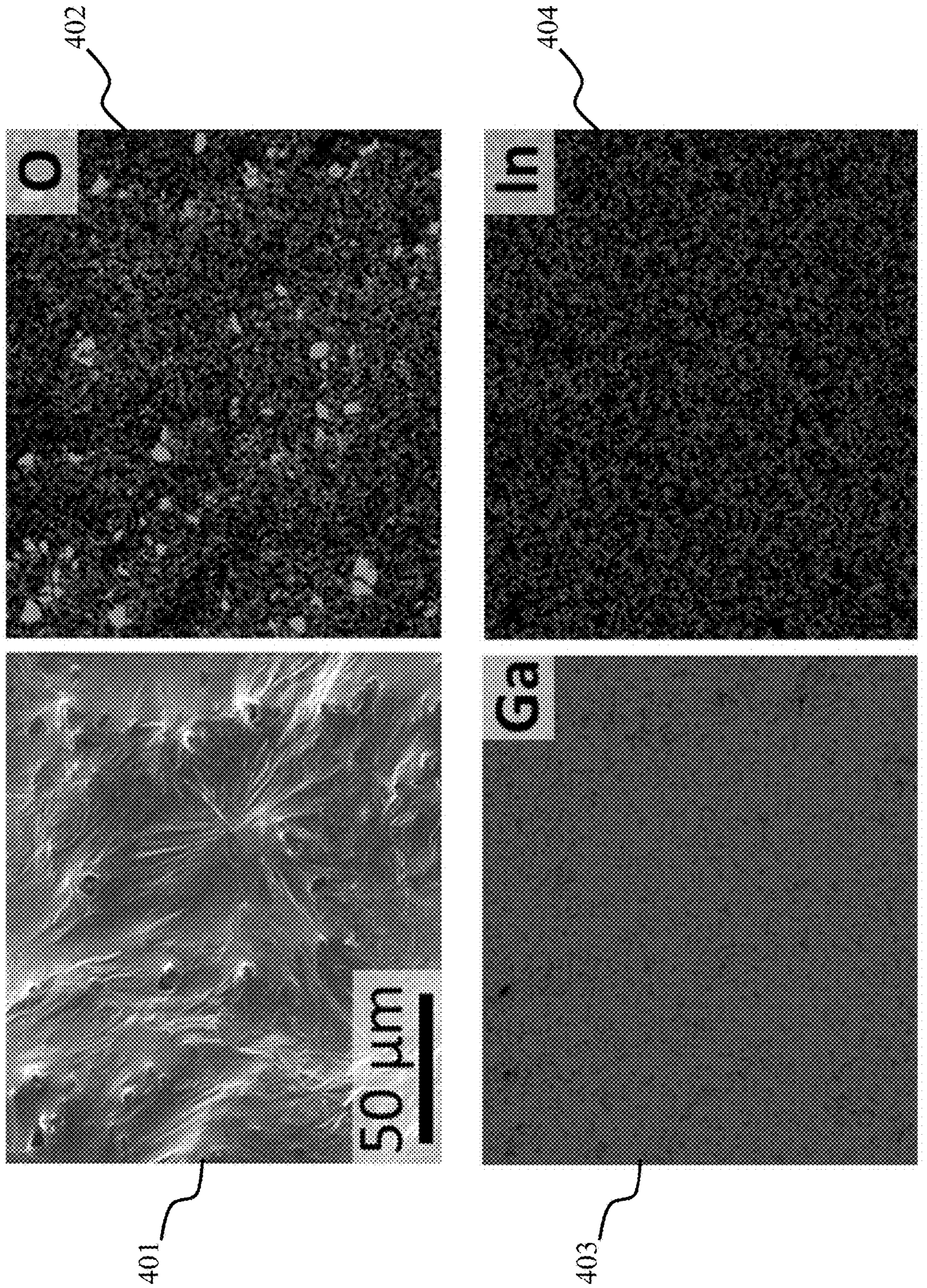
FIG. 4A shows EDS mappings of the top surface of the bGaIn film after transfer, indicating significantly higher oxygen concentrations in the areas with solid particles.
Figure 4B:
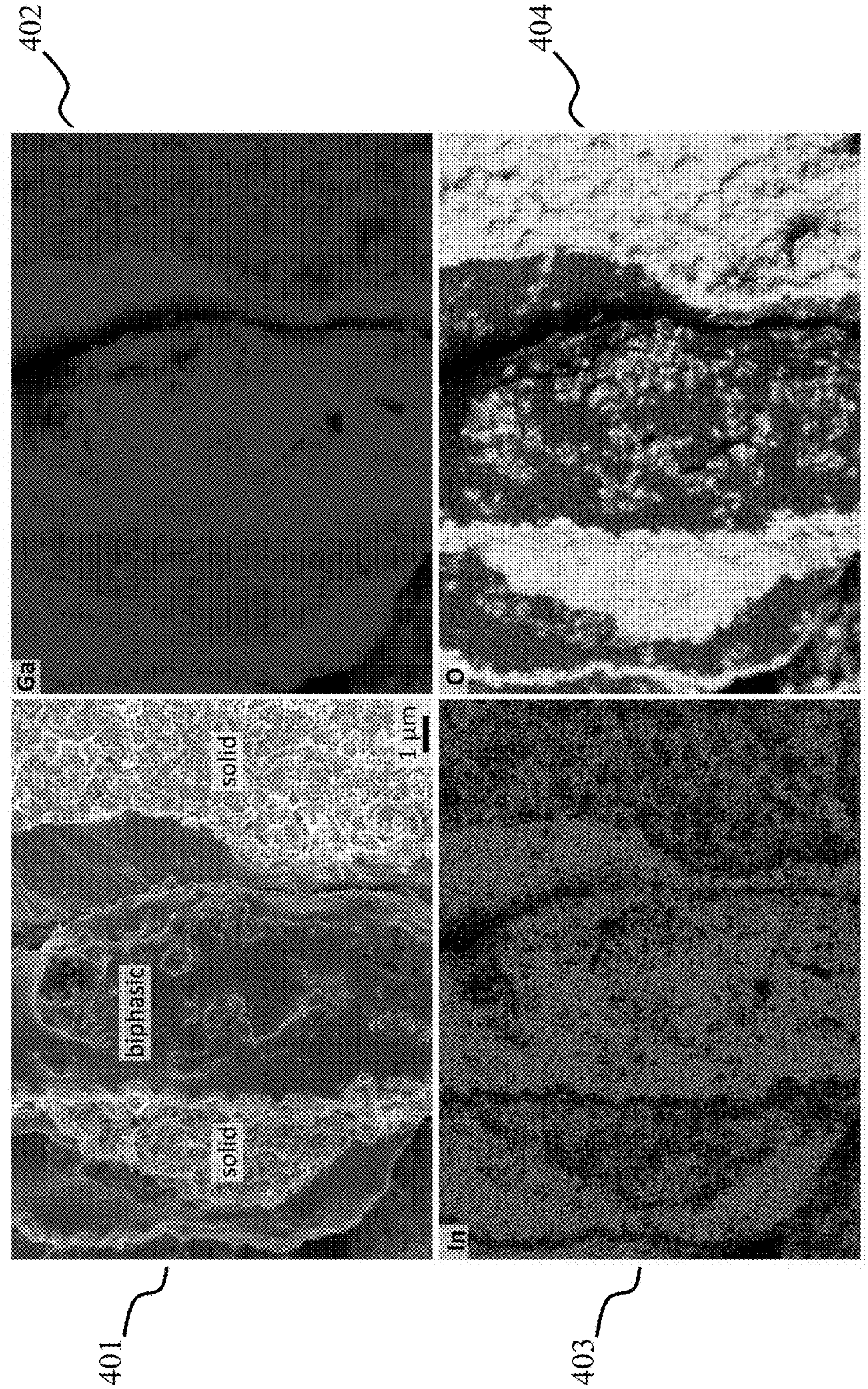
FIG. 4B shows EDS mappings of both the solid and the biphasic sides of a bGaIn film after scraping off of a silicon wafer. The solid side exhibits significantly higher oxygen concentrations. The higher oxygen concentrations in the biphasic portion indicates that the bGaIn film initially contained some solids.
Figure 4C:
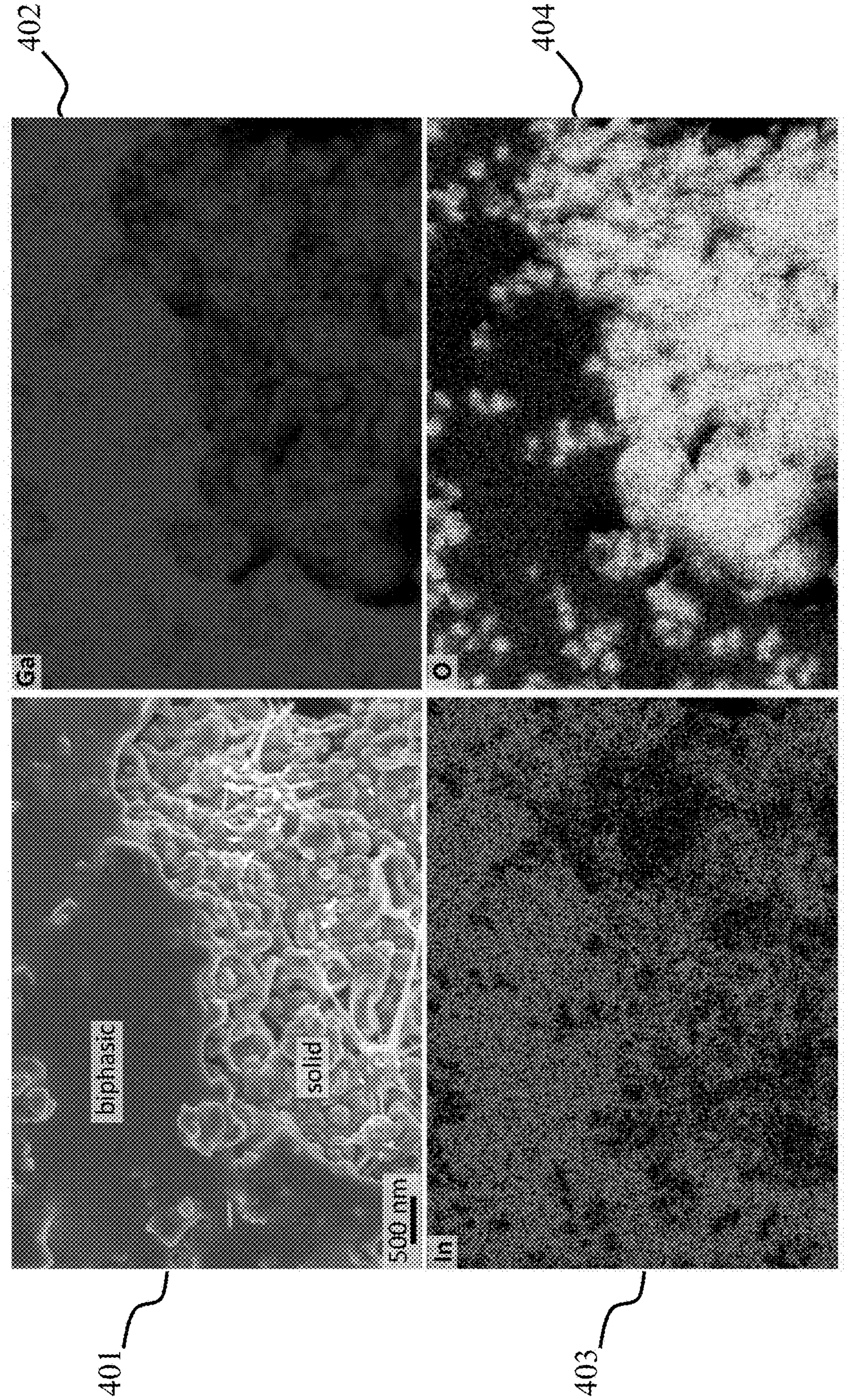
FIG. 4C shows EDS mappings of the solid and biphasic sides of a bGaIn film in a close view, after scraping off of the silicon wafer. The areas with higher oxygen concentrations indicate the solid particles with a higher extent of oxidation.
Figure 4D:
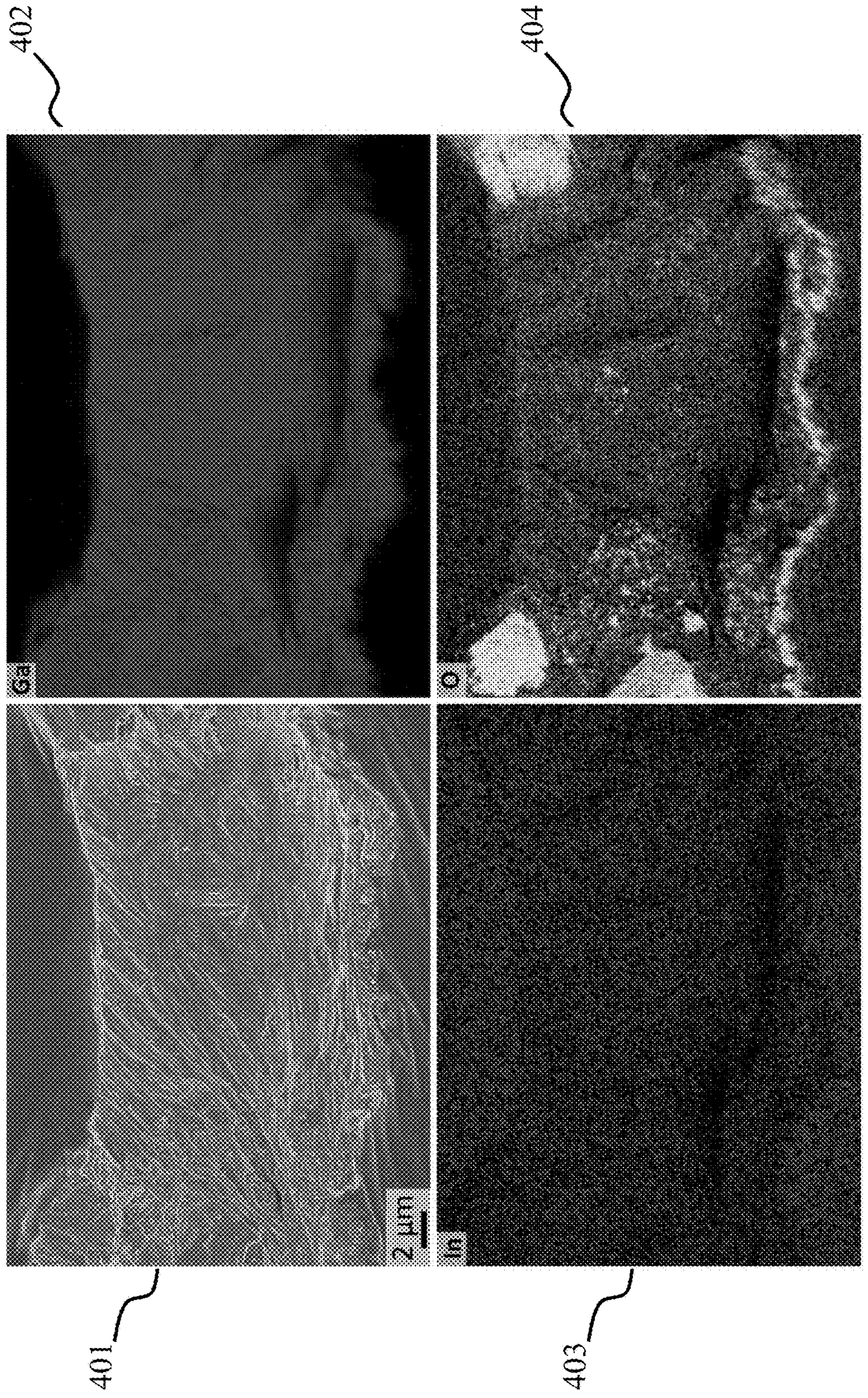
FIG. 4D shows EDS mappings of the cross-section of a bGaIn film. The bGaIn film was transferred to a VHB tape, encapsulated with another layer of VHB on top, and then cleaved after freezing in liquid nitrogen. The oxygen mapping shows that the solid particles strongly adhere to the VHB substrate.
Figure 4E:
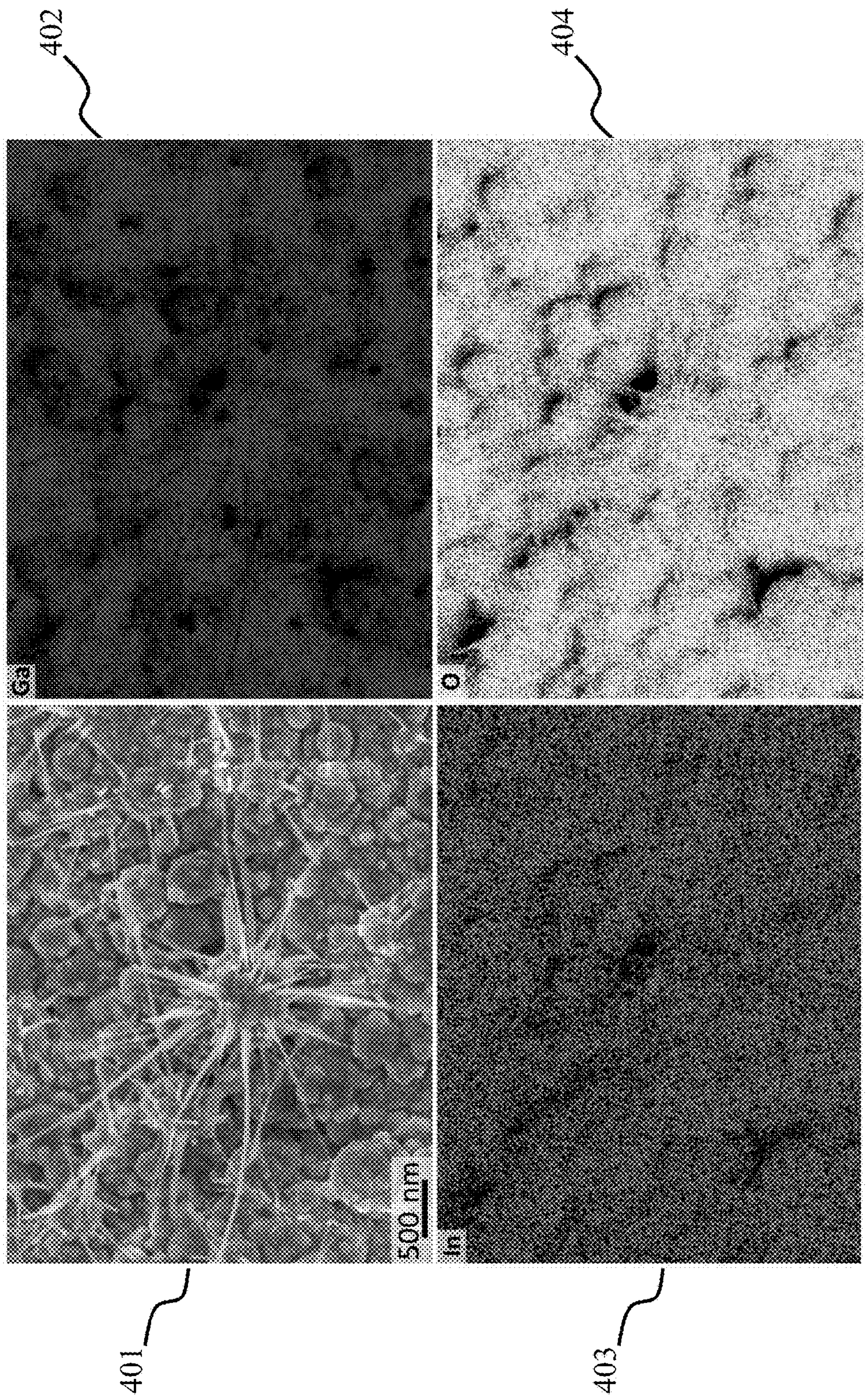
FIG. 4E shows EDS mappings of the top solid surface of a bGaIn film. It comprises heterogeneous structures including solid particles and nanowires. Oxygen, gallium, and indium are all well distributed over the entire region.
Figure 4F:
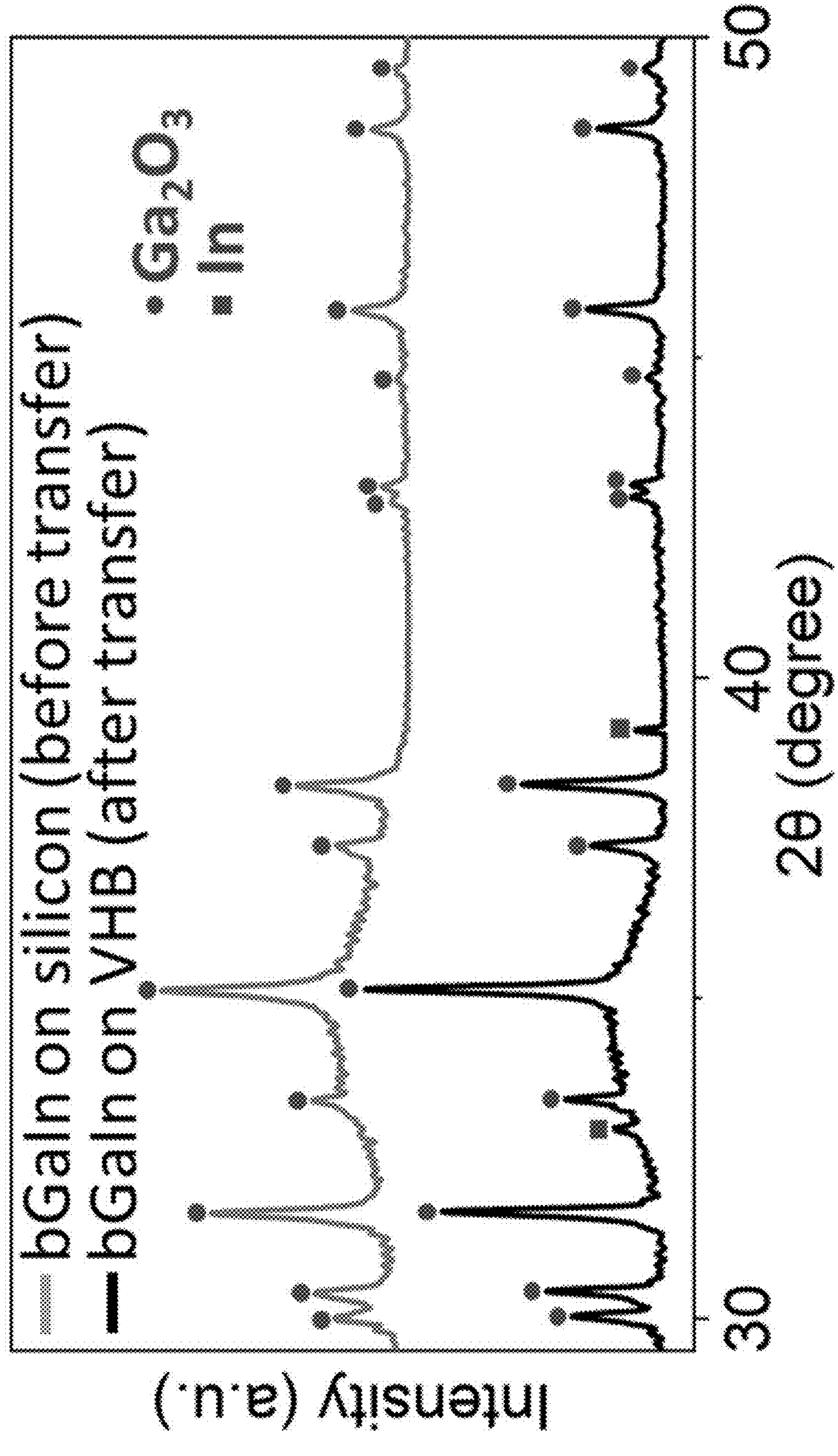
FIG. 4F shows X-ray diffraction patterns of the bGaIn film on silicon wafer (before transferring to a soft substrate) and on VHB (after transfer).

In one embodiment, the bGaIn film was transferred to stretchable substrates, such as acrylic-based tape (VHB, 3M) or silicone elastomer (Dragon Skin, Smooth-On Inc.), by pressing the silicon wafer onto the substrate. The solid film adheres to the substrate and the biphasic portion remains on the surface (see 104 in FIG. 1). Although the bGaIn film initially contains some solids 113A, the transfer process embeds additional solid particles into the biphasic portion. This is shown in FIG. 3A and FIG. 3B which depict SEM images of a top surface of a bGaIn film after transfer to VHB tape at different magnifications. These solid particles exhibit significantly higher oxygen concentrations than the liquid in the EDS mappings (see FIG. 4A, FIG. 4B, FIG. 4C, FIG. 4D, FIG. 4E), indicating a higher extent of oxidation. XRD analysis shows that these solids are primarily monoclinic β-$Ga_2O_3$ crystals, as shown in FIG. 4F.

Unlike eGaIn, which is purely amorphous, bGaIn has both amorphous and crystalline structures, with both sharp and broad peaks appearing in the spectrum. XRD analysis shows that before transfer, (top graph, FIG. 4F) all the identified peaks in the bGaIn film correspond to monoclinic β-$Ga_2O_3$ (space group C2/m, PDF #01-087-1901). This suggests that the amorphous $Ga_2O_3$ oxide shells crystalize to β-$Ga_2O_3$ during the thermal treatment. After being transferred to soft substrates from silicon, crystalline peaks corresponding to tetragonal indium (space group I4/mmm, PDF #00-005-0642) appear, indicating that indium crystals originally residing deeper in the liquid film are pushed up to the surface.

Table 1 below shows the identified crystalline planes, phases, and corresponding diffraction angles of the biphasic film on silicon wafer (before transfer).

TABLE 1

| No. | 2-theta (deg) | Crystalline plane (h k l) | Phase name |
|---|---|---|---|
| 1 | 30.00 | 4 0 0 | $Ga_2O_3$ |
| 2 | 30.38 | −4 0 1 | $Ga_2O_3$ |
| 3 | 31.63 | 0 0 2 | $Ga_2O_3$ |
| 4 | 33.39 | −1 1 1 | $Ga_2O_3$ |
| 5 | 35.11 | 1 1 1 | $Ga_2O_3$ |
| 6 | 37.38 | 4 0 1 | $Ga_2O_3$ |
| 7 | 38.32 | 2 0 −2 | $Ga_2O_3$ |
| 8 | 42.83 | 3 1 1 | $Ga_2O_3$ |
| 9 | 42.99 | −1 1 2 | $Ga_2O_3$ |
| 10 | 44.65 | −6 0 1 | $Ga_2O_3$ |
| 11 | 45.73 | −3 1 2 | $Ga_2O_3$ |
| 12 | 48.55 | 5 1 0 | $Ga_2O_3$ |
| 13 | 49.51 | −6 0 2 | $Ga_2O_3$ |

Table 2 below shows identified crystalline planes, phases, and corresponding diffraction angles of the biphasic film on VHB tape (after transfer).

TABLE 2

| No. | 2-theta (deg) | Crystalline plane (h k l) | Phase name |
|---|---|---|---|
| 1 | 30.03 | 4 0 0 | $Ga_2O_3$ |
| 2 | 30.42 | −4 0 1 | $Ga_2O_3$ |
| 3 | 31.63 | 0 0 2 | $Ga_2O_3$ |
| 4 | 32.95 | 1 1 0 | In |
| 5 | 33.42 | −1 1 1 | $Ga_2O_3$ |
| 6 | 35.13 | 1 1 1 | $Ga_2O_3$ |
| 7 | 37.38 | 4 0 1 | $Ga_2O_3$ |
| 8 | 38.33 | 2 0 −2 | $Ga_2O_3$ |
| 9 | 39.18 | 1 1 0 | In |
| 10 | 42.82 | 3 1 1 | $Ga_2O_3$ |
| 11 | 43.01 | −1 1 2 | $Ga_2O_3$ |
| 12 | 44.67 | −6 0 1 | $Ga_2O_3$ |
| 13 | 45.75 | −3 1 2 | $Ga_2O_3$ |
| 14 | 48.57 | 5 1 0 | $Ga_2O_3$ |
| 15 | 49.51 | −6 0 2 | $Ga_2O_3$ |

Electromechanical Response

Figure 6A:
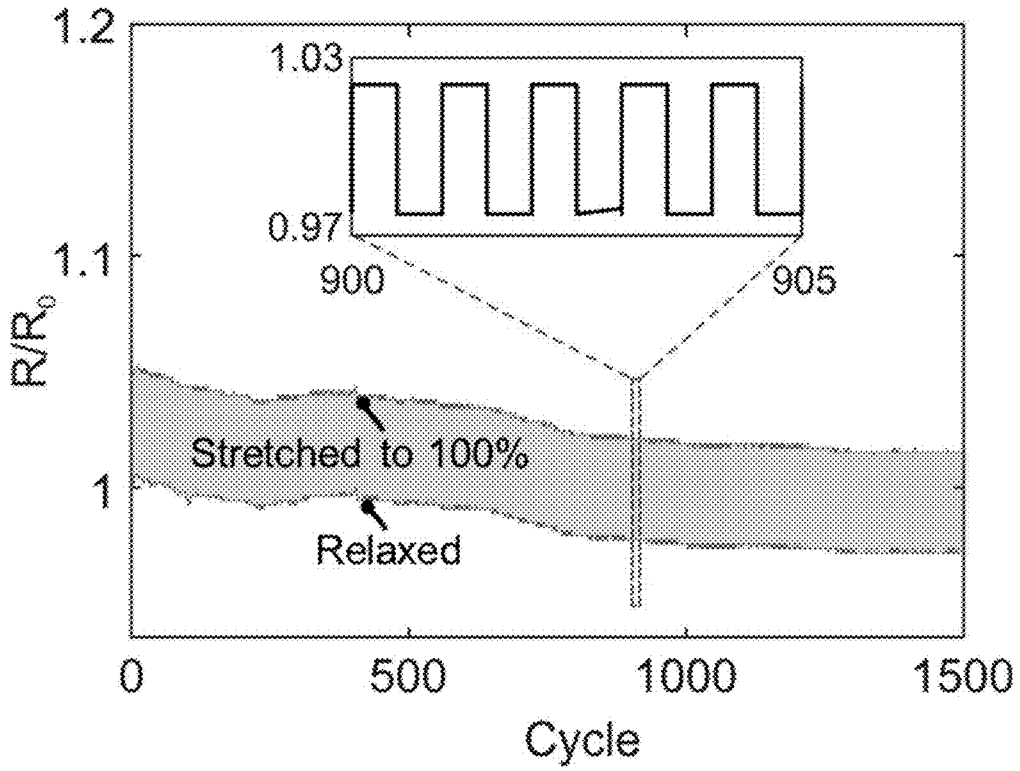
FIG. 6A shows the relative resistance change of the bGaIn traces subjected to uniaxial tensile cyclic loading to 100% on PDMS up to 1500 cycles.
Figure 6B:
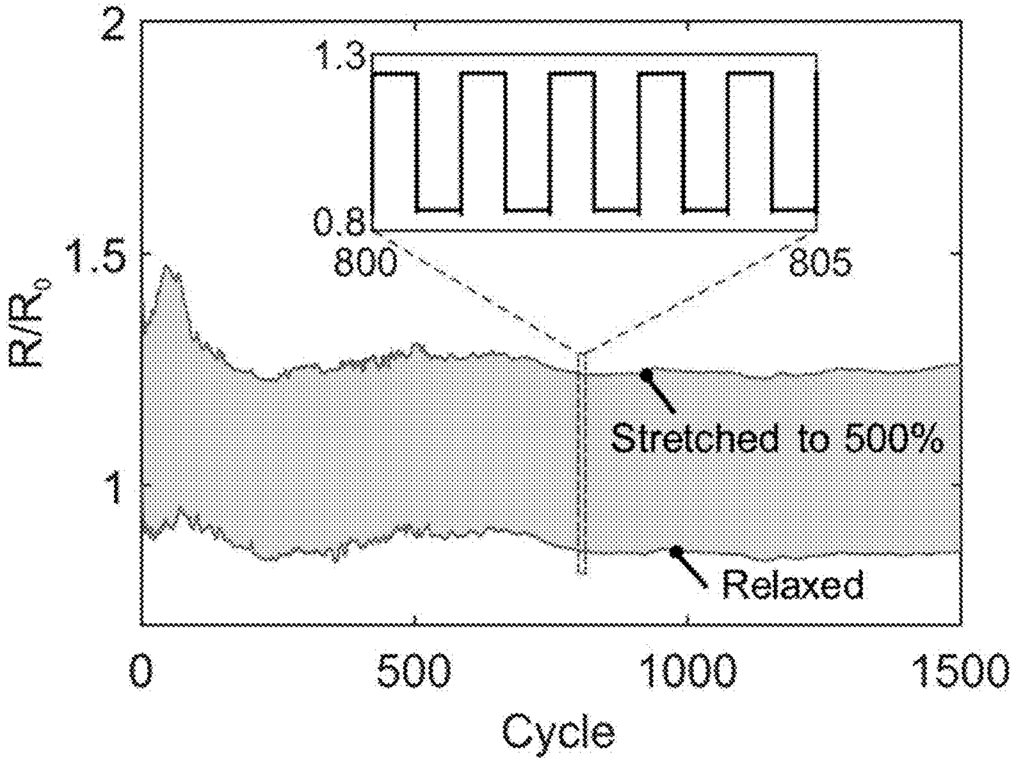
FIG. 6B shows the relative resistance change of the bGaIn traces subjected to uniaxial tensile cyclic loading to 500% on VHB up to 1500 cycles.
Figure 7A:
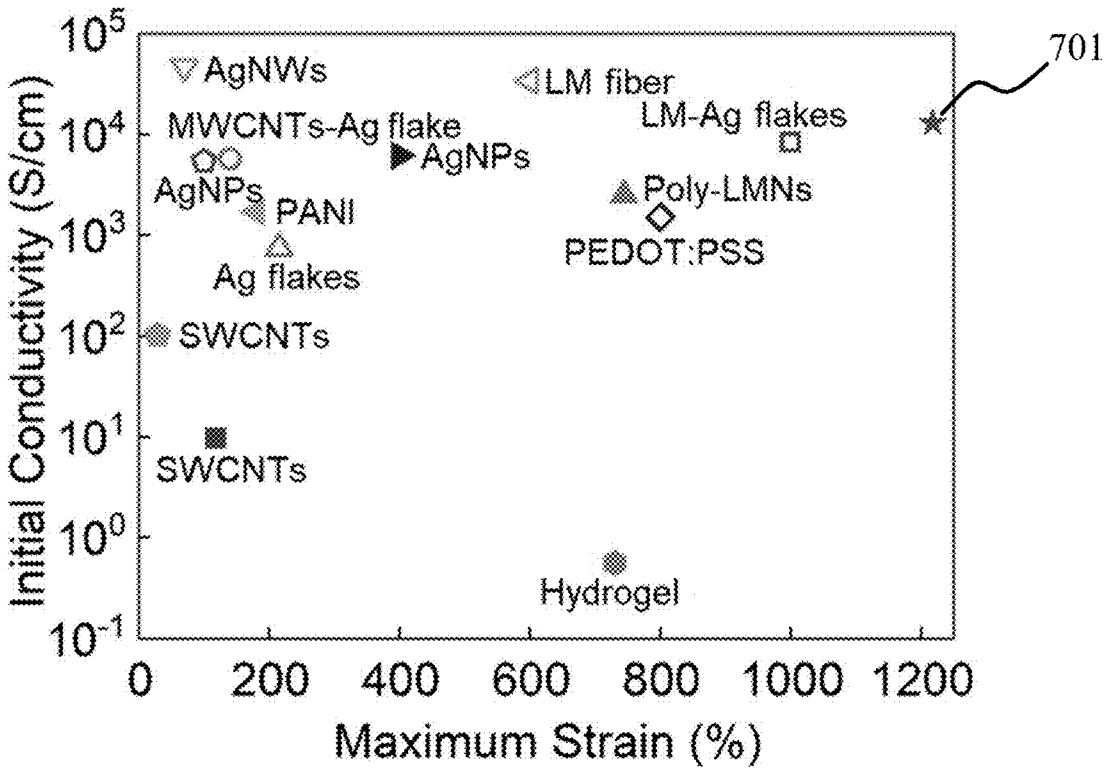
FIG. 7A shows a comparison of initial conductivity (0% strain) and stretchability of bGaIn with other stretchable conductors.
Figure 7B:
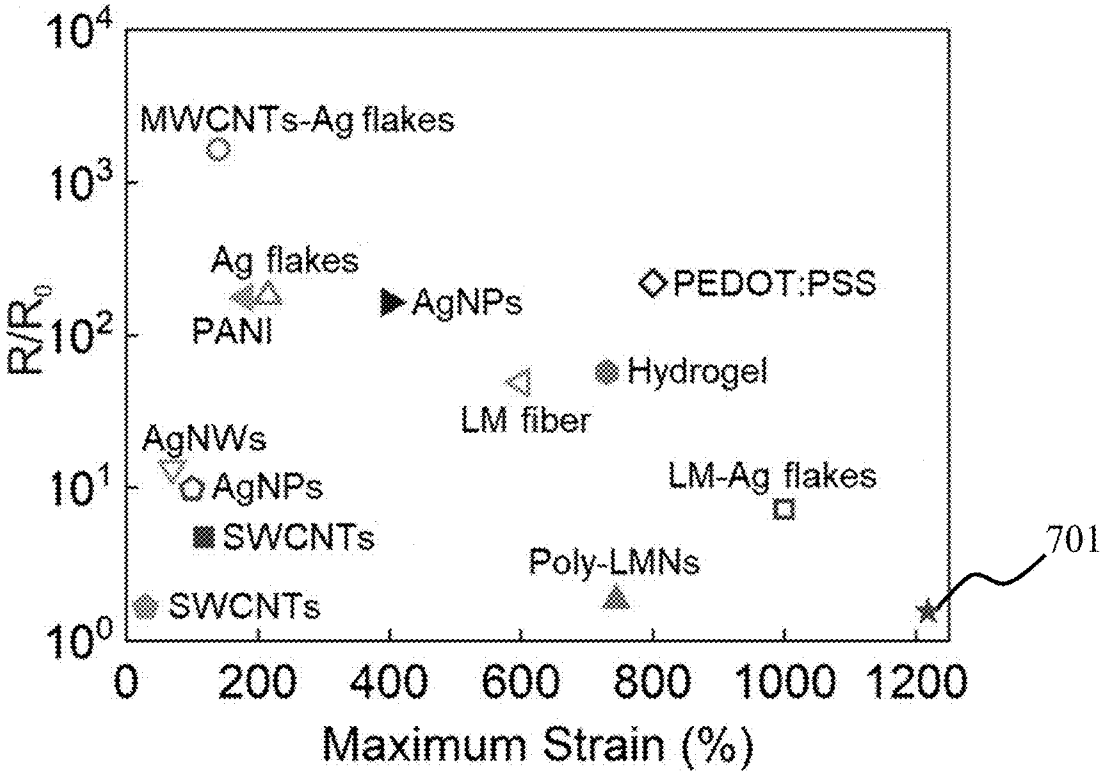
FIG. 7B shows a comparison of relative resistance change at maximum strain of bGaIn with other stretchable conductors.

To establish a baseline of the electromechanical performance of bGaIn, the relative resistance change ($R/R_0$) of bGaIn traces was measured when undergoing uniaxial tensile strain on multiple stretchable substrates. The traces had exceptionally stable electrical performance, experiencing negligible resistance change at both 100% strain on PDMS ($R/R_0$≈1.02, FIG. 5A and 700% strain on VHB ($R/R_0$≈1.34, FIG. 5B). These values are significantly smaller than the theoretical prediction for a classical incompressible, constant-conductivity bulk liquid metal conductor, which exhibits large increases in resistance even at moderate strains ($R/R_0=(1+E)^2$, where E is the applied strain, FIGS. 5A and 5B, black line, $R/R_0=4$ at 100% strain on PDMS, 64 at 700% strain on VHB, experimental validation in FIG. 5D). At strains of over 1000%, the resistance increased only 1.5× (see FIG. 5C) but the strain beyond≈1218%±102 resulted in failure of the VHB substrate rather than the material itself (see FIG. 5E). In one embodiment, bGaIn traces were subjected to cyclic strains of 100% (FIG. 6A) on PDMS and 500% on VHB (FIG. 6B). After moderate settling during the initial cycles, the bGaIn attained stable electromechanical behavior over 1500 loading cycles. In one embodiment, the stable electromechanical behavior is the result of re-arrangement of the solid particles from a random or non-uniform distribution caused by the transferring process into a more uniform distribution induced by stretching. As shown in FIG. 7A and FIG. 7B, compared to existing stretchable conductors, bGaIn (701) has outstanding performance in both its initial conductivity ($2.06\times10^6$ S $m^{-1}$), extreme stretchability (>1000%) and negligible resistance change over strains. In various embodiments the initial conductivity of bGaIn is at least $10^6$ S $m^{-1}$, at least $1.5\times10^6$ S $m^{-1}$, at least $1.7\times10^6$ S $m^{-1}$, at least $1.9\times10^6$ S $m^{-1}$, at least $2\times10^6$ S $m^{-1}$, at least $2.05\times10^6$ S $m^{-1}$, at least $2.1\times10^6$ S $m^{-1}$, at least $2.5\times10^6$ S $m^{-1}$, at least $3\times10^6$ S $m^{-1}$, at least $5\times10^6$ S $m^{-1}$, or $2.06\pm0.29\times10^6$ S $m^{-1}$.

Due to the scattered solid oxide particles being primarily semiconductive $Ga_2O_3$, the initial conductivity of bGaIn ($2.06\times10^6$ S $m^{-1}$) is lower than bulk eGaIn ($3.40\times10^6$ S $m^{-1}$). As bGaIn is stretched, the liquid decreases in thickness and the solid particles emerge from the liquid. As a result, the conductivity of bGaIn increases, compensating for the large increase in resistance over strain expected due to volumetric changes.

Figure 8:
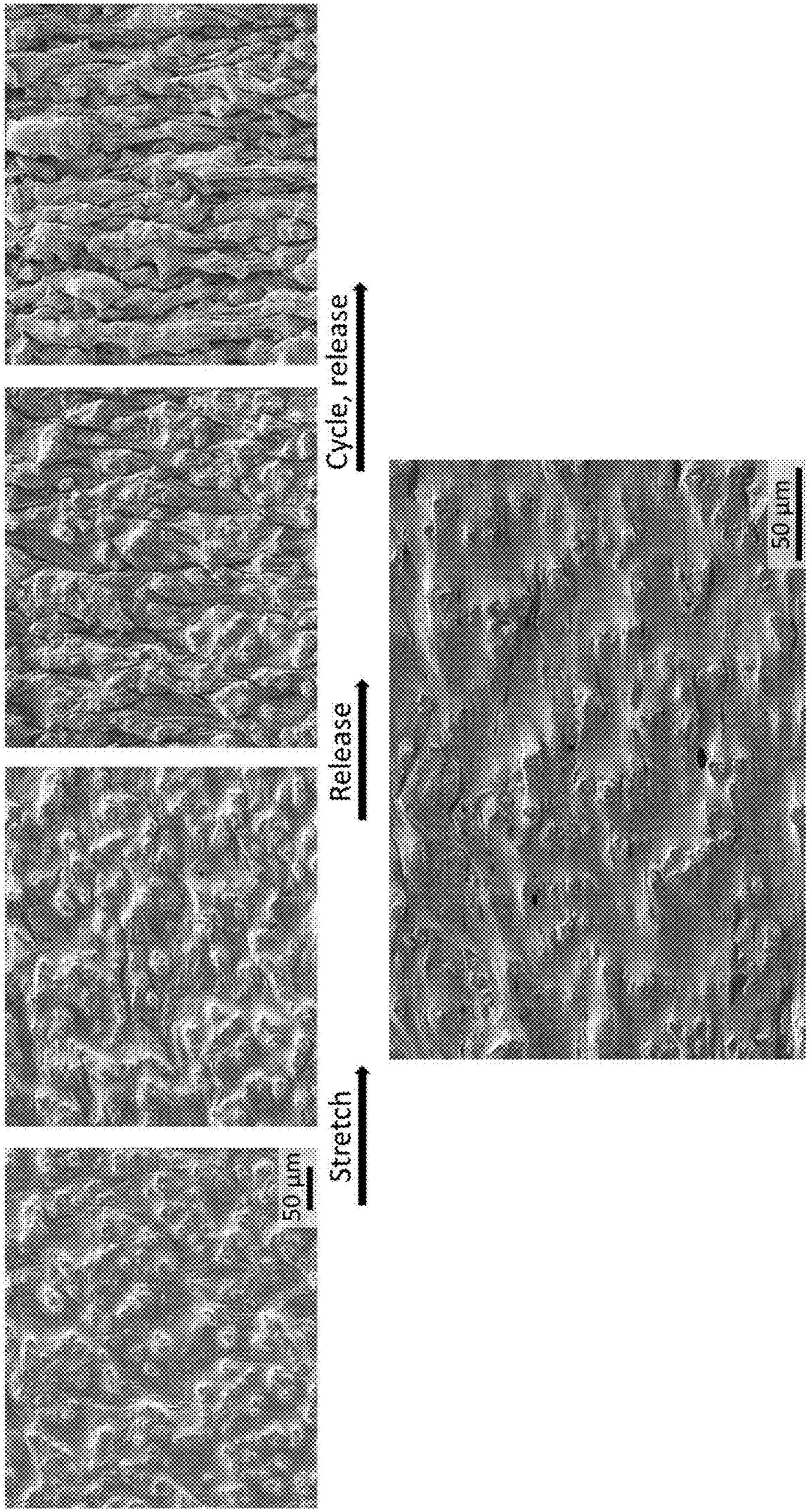
FIG. 8 shows SEM images of bGaIn showing emergence of the solid particles from the liquid, including the microstructure of bGaIn at different stretching states (unstretched, stretched to 30%, released, and released after cyclic loading) and the microstructure of bGaIn under 300% strain.

In more detail, because the solid particles cannot resist shape-change, they begin to emerge from the liquid, as shown in the SEM images in FIG. 8. As a consequence, the volume of the solid particles completely immersed in the liquid decreases over strain, thus increasing the conductivity of bGaIn. When the system is relaxed, the solid particles are resubmerged, returning the film to its original conductivity. To compensate for the large increase in resistance over strain expected due to geometric changes, the conductivity of bGaIn must increase with strain. When bGaIn is stretched on a substrate, the liquid portion of the bGaIn decreases in thickness to compensate for the increase in trace length. The volume of the solid particles completely immersed in the liquid decreases over strain, thus increasing the conductivity of bGaIn. When the system is relaxed, the solid particles are resubmerged, returning the film to its original conductivity. Below is a theoretical model to calculate conductivity of bGaIn as a function of applied strain.

The subscript notation used in the following section is as follows: $\square_b$=biphasic, $\square_s$=solid; $\square_l$=liquid; $\square_0$=initial (unstretched), while absence of $\square_0$ assumes the bGaIn is in any state of finite stretch. The model assumes: the volume of bGaIn ($V_b$) is not constant; bGaIn comprises two phases: liquid and solid ($V_b=V_l+V_s$); volume of liquid, $V_l$, is constant; The surface oxide layer of the liquid component of bGaIn is neglected, since the oxide layer is very thin and passivating (~1-3 nm thick in ambient environment), it does not have a significant impact on the conductivity of the underlying bulk material; The effect of Poisson's ratio on the width and thickness variations of bGaIn films over large strains is neglected, as most stretchable materials are nearly incompressible with a Poisson's ratio4 of approximately 0.5; The capillary forces at the interfaces between the solid particles and the liquid are neglected, since the separation distance between two adjacent particles increases over strains, the capillary force decreases significantly, as indicated by the small meniscus profiles between the solid particles at 300% strain (see FIG. 8).

Before stretching, the initial resistance of bGaIn, $$R_b^0,$$

is calculated by Ohm's law:

$$R_b^0 = \rho_b^0 \frac{(L_b^0)^2}{V_b^0} \quad \text{Equation 1}$$

where $$\rho_b^0,$$

$$L_b^0$$

and $$V_b^0$$

are the resistivity, length, and volume of unstretched bGaIn, respectively. Similarly, the resistance of bGaIn during stretching is:

$$R_b = \rho_b \frac{(L_b)^2}{V_b} \quad \text{Equation 2}$$

Therefore, the resistance change of bGaIn during stretching is:

$$\frac{R_b}{R_b^0} = \frac{\rho_b/V_b}{\rho_b^0/V_b^0}\left(\frac{L_b}{L_b^0}\right)^2 = \frac{f(V_s)}{f(V_s^0)}(1+\epsilon)^2 \quad \text{Equation 3}$$

where $\epsilon$ is the applied strain, and $f(V_s)$ and $$f(V_s^0)$$

are unknown functions of $V_s$ and $$V_s^0,$$

respectively. Below, the expressions for each f(V) are derived. Based on the rule of mixtures, the resistivity of bGaIn, $\rho_b$, is:

$$\rho_b = \frac{V_s}{V_s+V_l}\rho_s + \left(1 - \frac{V_s}{V_s+V_l}\right)\rho_l \quad \text{Equation 4}$$

Therefore, $$f(V_s^0)$$

is:

$$f(V_s^0) = \frac{\rho_b^0}{V_b^0} = \frac{\frac{V_s^0}{V_s^0+V_l}\rho_s + \left(1 - \frac{V_s^0}{V_s^0+V_l}\right)\rho_l}{V_s^0+V_l} = \frac{V_s^0\rho_s + V_l\rho_l}{(V_s^0+V_l)^2} = \left[\frac{\rho_s + \frac{V_l}{V_s^0}\rho_l}{\left(1+\frac{V_l}{V_s^0}\right)^2}\right]\frac{1}{V_s^0} = \frac{\rho_s + \gamma^0\rho_l}{(1+\gamma^0)^2}\frac{1}{V_s^0} \quad \text{Equation 5}$$

when $$\gamma^0 = \frac{V_l}{V_s^0}$$

is the initial volume fraction of liquid in the bGaIn. Similarly, $f(V_s)$ is a function of the volume fraction of liquid, $\gamma$, during stretching:

$$f(V_s) = \frac{\rho_s + \gamma\rho_l}{(1+\gamma)^2}\frac{1}{V_s} \quad \text{Equation 6}$$

Taking the ratio of Equation 6 to Equation 5 yields:

$$\frac{f(V_s)}{f(V_s^0)} = \frac{V_s^0}{V_s}\left(\frac{\rho_s + \gamma\rho_l}{\rho_s + \gamma^0\rho_l}\right)\frac{(1+\gamma^0)^2}{(1+\gamma)^2} \quad \text{Equation 7}$$

Because the resistivity of solid oxide particles is significantly larger than liquid ($\rho_s >> \rho_l$), Equation 7 can be simplified as:

$$\frac{f(V_s)}{f(V_s^0)} \approx \frac{V_s^0}{V_s}\frac{(1+\gamma^0)^2}{(1+\gamma)^2} = \frac{V_s^0}{V_s}\left(\frac{1+\frac{V_l}{V_s^0}}{1+\frac{V_l}{V_s}}\right)^2 = \frac{V_s^0}{V_s}\left(\frac{\frac{V_s^0}{V_l}+1}{\frac{V_s^0}{V_l}+\frac{V_s^0}{V_s}}\right)^2 = \frac{C_1\frac{V_s}{V_s^0}}{\left(C_2\frac{V_s}{V_s^0}+1\right)^2} \quad \text{Equation 8}$$

where $$C_1 = \left(\frac{V_s^0}{V_l}+1\right)^2,\ C_2 = \frac{V_s^0}{V_l}.$$

Combining Equation 8 with Equation 3 and simplifying yields:

$$\frac{C_1\frac{V_s}{V_s^0}}{\left(C_2\frac{V_s}{V_s^0}+1\right)^2} = \frac{R_b}{R_b^0}/(1+\epsilon)^2 \quad \text{Equation 9}$$

Using Equation 9, the change in volume of the solid particles that remain in liquid, $$V_s/V_s^0,$$

can be predicted as a nonlinear function of strain, ε.

Based on the rule of mixtures, the conductivity of bGaIn, $$\frac{1}{\rho_b},$$

is:

$$\frac{1}{\rho_b} = \frac{V_s}{V_s+V_l}\frac{1}{\rho_s} + \left(1-\frac{V_s}{V_s+V_l}\right)\frac{1}{\rho_l} \quad \text{Equation 10}$$

when $$\frac{1}{\rho_s} \text{ and } \frac{1}{\rho_l}$$

are the conductivity of solid particles and liquid, respectively.

Inserting $$V_s/V_s^0$$

and $$C_2 = \frac{V_s^0}{V_l}$$

into equation (10) and rearranging yields:

$$\frac{1}{\rho_b} = \frac{1}{1+\frac{1}{C_2\frac{V_s}{V_s^0}}}\frac{1}{\rho_s} + \left(1-\frac{1}{1+\frac{1}{C_2\frac{V_s}{V_s^0}}}\right)\frac{1}{\rho_l} \quad \text{Equation 11}$$

where plugging $$V_s/V_s^0$$

as a function of strain into equation (11), the conductivity of bGaIn can be predicted as a nonlinear function of strain.

Figure 5A:
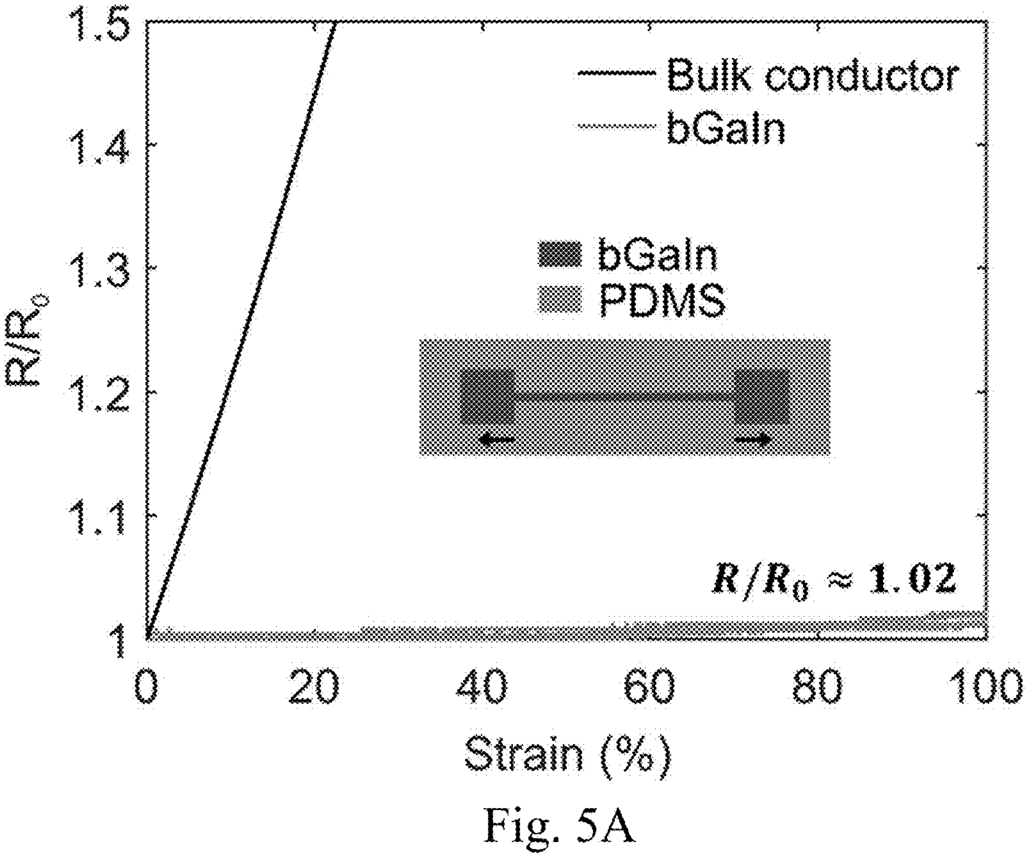
FIG. 5A shows the relative change in resistance as a function of uniaxial tensile strain of the bGaIn traces on PDMS ($R/R_0 \approx 1.02 \pm 0.004$, 5 samples) and theoretical prediction based on bulk conductor assumptions.
Figure 5B:
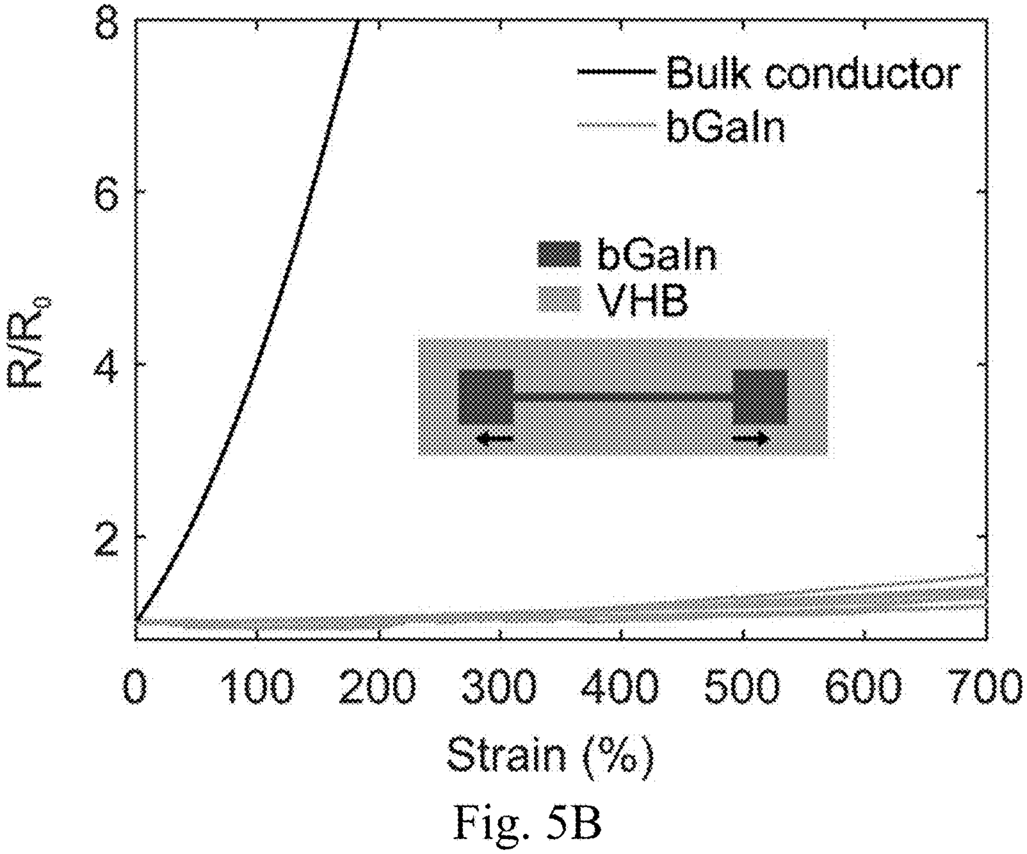
FIG. 5B shows the relative change in resistance as a function of uniaxial tensile strain of the bGaIn traces on VHB ($R/R_0 \approx 1.34 \pm 0.13$, 5 samples), and theoretical prediction based on bulk conductor assumptions.
Figure 5C:
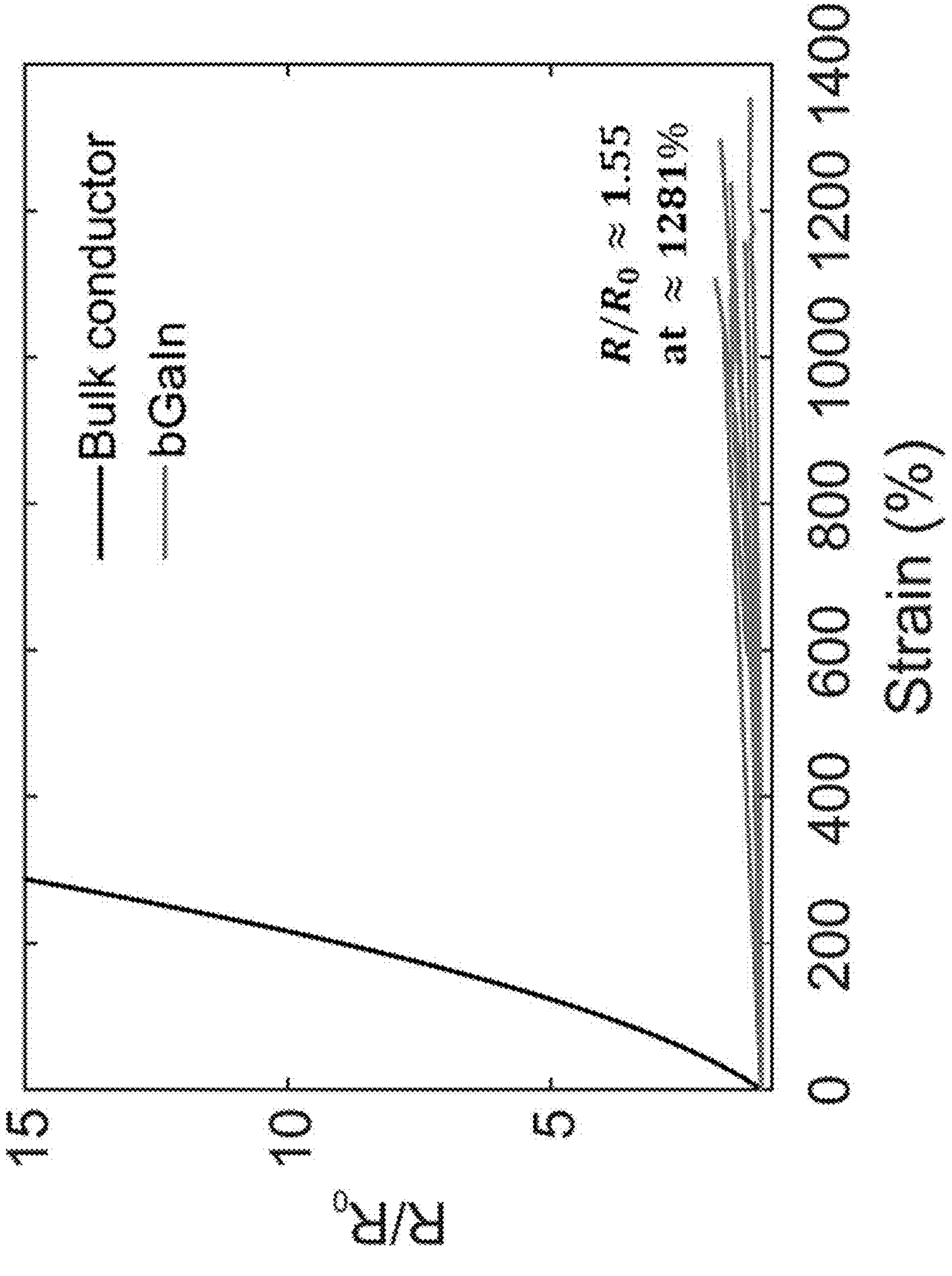
FIG. 5C shows the relative change in resistance as a function of uniaxial tensile strain of bGaIn circuits on VHB (blue, $R/R_0 \approx 1.55 \pm 0.24$, 6 samples), and theoretical prediction based on bulk conductor assumptions.
Figure 5D:
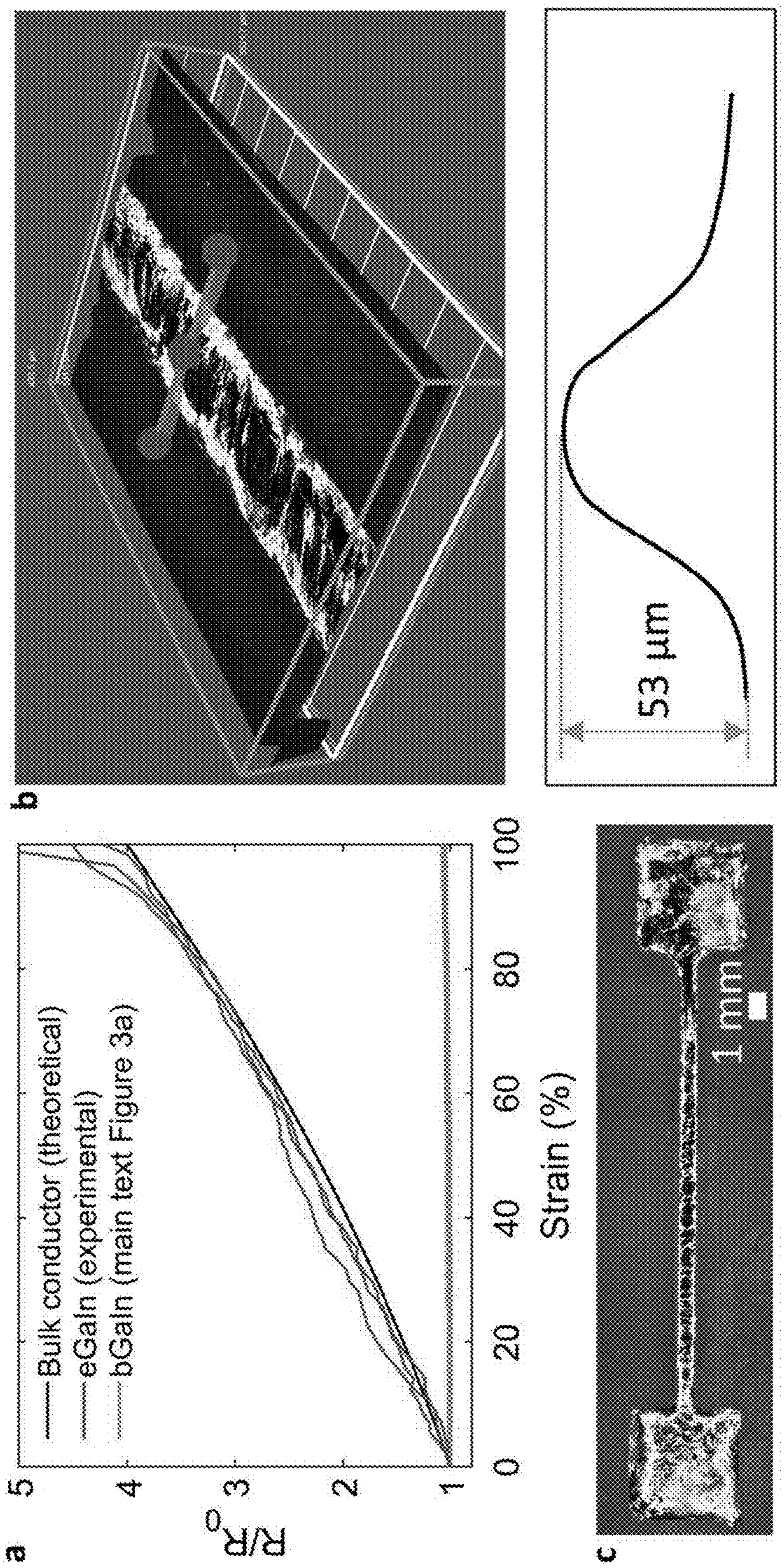
FIG. 5D shows experimental validation of bulk conductor assumptions based on Pouillet's law: R/R0=(1+ε)1+2v. (a) The eGaIn traces show significantly larger resistance changes than bGaIn and are close to the theoretical prediction (3 samples). (b-c) Due to the high surface tension of eGaIn, the cross-sectional profile of the patterned eGaIn trace exhibits a curvature and the peak height is around 53 μm.
Figure 5E:
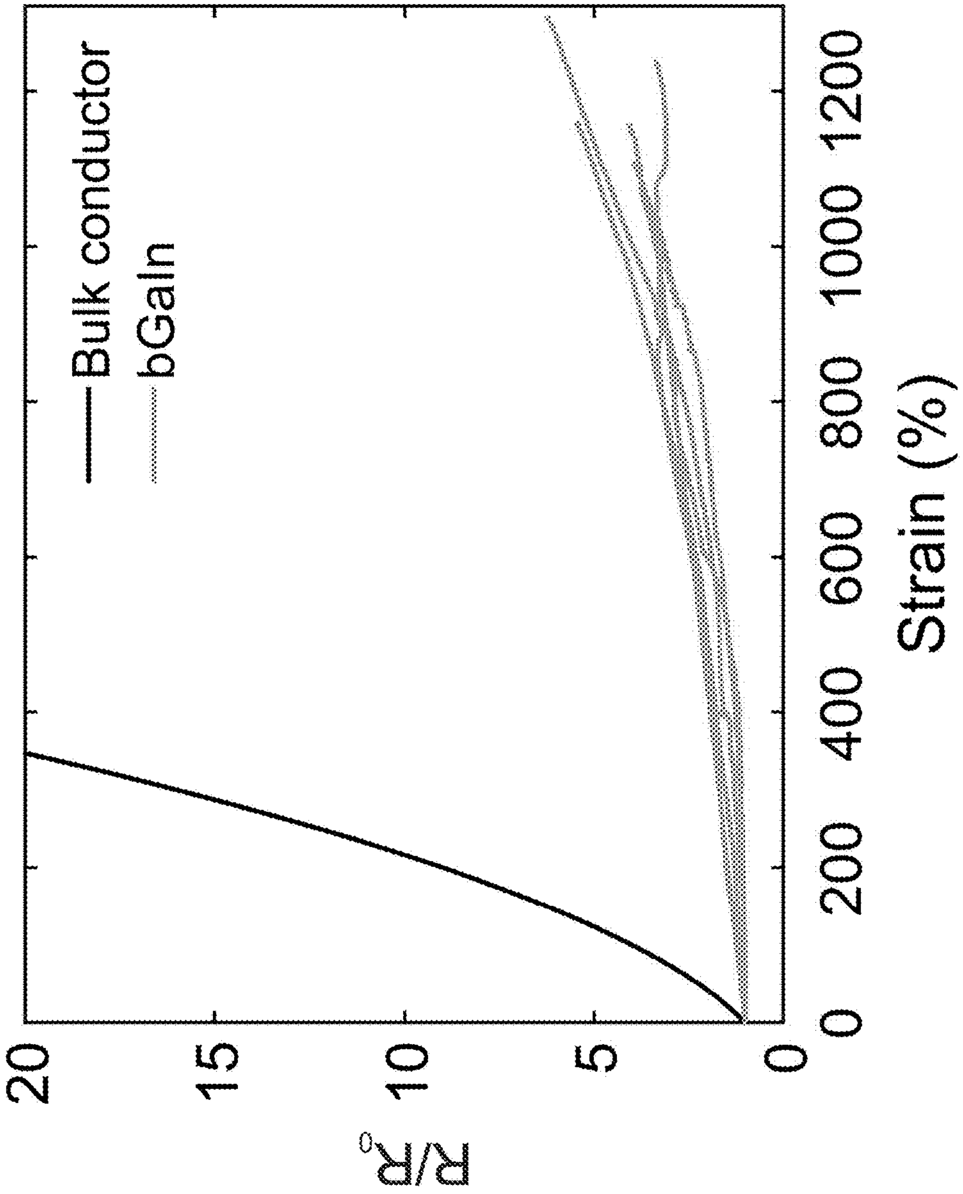
FIG. 5E shows electromechanical characteristics of bGaIn. Relative change in resistance as a function of uniaxial tensile strain of the bGaIn circuits on VHB (pink, R/R0≈4.61±1.19, 5 samples), and theoretical prediction based on bulk conductor assumptions (black). The strain beyond 1191%±75 resulted in failure of the VHB substrate rather than the material itself.
Figure 9A:
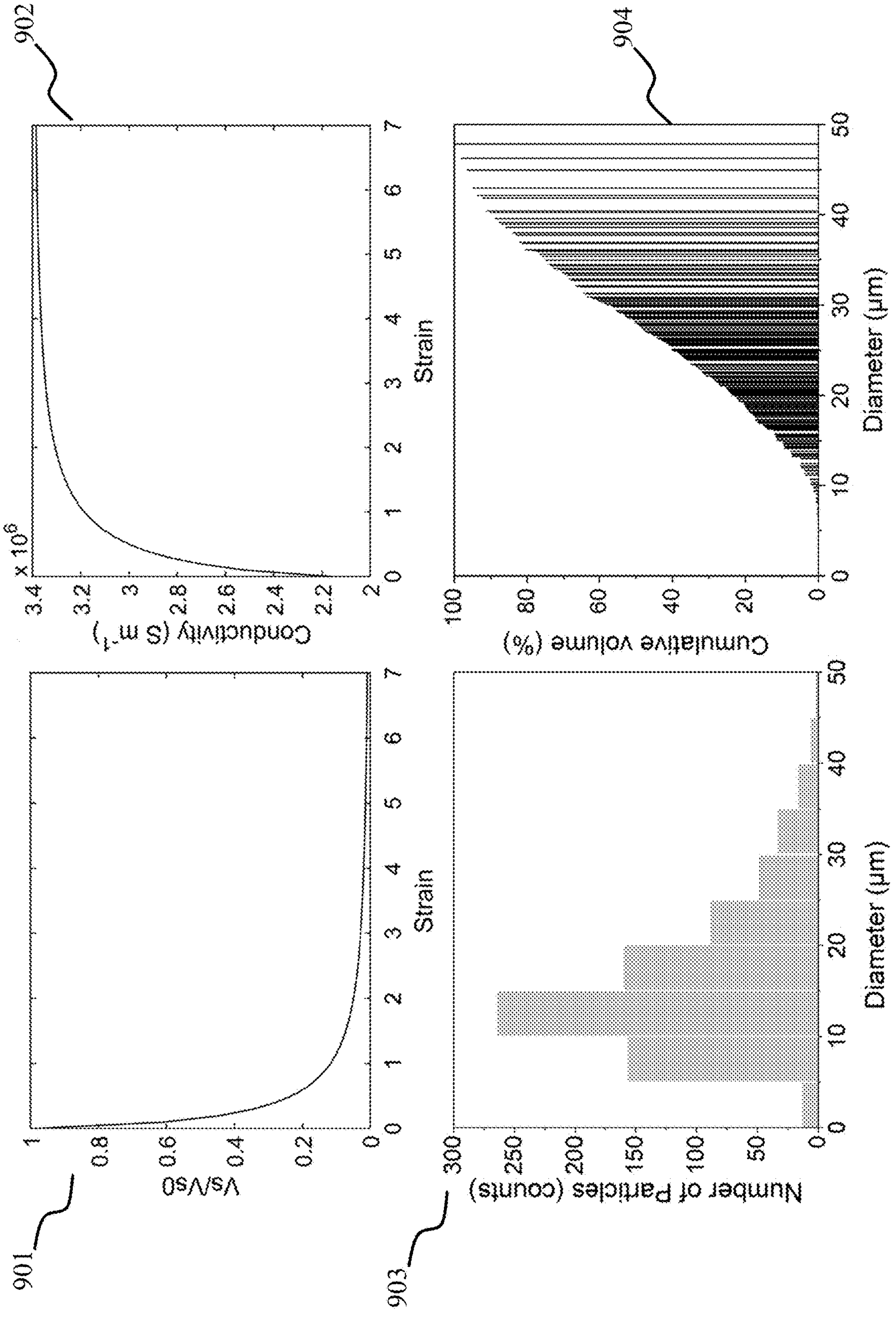
FIG. 9A shows graphs related to the theoretical modeling of the electromechanical response of bGaIn, including the change in volume of the solid particles that remain in liquid as a function of strain, the conductivity of bGaIn as a function of strain, and a histogram showing distributions of the measured solid particle sizes and cumulative volume estimated from SEM images.

In graph 901 of FIG. 9A, $$V_s/V_s^0$$

is predicted using the change in resistance over strain $$R_b/R_b^0$$

as obtained from the experimental data (FIG. 5A). The initial volume fraction of solid particles, $$V_s^0/V_l$$

was estimated from SEM images (FIG. 3A), and used to determine $C_1$ and $C_2$. Assuming a single layer of solid spherical particles in the liquid, $$V_s^0$$

was calculated by measuring the diameters of the particles and adding the corresponding volumes together. Histograms showing distributions of the measured solid particle sizes and the cumulative volume are shown in graphs 903 and

904. $V_l$ was calculated based on the assumption that the thickness of the liquid equals the median of the measured particle diameters. The ratio $$V_s^0/V_l$$

was calculated to be 0.57. Finally, using the extracted $$V_s/V_s^0$$

curve in conjunction with the measured $$V_s^0$$

and $V_l$, Equation 4 can be used to estimate the conductivity of bGaIn as a function of strain, as shown in graph 902. According to the model results, bGaIn conductivity changes rapidly at low strains, as the large-diameter, high-volume particles emerge, and then more slowly at higher strains, as progressively smaller particles are pushed out of the liquid.

Figure 9B:
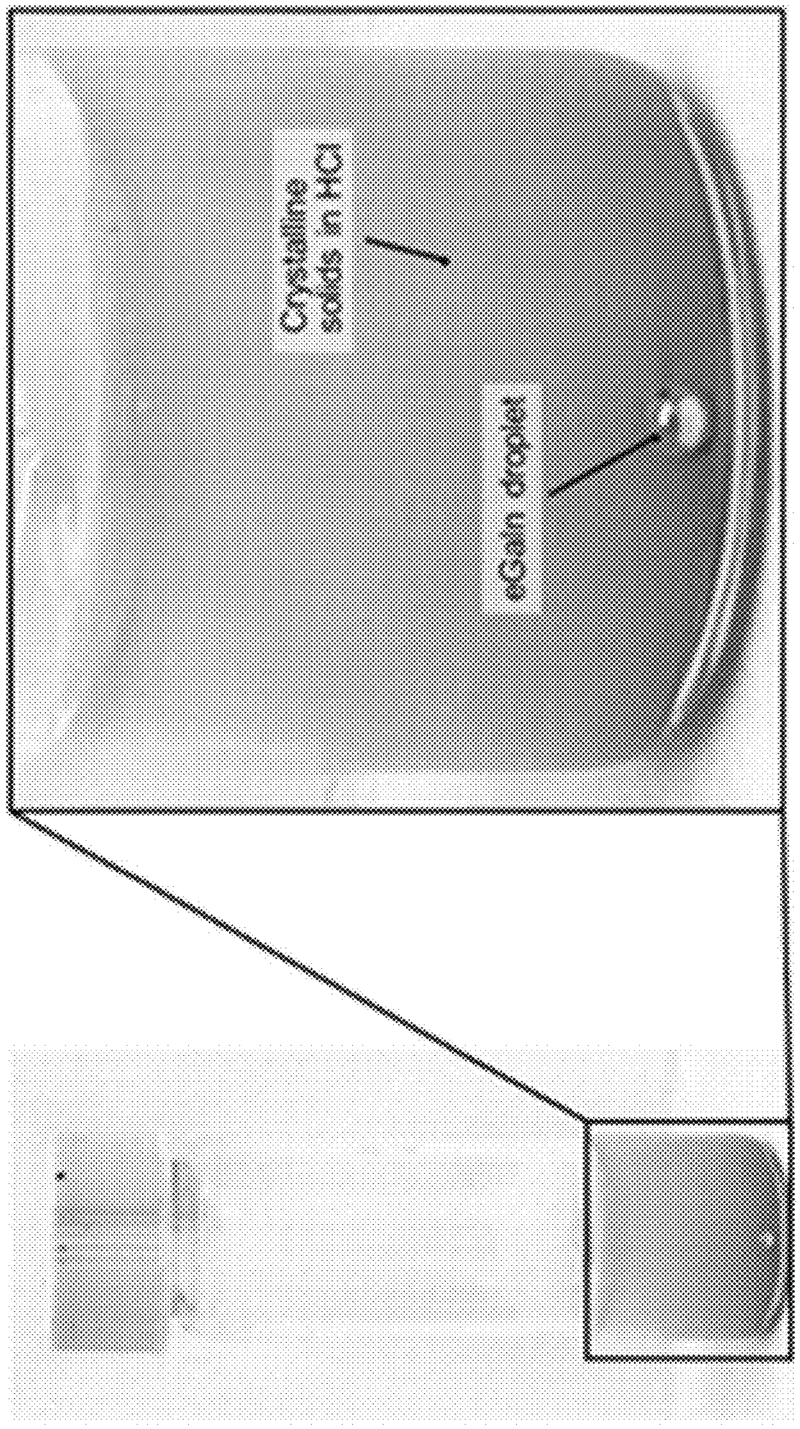
FIG. 9B shows a photo showing separated crystalline solid and liquid components of bGaIn in HCl.

To further verify this method of estimating $$V_s^0/V_l,$$

a second method was utilized. The solid and liquid parts of bGaIn by were separated by adding 1 M hydrochloride acid (HCl) solution to a vial of bGaIn and shaking for 2 min. Since amorphous gallium oxide (corresponding to oxide formed at room temperature on the surface of liquid GaIn) easily dissolves in HCl9, and crystalline β-Ga2O3 (the thermally treated β-Ga2O3 solid flakes that make up Vs) is chemically stable against attack by HCl at room temperature, this procedure separated the bGaIn into a liquid eGaIn droplet and crystalline β-Ga2O3 solids suspended in HCl (FIG. 9A and FIG. 9B). The vial was then frozen at −60° C. for 1 min and the solidified eGaIn sphere was removed to measure its mass. This provided a mass value of 0.555, averaged from two samples. (See FIG. 9C). This is close to the value obtained from the simpler SEM-based estimation method.

Figure 9D:
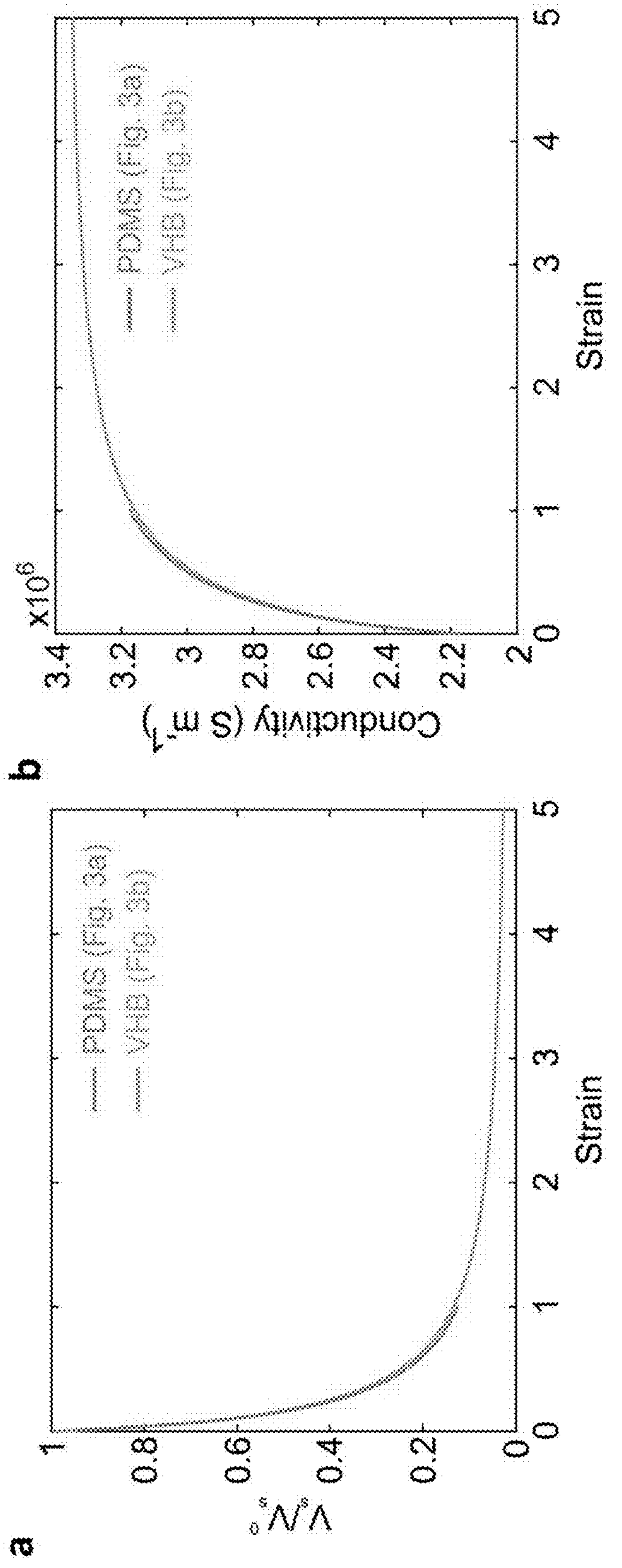
FIG. 9D shows theoretical modelling of the electromechanical response of bGaIn. (a-b) The change in volume of the solid particles that remain in liquid $$V_s/V_s^0$$

With an estimate of $$V_s^0/V_l$$

and thus values for $C_1$ and $C_2$, the measured change in resistance over strain for bGaIn can be used to find the relationship between $$V_s/V_s^0$$

and strain.

$$V_s(\epsilon)/V_s^0$$

for bGaIn traces on both PDMS and VHB substrates is shown in FIG. 9D.

Plugging the estimated $$V_s/V_s^0$$

and $C_2$ into equation 11, the conductivity of bGaIn as a function of strain can be estimated (FIG. 9D). The results suggest that bGaIn conductivity changes rapidly at low strains, as the large-diameter, high-volume particles emerge, and then slower at higher strains, as progressively smaller particles are pushed out of the liquid. Noting that the near-identical relationship between bGaIn conductivity and strain on different substrates, this relationship is not dependent on substrate material provided sufficient bGaIn-substrate adhesion.

The unique electromechanical behavior of bGaIn also relies upon the wettability of the liquid metal to the solid oxide particles. One conventional approach to make biphasic material is to physically mix eGaIn with dissimilar metallic particles, which often leads to separation of the liquid from the solid particles under strain (see e.g. Wu, Yun-hui, et al. "A Novel Strategy for Preparing Stretchable and Reliable Biphasic Liquid Metal." Advanced Functional Materials 29.36 (2019): 1903840, incorporated herein by reference). In the disclosed material, the thermal sintering process generates solid particles from within the liquid metal, allowing the liquid to wet the solid particles and encouraging it to percolate through their interstices, as shown in FIG. 10A and FIG. 10B.

This superior wettability reduces separation between solid and liquid in the biphasic material, and therefore promotes continuous, high conductivity. The solid particles adhere to the substrate throughout stretching, while maintaining adhesion to the liquid metal and preventing the formation of electrically isolated liquid droplets, as shown in FIG. 10C. FIG. 10C depicts SEM images of the cross-section of bGaIn films at different stretching states: unstretched (1001, 1002), stretched (1003) and released (1004). In one embodiment, the solid side of the bGaIn film breaks into flakes when stretched, while the biphasic portion fills in the cracks, maintaining connection between the solid particles, which allows the bGaIn film to remain thin and continuous on the substrate during stretching.

Integration with Rigid Electronic Components

BGaIn as disclosed herein may also be configured to create robust electrical connections with rigid electronics. Reliably interfacing liquid metal with rigid electronics is challenging, and the few existing examples of liquid metal-based SCBAs require cumbersome fabrication processes, not compatible with current scalable manufacturing methods. In the present disclosure, bGaIn is employed as a stretchable interconnect to achieve reliable interfaces with rigid electronic components. First, the transmission line method was used to measure the contact resistance between bGaIn and (equivalently) zero-ohm resistance tinned copper contacts (see G. K. Reeves and H. B. Harrison, "Obtaining the specific contact resistance from transmission line model measurements." *IEEE Electron Device Letters,* 3(5):111-113, 1982, incorporated herein by reference). By varying the length of the bGaIn traces (the space between adjacent tinned copper contacts), measuring the total resistance between bars, and fitting a line to the data (see FIG. 11A, $R^2$ fit value=0.9986), the contact resistance (half of the y-intercept) was calculated to be 0.06Ω, an order of magnitude lower than other liquid metal-based contacts.

The transmission line method was used to measure the contact resistance between bGaIn and rigid electronic components. The resistance (R) between an electronic component on a bGaIn trace is composed of the resistance of the trace ($R_t$), the resistance of the component $R_0$ and the resistance at the two contact points between bGaIn and the resistor ($R_C$), is described by:

$$R=2R_C+R_0+R_t \quad \text{Equation 12}$$

The resistance of the trace can be expanded as an element of the resistivity p of bGaIn, and the geometry of the trace:

$$R_t=\rho\frac{L}{WT} \quad \text{Equation 13}$$

where L, W, and T are the length, width, and thickness of the bGaIn trace. Placing an array of tinned copper contacts with various spacings onto the bGaIn trace, $R_0 \approx 0$, and the equation (12) simplifies to:

$$\begin{aligned} R &\approx 2R_C+R_t \\ &= 2R_C+\rho\frac{L}{WT} \\ &= 2R_C+L*k \end{aligned} \quad \text{Equation 14}$$

where $$k=\frac{\rho}{WT}.$$

The resistance across the tinned copper contacts was measured with different spacings, and a line was fit to the data (FIG. 11*a*, $R^2$ fit value=0.9986). RC was calculated as half of the y-intercept, or 0.06Ω, an order of magnitude lower than other liquid metal-based contacts.

After measuring the contact resistance, a zero-ohm surface mount resistor was interfaced to a bGaIn trace on various stretchable substrates, and the resistance change was measured during strain. At 100% strain on PDMS (FIG. 11B) the $R/R_0$ was approximately 1.18, and at 700% strain on VHB (FIG. 11C) the relative resistance was approximately 3.44. When pressing an electrical component onto patterned bGaIn traces, the bGaIn flows and encompasses the rigid pins, increasing contact area and reducing the contact resistance. The solid particles aid in securing the liquid to the rigid pin due to their natural inextensibility, their propensity to adhere to solid surfaces, and the strong wettability to them by the liquid (see FIG. 11D, FIG. 11E), resulting in stable electrical connections during and after stretching. This electromechanical sensitivity to strain is low compared to the prediction based on bulk conductor assumptions and other liquid metal-based interfacing approaches (see FIG. 11F).

Additional tests show that the bGaIn traces with embedded zero-ohm resistor subjected to a repetitive strain of 100% (FIG. 11G) on PDMS and 500% on VHB (FIG. 11H) remained functional over 1500 loading cycles. Additional strain tests on bGaIn traces with and without embedded zero-ohm resistors on both PDMS and VHB substrates verified their stable performance at various strain rates (150 mm mint 225 mm $min^{-1}$ and 300 mm $min^{-1}$) for 1,000 loading cycles (FIG. 11J). Further, traces aged for over six months in standard laboratory conditions (23° C. and 50% humidity) exhibited no evidence of long-term electromechanical degradation (FIG. 11K).

As seen in FIG. 19, additional trace and interface data show that various solid to liquid ratios in bGaIn at 20, 30, 40, 50, and 60 wt % exhibit that by varying the wt % of solid particles in the liquid metal, the rheology can change (as shown in FIG. 18), while FIG. 19 shows that the relative resistance at strain stays below the values exhibited by a bulk conductor (for example, R/R0=16 at 400% strain).

As seen in FIG. 20, additional trace data of R/R0 vs strain of a liquid metal nanoparticle film exhibit lower normalized resistivity compared to theoretical bulk conductor assumptions based on Pouillet's law when strained to 400%. Further, trace data of R (Ohms) vs strain for five samples of liquid metal nanoparticle films and theoretical bulk conductor assumptions based on Pouillet's law show that this process is repeatable across multiple specimens.

Printable Patterns and Stretchable VIAs

Patterning thin films of bulk eGaIn is challenging since high surface tension causes the liquid metal to bead up and deviate from the desired deposition pattern. By contrast, the solid particles in bGaIn spread evenly over the printed area, and strong wetting between the liquid metal and the crystalline particles stabilize the liquid, preventing unwanted beading. This mechanical stability helps bGaIn to work well with a variety of trace manufacturing processes. In one embodiment, bGaIn may be transfer printed by simply pressing a silicon wafer, on which bGaIn was made, onto a masked, stretchable substrate. In one embodiment, bGaIn may be configured as a conductive, printable paste by scraping bGaIn off a silicon wafer and mechanically mixing the top oxide into the biphasic portion. Paste prepared in this way may be used for example to stencil-print or hand-write stretchable patterns on a variety of substrates, including VHB tape (FIG. 14AAa), paper (FIG. 14AAb), high-porosity foam (FIG. 14AAc), rubber, tapes, for example scotch tape, silicone, polyimide, fabric, for example cotton or polyester fabric, spandex, latex (FIG. 14AAd), or skin, for example human skin. In some embodiments, printed bGaIn films may have a thickness of less than 100 μm, less than 60 μm, less than 50 μm, less than 40 μm, less than 20 μm, or less than 10 μm.

In one embodiment, where a laser-cut mask is used to deposit the layer or layers of bGaIn films, layers of bGaIn may have a print resolution roughly equal to the resolution of the laser cutter forming the mask. In one embodiment, the bGaIn film has a print resolution of about 25 μm. In other embodiments, a bGaIn ink may be configured to be deposited via high resolution extrusion-based printing. In one embodiment, high-resolution extrusion-based printing of bGaIn may be used to deposit bGaIn patterns to form soft and stretchable microcontrollers.

In one embodiment, bGaIn may be deposited by drawing the material on a substrate without a mask. In another embodiment, bGaIn may be deposited by printing, for example inkjet, spray, or other printing methods.

Stretchable Circuit Board Assemblies

In one aspect, the present disclosure includes methods for making stretchable circuit board assemblies (SCBAs). In one embodiment, an SCBA incorporating bGaIn may be fabricated by transfer-printing bGaIn onto a stretchable substrate, for example a VHB or silicone substrate, with a patterned mask. A suitable mask may be created by laser cutting liners, for example comprising sticker papers, cutting using a method for example with a UV laser micromachining system. Any other suitable precision cutting mechanism may be used. One side of a liner is then placed onto the substrate and peeled off after patterning.

Electrical leads may be provided using, for example, tinned copper wires which may in some embodiments be flattened using a roller mill and pressed onto bGaIn contact pads. Electrical leads may be configured, for example, to connect one or more of the bGaIn contact pads to an external electrical system. The substrates may in some embodiments be reinforced, for example with a reinforcing element positioned on the side of the substrate opposite the bGaIn traces. Exemplary reinforcing elements include, but are not limited to, double-sided tape and inextensible fabrics. Electrical wires may then be soldered to the flattened wires for external connections.

Electrical components, for example integrated circuits, passive components (resistors, capacitors, etc.) or any other circuit element suitable for attachment to a non-stretchable circuit board, may be secured to contact pads on an SCBA for example by pressing the component into the pads for a predetermined duration to encourage adhesion. In one embodiment, the electrical component may be pressed into one or more pads for between 10 seconds and 10 minutes, or between 30 seconds and 8 minutes, or between one minute and five minutes, or between two minutes and four minutes, at least two minutes, at least three minutes, or about three minutes. In some embodiments, electrical components or the contact pads may be heated to encourage adhesion. In some embodiments, electrical components may be pressed into position when the elastomer layer into which they are being pressed has not yet cured completely, in order to encourage adhesion. In some embodiments, rigid contact pads may be embedded in the SCBA and physically attached to one or more bGaIn traces, and one or more electrical components may be secured to the one or more rigid contact pads for example by reflow soldering or conventional soldering techniques.

In some embodiments, patterned bGaIn may be used to form one or more electrodes, for example the electrodes of a capacitive sensor. This may be accomplished in one embodiment by patterning two bGaIn features on opposite sides of a flexible layer.

In some embodiments, multi-layer SCBAs may be fabricated by various methods. In one embodiment, and with reference to FIG. 13A and FIG. 13B, a multilayer SCBA is fabricated by rod-coating a layer of an elastomer, for example VHB or PDMS, onto a flat manufacturing surface, or onto a substrate, for example a stretchable substrate 1301. In one embodiment, the substrate or manufacturing surface comprises PET. Once the elastomer is cured, bGaIn is transfer-printed onto it to create a first layer of traces or bottom circuit 1302. Next, another layer of elastomer 1303, which may be the same or different material as the first layer of elastomer, is rod-coated over the bottom circuit layer 1302. After curing, a top layer of bGaIn 1305 is printed. Once the top layer patterning is complete, VIAs 1304 may be created to create electrical connections between the two layers of bGaIn 1302 and 1305 by cutting cavities, for example with an IR laser, and filling the cavities with bGaIn. Electrical components, for example integrated circuits 1310, passive components 1307, 1308, 1309 (resistors, capacitors, etc.) or any other circuit element suitable for attachment to a non-stretchable circuit board may then be attached using the methods discussed above, and/or may be bonded to the elastomer layer using an adhesive, for example a silicone adhesive. Finally, in some embodiments, the circuit may be encapsulated by rod-coating another layer of elastomer 1306 over the top circuit layer and the electrical components.

In another embodiment, multiple layers of GaIn nanoparticles cam deposited on a substrate. In one embodiment, a first portion of a GaIn film is transferred to a first surface of a stretchable substrate to form at least one first GaIn trace, and a second portion of a GaIn film is transferred to a second surface of a stretchable substrate to form at least one second GaIn trace. In some embodiments, the second surface is opposite the first surface. In one embodiment, a via connects the first trace to the second trace, where the via extends through the substrate.

Uses of Stretchable Circuit Board Assemblies

Figure 23A:
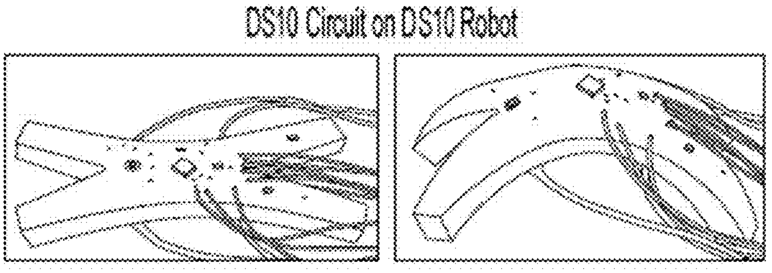
Figure 23B:
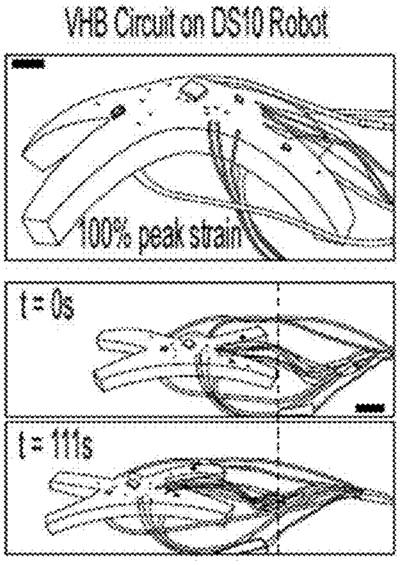
Figure 23C:
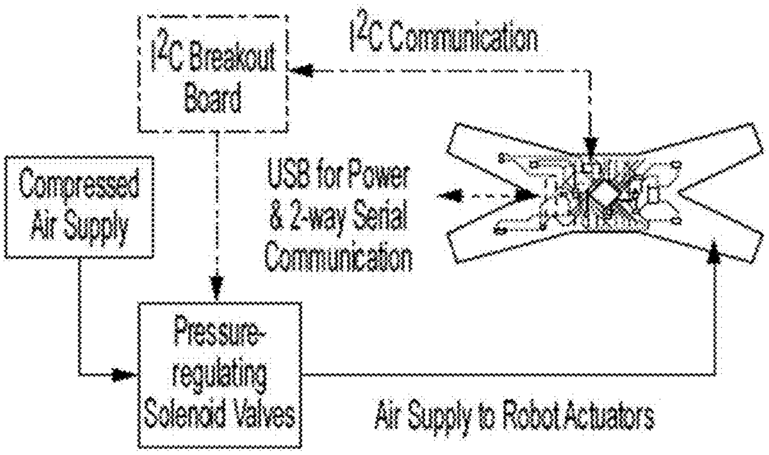
Figure 23D:
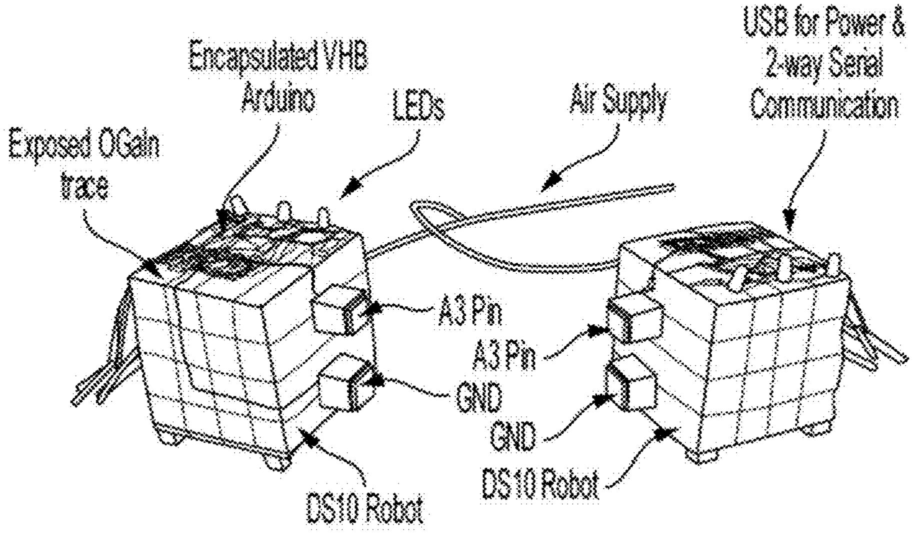
Figure 23E:
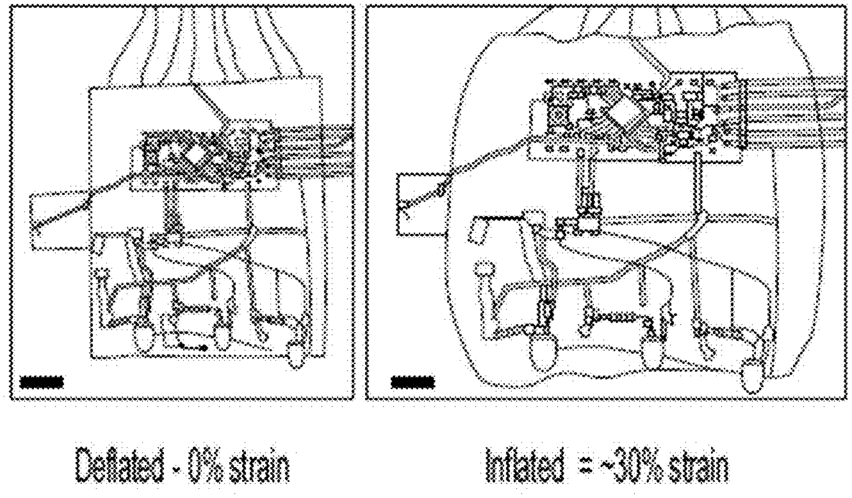
Figure 23F:
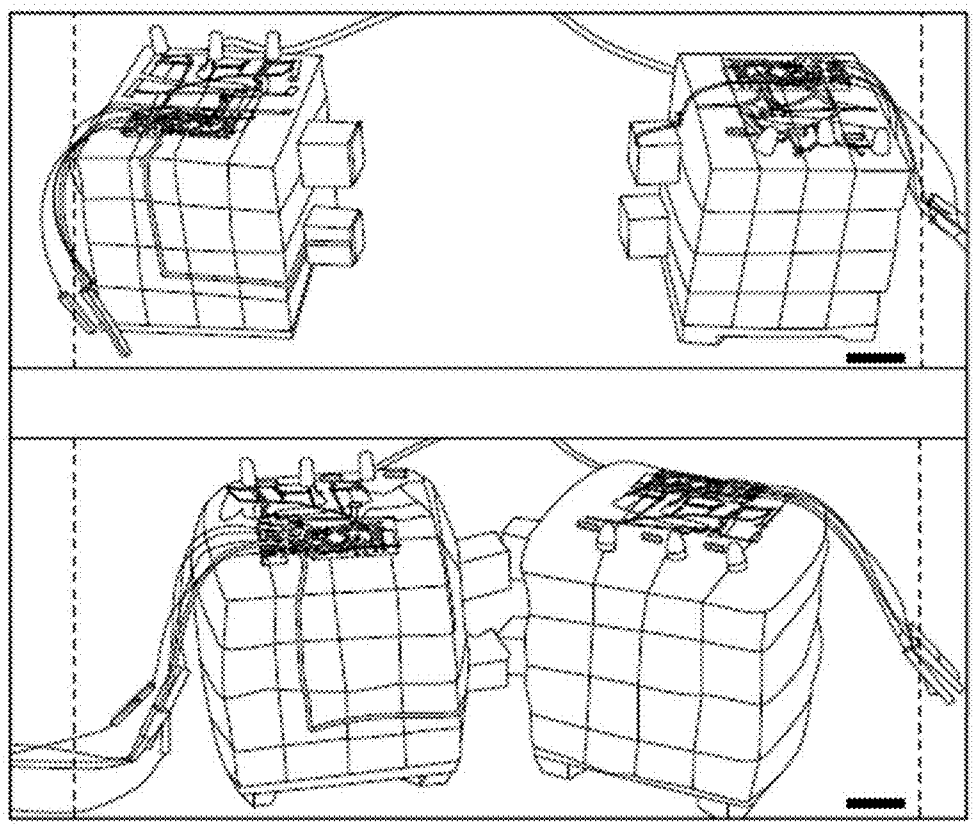
Figure 23G:
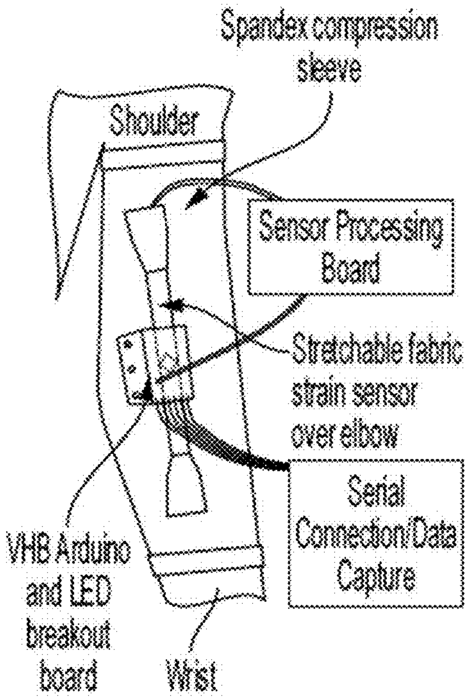
Figure 23H:
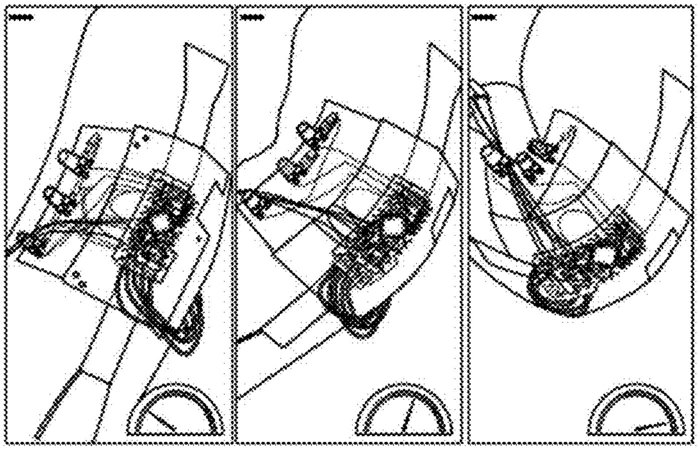

In one form, the at least one stretchable circuit board assembly disclosed herein, may be incorporated into a wearable garment for sleep studies, diagnosis of sleep disorders, health tracking, fitness tracking, physical rehabilitation, or combinations thereof. The stretchable circuit board assembly could be used to process sensor data from a patient during sleep or during the day by being incorporated next to or near the sensors. This would not interfere with patient comfort/activities. For example, one embodiment can collect data that can be processed to gain insights into the wearer's pose during sleep, to diagnose various sleep disorders such as REM-sleep behavior disorder. In another embodiment, these sensors could be used to track daytime motor symptoms, and movements during exercise. In other embodiments, the at least one stretchable circuit board assembly could be incorporated into physical rehabilitative devices. A stretchable circuit board assembly could act as a sensor and a processor, and the sensor data could be processed to dictate how a wearable rehabilitative device should act to aid the wearer. See FIG. 23G and FIG. 23H to see an example of a stretchable circuit board assembly incorporated into a garment. FIG. 23G shows the setup of the experiment, while FIG. 23H shows LEDs lighting up based on the bending range of the sensor, as processed and dictated by the stretchable circuit board assembly.

In another form, the at least one stretchable circuit board assembly disclosed herein, may be incorporated into a robotic system including one or more robots, robot-robot interfaces, human-robot interfaces, or combinations thereof. The substrates and encapsulants of the stretchable circuit board assembly are stretchable, making them compatible with materials that commonly make up soft robots (which are typically silicone elastomers and other polymers). This means that the stretchable circuit board assembly could be incorporated into or onto the bodies of soft robotic systems (FIGS. 23A-F). FIG. 23A shows an instantiation of a stretchable circuit board assembly that uses DS10 (DragonSkin 10, SmoothOn Inc., a silicone elastomer) as both substrate and encapsulant. FIG. 23B shows a stretchable circuit board assembly that uses VHB as the substrate, and rubber cement as the encapsulant. The circuit drives this robot to walk using the schematic in FIG. 23C. Two stretchable circuit board assemblies are embedded into two soft robots (FIG. 23D), which are repeatedly inflated (FIG. 23E), to locomote towards each other and sense contact (FIG. 23F). Exposed traces are used to electrically connect multiple robots (FIG. 23F), and the circuit could also be used to interact with a human user.

In yet another form, the at least one stretchable circuit board assembly disclosed herein, may be incorporated into an electronic device selected from the group consisting of a cell phone, a haptic device, a tablet, a display, a virtual reality headset, a handset, a sensor, an array of sensors, a gaming device, and combinations thereof. These circuits could also be integrated into today's smart technology for sensory feedback and processing, and for comfort of the user during interaction with one of these devices. A haptic device could process data and provide feedback, for example, in an AR/VR experience. In another embodiment, the sensory or processing circuitry could be made soft, and located near where the device interacts with the user, for example, in a headset or wrist-worn interface.

Experimental Examples

The invention is further described in detail by reference to the following experimental examples. These examples are provided for purposes of illustration only, and are not intended to be limiting unless otherwise specified. Thus, the invention should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the system and method of the present invention. The following working examples therefore, specifically point out the exemplary embodiments of the present invention, and are not to be construed as limiting in any way the remainder of the disclosure. For example and without limitation, GaIn may be placed on a surface A to make a circuit, then GaIn may be placed on another surface to make a circuit. The two circuits can be layered on top of each other and connected using a vertical interconnect access (VIA), that is like a vertical channel going through multiple layers (specifically, two layers in this embodiment). Such designs may be constructed via any of the materials and material combinations described herein and the same procedures may be used for the range of liquid metals and solid particles disclosed herein.

Humans can intuitively sense the positions of their limbs, allowing them to execute complex motions even when objects or disabilities prevent them from seeing portions of their bodies. However, achieving such proprioception in a rigid robot requires knowledge of its rigid-body kinematic configuration, while the shape of soft or flexible robots are typically estimated using strain sensors coupled with a material-specific mechanical model. Such models perform poorly when buckling occurs and when material properties change. Strain and orientation measurements as described herein can be used to estimate the surface contours of 2D sheets which can stretch and bend to conform to the surface of soft robots, in a manner that is independent of the substrate that the skins were applied to. The sheets can be made by applying a biphasic Gallium-Indium paste to the surface of stretchable acrylic tape as described herein (VHB, manufactured by 3M), to create stretchable circuits upon which we attached commercial integrated circuits. Various algorithms can be utilized such as an analytic formulation algorithm, and a data-driven machine learning algorithm. These shape-sensing sheets were tested on several benchmark non-moving surfaces, in addition to being applied to the surface of a morphing robot to enable closed-loop shape change. The approach outlined herein provides a generalized method for measuring the surface shape of objects, and can be applied to solve sensing challenges across a wide range of domains, including wearable electronics and soft robotics.

Material Fabrication

The liquid metal nanoparticle ink was made by adding 362±5 mg of eutectic gallium-indium alloy (75.5% Ga, 24.5% In) into 4 mL of ethanol and then sonicating at an amplitude of 36 μm (30% setting) for 120 min using a tip sonicator (⅛" microtip probe). Prior to spray printing, the ink was mixed vigorously using a vortex mixer for 3 min to ensure uniform dispersion. The nanoparticle ink was then sprayed onto a silicon wafer substrate using a customized spray printer. Compressed air (20 psi) was blown over a syringe needle while ink was dispensed at a fixed rate (0.3 mL $min^{-1}$), with the printer stage translating underneath at 5 mm $s^{-1}$. A 3 mL syringe of ink made a single layer of film, with the process being repeated 10 times to create films thick enough for bGaIn to form. After spray deposition, the printed liquid metal nanoparticle film was heated in a furnace at 900° C. for 30 min and then cooled in ambient conditions.

After the thermal sintering, stretchable substrates such as VHB tape or silicone elastomer were brought into conformal contact with the silicon wafer. Pressure was manually applied, and the substrate was lifted to complete the transfer printing. In other experiments, the bGaIn was scraped off the silicon wafer and thoroughly hand-mixed. It was then patterned onto VHB tape (FIG. 14AAa) and paper (FIG. 14AAb) using a thin film applicator, and directly written onto a piece of foam (FIG. 14AAc) and a latex balloon (FIG. 14AAd). Surface mount LEDs were adhered to the foam using cyanoacrylate.

In another embodiment, oGaIn was prepared by mixing 200 g of eGaIn in a 250 mL beaker at an RPM in the range of 0 to 1000 for 30 minutes. These parameters can be varied to achieve different throughput of material and desired rheologies. In other embodiments, oGaIn was prepared by mixing 200 g of eGaIn in a 250 mL beaker at 600 RPM for 20 minutes while on a hot plate set to 100 Deg. C. The heat could be adjusted, for example to alter the rate of formation of gallium oxide, or to encourage off-gassing of impurities present in the material.

Electrical and Mechanical Characterization

BGaIn resistance was measured using a four-point probe with a digital multi-meter, after being transferred to a VHB substrate in a dog bone pattern. The resistance values (0.16±0.02Ω) were averaged from twelve measurements. The dog bone patterns had an aspect ratio (length/width) of 5:1 (7.5×1.5 mm). Thicknesses of these patterns were measured using a 3D optical profiler, and averaged from twelve measurements (15.51±1.55 μm). Initial conductivity of the biphasic material was calculated as $$\sigma = \frac{1}{R_{wt}} = 2.06 \pm 0.29 \times 10^6 \ \mathrm{Sm}^{-1}.$$

Contact resistance between bGaIn and electrical pins was measured using the transmission line method. An array of tinned copper contacts with various spacings was attached to a single bGaIn trace. Resistance values between each pair of contacts were measured. The measured contact resistance is half of the y-intercept value of the fitted line.

For electro-mechanical characterization, rectangular samples (length: 20 mm; width: 0.8 mm) were fabricated by transfer-printing bGaIn onto VHB or PDMS substrates. To eliminate the resistance changes at the interfaces between bGaIn and external wires, electrical connections were made by adhering copper tape on each end of the bGaIn traces, secured using silver conductive epoxy. For the samples on PDMS substrates, fabric strips were placed at the interfaces to prevent stretching. The films were then encapsulated with another layer of VHB or PDMS. To test the circuits with bGaIn-component interfaces, zero-ohm resistors were placed between two bGaIn traces. For VHB substrates, the resistors were held for 3 min to encourage bonding. For PDMS substrates, the resistors were placed when the silicone was only partially cured, and still "tacky," to enhance bonding. The two ends of the samples were clamped on three-dimensional printed parts and assembled on a customized tensile stage. The resistance values were measured using a Wheatstone bridge and corrected based on the clamped portion of the samples. The encapsulated bGaIn films were then subjected to uniaxial tensile loading at 15 mm $min^{-1}$, 150 mm $min^{-1}$, 225 mm $min^{-1}$, or 300 mm $min^{-1}$ using a customized tensile stage, while the resistance was measured using a Wheatstone bridge.

oGaIn was electromechanically tested in a similar fashion: Dogbone samples of VHB were prepared to ASTM D412 standard, with a trace of oGaIn painted on using a mask. The oGaIn was 0.25 mm wide. To eliminate the resistance changes at the interfaces between oGaIn and external wires, electrical connections were made by adhering copper tape on each end of the oGaIn traces, secured using silver conductive epoxy. Fabric strips were placed at the interfaces to prevent stretching. The films were then encapsulated with rubber cement. The oGaIn resistance was measured using a 4 point-probe device, while it was strained either once to 400% strain (FIG. 21B), cyclically to 150% strain for 1000 cycles (FIG. 21C), or cyclically to 150% strain for 100 cycles where each trace is interrupted by a zero Ohm resistor, to illustrate low resistance interfacing between electronic components during strain (FIG. 21D). All straining was performed at 15 mm/min.

Material Characterization

SEM images were taken by a UHR Cold Field Emission Scanning Electron Microscope. Samples for cross-section imaging were made by cleaving in liquid nitrogen. Elemental composition and mappings were obtained using energy dispersive X-ray spectroscopy at 5 kV. XRD patterns were collected using an X-Ray Diffractometer with Cu Kα radiation (8.04 keV, 1.5406 Å).

Stretchable Circuit Board Assemblies (SCBAs)

A first SCBA was produced to demonstrate the near-universal utility of bGaIn to create stretchable soft robotic and wearable electronics. A first SCBA, shown in FIG. 14B, included an LED array with bGaIn electrical interconnects, 33 LEDs pick-and-place assembled on VHB tape, which was stretched to 250% strain (see FIG. 14C) with no perceptible diminishing of the LED brightness.

The SCBAs disclosed herein were fabricated by transfer-printing bGaIn onto VHB or silicone substrates with patterned masks. The masks were created by laser cutting liners of white matte sticker papers (Online Labels Inc.) using a UV laser micromachining system with 355 nm wavelength and 15 μm beam diameter. The glossy side of the liners were placed onto the VHB adhesive or silicone substrates, and easily peeled off after patterning. To provide electrical leads, tinned copper wires were flattened using a roller mill and pressed onto the bGaIn contact pads. The VHB substrates were reinforced with double-sided tape and the silicone substrates were reinforced with inextensible fabrics. Electrical wires were then soldered onto the flattened wires.

For the LED array shown in FIG. 14B and FIG. 14C, 33 LEDs were pressed onto the VHB substrate at the designated positions and held for 3 min to encourage adhesion. The circuit was sealed with a layer of VHB on top. With voltage held constant at 2.7 V, the LED array was stretched to 250% strain by hand and then released. FIG. 14D shows another example SCBA comprising an amplifier circuit before and after stretching to 400% strain.

An operational amplifier circuit was constructed including a 14-pin rail-to-rail output operational amplifier, as shown in FIG. 15.

A 14-pin rail-to-rail output quad-operational amplifier integrated circuit was used, with surface mount resistors. The interconnects were produced by transferring bGaIn from a silicon wafer 1502 onto a VHB tape with a laser-cut mask 1501 applied. After peeling off the mask, the bGaIn traces 1503 were exposed. the surface mount electronic components 1504 were placed onto their designated positions and pressed for 3 min to ensure sufficient bonding. Finally, flattened tinned copper wires 1505 were pressed onto the contact pads then reinforced with double-sided tape to connect with external wires. The scale bar in FIG. 15 is 2 cm.

A 100 mVpp sinusoidal signal with a 100 mVpp offset was supplied and the output signals were measured with an oscilloscope. The circuit was incrementally stretched, and the outputs were recorded at increments of 25% strain, up to 400%. As a control, the same circuit was built on a rigid copper-clad PCB board (G10/FR4, Pulsar) patterned by the LPKF laser, and tested with the same inputs at 0% strain.

A first-order resistor-capacitor low-pass filter circuit comprised a resistor, a capacitor and bGaIn as electrical interconnects. A 500 mVpp sinusoidal signal (Vin) was supplied at various frequencies and the output signals (Vout) were measured with an oscilloscope. The circuit was incrementally stretched, and the outputs were recorded at increments of 100% strain, up to 400%. The magnitude in decibels (dB) was calculated as $$20\log\left(\frac{V_{out}}{V_{in}}\right).$$

As a comparison, an identical circuit using eGaIn as electrical interconnects was created. The bGaIn was patterned as interfacial contacts for the eGaIn circuit to ensure stable connections with rigid electronic components.

A stretchable LED 5×5 display was fabricated by first rod-coating a layer of silicone elastomer onto a PET substrate. Once the silicone cured, bGaIn was transfer-printed onto it to create the bottom circuit. Next, another layer of silicone elastomer was rod-coated on top and, after curing, another layer of bGaIn was printed. Once the top layer patterning was complete, 25 VIAs were created between the two layers by cutting cavities with an IR laser (30 W, 10.6 μm $CO_2$ laser) and filling them with bGaIn.

Then, 25 surface mount LEDs were bonded to the silicone elastomer layer using a silicone adhesive. Finally, the circuit was encapsulated by rod-coating another layer of silicone elastomer on top. The LEDs were controlled individually by an external microcontroller.

Lastly, a multilayer signal conditioning circuit was made with integrated sensing and computation for wearable sensing applications. Typical wearable stretch capacitive sensors require a co-located, rigid signal conditioning circuit board for capacitance measurement, moderately constraining the movement of the body. The exemplary board was built as an SCBA on VHB tape, integrating a microcontroller, a capacitor and five resistors with transfer printed bGaIn interconnects and bGaIn filled VIAs. The fabrication process is shown in FIG. 16F, and the schematic is shown in FIG. 16J.

With reference now to FIG. 16F, in order to fabricate the conditioning circuit, an alignment fixture was built on an acrylic plate to achieve rapid and precise assembly of the top and bottom layers. The fabrication process steps shown in FIG. 16F include masking the bottom layer in step 1601, transfer-printing the bottom layer in step 1602, masking the top layer in step 1603, transfer printing the top layer and laser cutting cavities in step 1604 (laser-cut cavity 1611 shown magnified in inset), filling the cavities with bGaIn in step 1605 (filled cavity shown magnified in inset), and interfacing with electronics and external wires in step 1606. The scale bar in FIG. 16F is 5 mm.

The bGaIn paste can be filled into laser-cut cavities to easily create stretchable VIAs. The bGaIn strongly wets and adheres to the cavity, bridging the top and bottom traces (FIG. 12C), even when stretched (FIG. 12D). The electrical resistance of circuits was measured with a single VIA connecting two bGaIn traces at high strains (FIG. 12*a*). The relative resistance at 500% strain on VHB was 2.03, which remains notably lower than the theoretical prediction based on bulk conductor assumptions (FIG. 5*a* black; R/R0=36 at 500%). The electromechanical response of a VIA strained cyclically to 500% on VHB also remained consistent over 1,500 loading cycles (FIG. 12*b*).

The circuit board (finished circuit board shown in FIG. 16G) included resistors, capacitors, a microcontroller, and flattened, tinned copper wires for interfacing with the stretch sensor and sending data to an external microcontroller. For characterization experiments, the signal conditioning circuit board was stretched and held at a certain strain using a customized tensile stage, while the capacitive sensor (1 cm wide with 105 mm gauge length) was subjected to 10 cycles of repetitive strain from 0% to 50% using a materials tester at a strain rate of 150 mm/min. The sensor was secured to the materials tester via acrylic plates that had been sewn onto the ends of the sensor. The sensor was installed in a slack position and the crosshead of the materials tester was raised until the sensors were not slack; no further pretension was applied to the sensors. For the sensory sleeve demonstration, the capacitive sensor was sewn onto a user's shirt sleeve and the signal conditioning circuit board was placed on the top of the sensor.

Figure 22C:
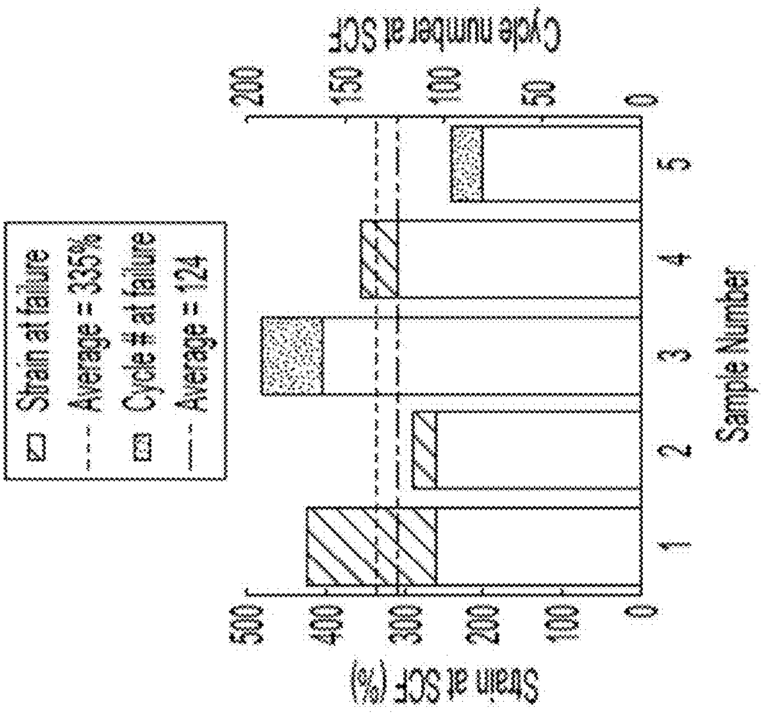
Figure 22B:
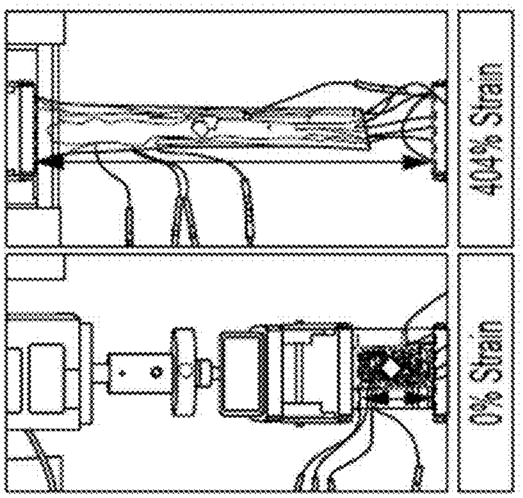
Figure 22A:
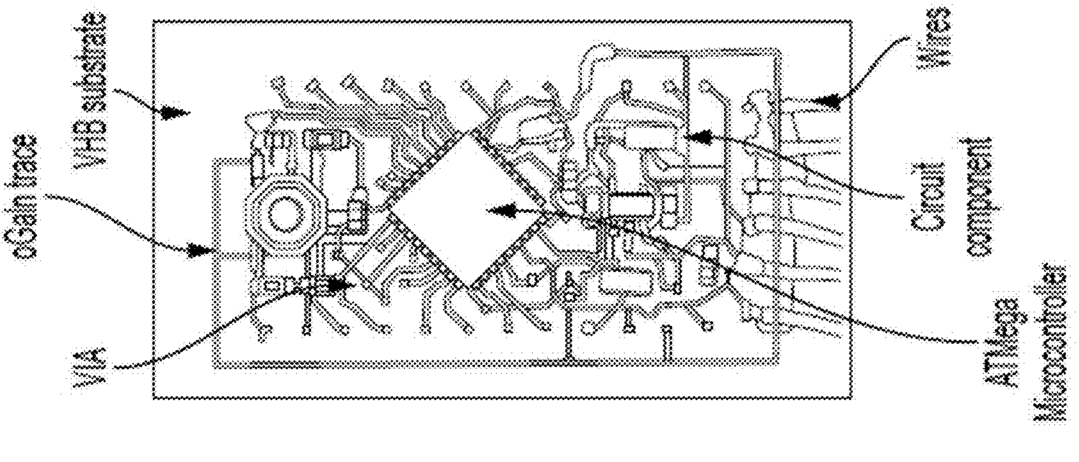
Figure 22D:
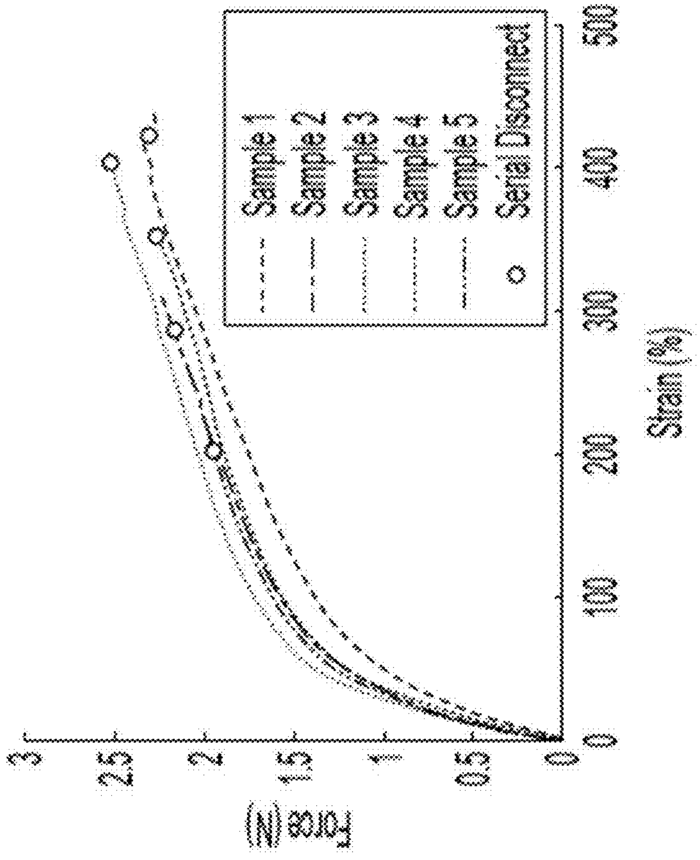
Figure 22E:
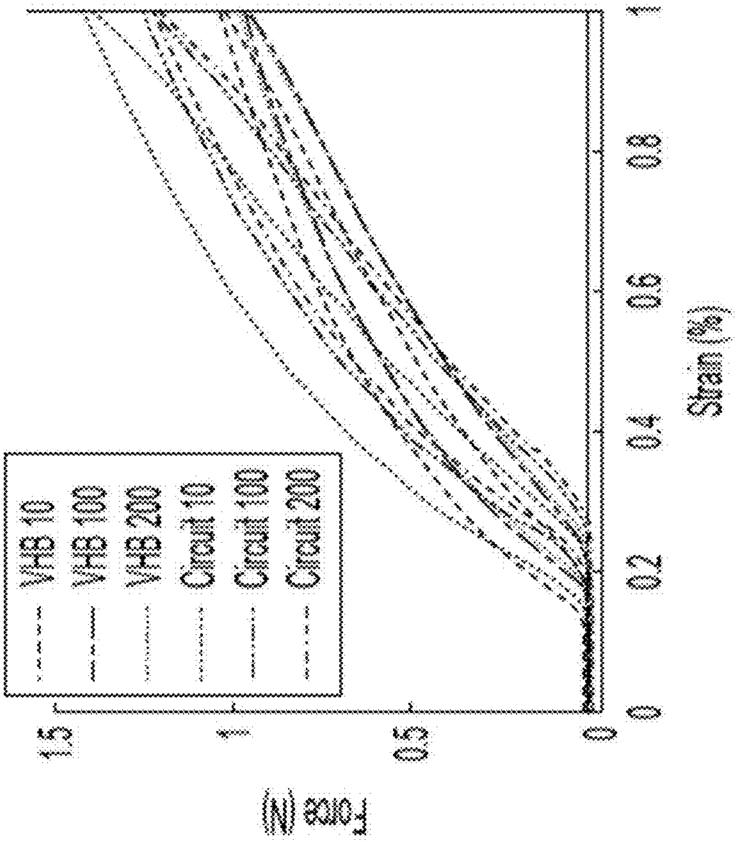

In another embodiment, two-layer stretchable circuit board assemblies are fabricated by patterning traces on either side of a substrate material, placing components on one side, encapsulating with a stretchable material, and placing strain limiting island (SLI) over sensitive electronic components (FIG. 24). These stretchable circuit board assemblies, which were functionally Arduino Pro Mini circuits (FIG. 22A), maintained functionality until an average of 335% strain when pulled to serial connection failure (SCF) (FIG. 22B, FIG. 22D), and to an average of 124 cycles when cycled to 100% strain until SCF (FIG. 22C). It was found that the circuit materials increased stiffness of the substrate material by a consistent amount (FIG. 22E).

In another embodiment, this process can be extended to n-layer circuit assemblies (FIG. 25), by stacking multiple completed 2-layer circuits (with components in inner layers), using the substrate material to interface between inner layers (FIG. 25 center), using the encapsulant material to interface with inner layers (FIG. 25 left), or combinations thereof (FIG. 25 right).

In another embodiment, the stretchable circuit board assembly has circuit components "over" the circuit substrate, which can mean on any surface of the substrate (in direct contact), or adjacent to it (not in direct contact), or combinations thereof.

In one embodiment, to increase manufacturability of the circuit, it was found that the tackiness of the substrate material correlated to how well oGaIn adhered to circuit (FIG. 21A), and how well electrical components adhered (preventing lateral movement, and smearing of traces). Tackiness was measured using the British Standard Tack Test (EN-1719), and a modified version of this tack test was used to measure oGaIn adhesion, where oGaIn was molded, and the substrate came into contact with the molded oGaIn. Different surface treatments could be used as well to achieve a similar effect (good trace adhesion, and good electrical component contact). This could include modifying the substrate surface, or the electronic component surface, to promote adhesion, tackiness, or bonding. This can be done, for example, by painting on silanes, using plasma treatment, or other surface modifications.

In another embodiment, these stretchable circuit board assemblies could be modified to make them more porous. Porosity enhancement could make them more breathable (so liquids and/or gases can transmit through the circuit). This porosity could be on any scale. For example, holes could be drilled in the spaces between traces, the stretchable circuit assembly could be cut or patterned, or the substrate material could be inherently porous. Holes could be added before making the circuit, or after the circuit has been encapsulated.

Thermal Processing Conditions for Fabricating bGaIn

To test the thermal processing conditions, the heating temperature was varied from 500° C. to 1000° C. and the heating duration from 10 min to 30 min. After the thermal heating process, the films were transferred from a silicon wafer to VHB tape, and measured the resistance values using a four-point probe with a digital multimeter. The optical images of the films before and after transfer are shown in FIG. 17A.

Below 800° C., due to low internal thermal stresses to rupture the oxide skins, an insufficient number of particles was coalesced into liquid. The films were brittle and strongly adhered to the silicon wafer, leading to incomplete transfer and non-conductive electrical readings. As the heating temperature was increased to 800° C. and higher, more particles coalesced, resulting in semi-liquid films with high electrical conductivity that could be easily transferred to VHB tape due to sufficient liquid content.

Although the films processed at 800° C., 900° C., and 1000° C. for different heating duration were all very conductive (resistance values less than 2Ω, example optical images shown in FIG. 17A), the surface morphologies (FIG. 17B) and measured resistance values (FIG. 17C) were different. The films processed at 800° C. show non-coalesced small particles embedded in a small amount of liquid, with larger resistances and variances. The films were not stretchable, possibly due to the low volume fraction of liquid in the biphasic material. Starting from 900° C., the generated internal thermal stresses became large enough to coalesce most of the particles, leading to stretchable biphasic films with large crystalline solids embedded in liquid. Simultaneously, the nanowires on the solid side of the biphasic films became evident. The films processed at 900° C. also exhibit the smallest resistance values and variances. As described above, the bGaIn was processed by heating the deposited film for 30 min at 900° C. As the effect of heating duration on the resistances of the films processed at 900° C. is negligible, the processing time may be further reduced in future work without affecting material performance.

As the heating temperature or duration increased, the formation of nanowires on the solid side of the biphasic films increased (FIG. 17C). The measured resistances also increased, due to the extensive oxidation at high temperatures. Since the nanowires form a thin solid film (~500 nm) on top, they aid in adhering the biphasic film to the stretchable substrate during the transfer process, but do not contribute significantly to the electromechanical properties.

Results

The operational amplifier circuit disclosed above was fabricated with four different amplifier circuits (non-inverting, inverting, summing and differential, as shown in FIG. 15.

A 100 $mV_{pp}$ sinusoidal signal was supplied with a 100 $mV_{pp}$ offset while the output signals were measured with an oscilloscope. The circuit was incrementally stretched, and the outputs were recorded at every 25% strain, up to 400%. As a control, the same circuit was built on a rigid copper clad PCB board patterned by an LPKF laser, and tested with the same inputs at 0% strain.

With reference to FIG. 16A, the output voltage of the representative summing circuit is proportional to the sum of the input voltages, and is therefore highly sensitive to large resistance changes in the circuit. Initially, when supplied with a 100 $mV_{pp}$ sinusoidal signal with a 100 mV offset on both $V_{IN1}$ and $V_{IN2}$, the circuit produced the expected output voltage (1.1 $V_{pp}$, FIG. 16B), with a perfect match to the same circuit built on a rigid PCB. Furthermore, stretching the circuit to different strains had a negligible impact on the output signal (FIG. 16B). Finally, the measured amplitude and phase shift at different strains were approximately the same as the theoretical values (0.55 V; 0 rad, FIG. 16C). The stable performance during these experiments prove the capability of bGaIn to enable SCBAs that retain their electrical performance over large strain.

To further clarify the utility of bGaIn in resistance-sensitive circuits, a first-order resistor-capacitor low-pass filter circuit using bGaIn as electrical interconnects was also demonstrated and compared to an identical circuit manufactured using bulk eGaIn (FIG. 16D). The bGaIn circuit exhibited similar outputs and cut-off frequencies (~936 Hz) at various strain levels up to 400% strain, while the eGaIn circuit failed at less than 100% strain. The stable performance during these collective experiments proves the capability of bGaIn to enable SCBAs that retain their electrical performance over large strains.

After demonstrating single-layer bGaIn circuits, bGaIn VIAs were used to create multi-layer, high-performance stretchable circuits. First, a stretchable LED display was fabricated with 25 LEDs and 25 corresponding bGaIn VIAs arranged in a 5×5 grid (FIG. 16E). The circuit was built in silicone elastomer to demonstrate the transferability of the disclosed manufacturing methods to non-adhesive substrates. The LEDs in the display could be controlled individually by an external microcontroller to create a scrolling message, while being stretched along all in-plane strain directions.

The signal conditioning circuit was fabricated as outlined above and held at a series of strains (0%, 50%, 100%, 150%, 200%), while subjecting the capacitive sensor to 10 cycles of 50% strain (FIG. 16H). As expected, the signal conditioning board maintained a linear response when stretched up to 200%, ignoring the effects of sensor noise. The stretchable capacitive sensor was then directly integrated with the signal conditioning board and attached the sensor-circuit assembly on the surface of a shirt sleeve as shown in FIG. 16K.

The sensor and the circuit deformed simultaneously during elbow flexion, and the sensor circuit measured the motion of the user's arm (FIG. 16K). In contrast to existing sensors, where the sensing circuit is placed outside the active region, here the circuit was able to be co-located with the sensor directly over the user's elbow. This presents a key advance toward unobtrusive wearable electronics.

INCORPORATION BY REFERENCE

[123] The following publications are incorporated herein by reference in their entireties:

[124] Liu, S., Shah, D. S. & Kramer-Bottiglio, R. Highly stretchable multilayer electronic circuits using biphasic gallium-indium. Nat. Mater. 20, 851-858 (2021).

[125] Steven I. Rich, Robert J. Wood, and Carmel Majidi. Untethered soft robotics. *Nature Electronics,* 1(2):102-112, 2018.

[126] Nanshu Lu and Dae-Hyeong Kim. Flexible and stretchable electronics paving the way for soft robotics. *Soft Robotics,* 1(1):53-62, 2013.

[127] Yuhao Liu, Matt Pharr, and Giovanni Antonio Salvatore. Lab-on-skin: A review of flexible and stretchable electronics for wearable health monitoring. *ACS Nano,* 11(10):9614-9635, 2017.

[128] Matteo Stoppa and Alessandro Chiolerio. Wearable electronics and smart textiles: A critical review. *Sensors,* 14(7):11957-11992, 2014.

[129] Dae-Hyeong Kim, Roozbeh Ghaffari, Nanshu Lu, and John A. Rogers. Flexible and stretchable electronics for biointegrated devices. *Annual Review of Biomedical Engineering,* 14(1):113-128, 2012.

[130] John A. Rogers, Roozbeh Ghaffari, and Dae-Hyeong Kim. *Stretchable Bioelectronics for Medical Devices and Systems*. Springer, 2016.

[131] Sumin Lim, Donghee Son, Jaemin Kim, Young Bum Lee, Jun-Kyul Song, Suji Choi, Dong Jun Lee, Ji Hoon Kim, Minbaek Lee, Taeghwan Hyeon, and Dae-Hyeong Kim. Transparent and stretchable interactive human machine interface based on patterned graphene heterostructures. *Advanced Functional Materials,* 25(3):375-383, 2015.

[132] Jae-Woong Jeong, Woon-Hong Yeo, Aadeel Akhtar, James J. S. Norton, Young-Jin Kwack, Shuo Li, Sung-Young Jung, Yewang Su, Woosik Lee, Jing Xia, Huanyu Cheng, Yonggang Huang, Woon-Seop Choi, Timothy Bretl, and John A. Rogers. Materials and optimized designs for human-machine interfaces via epidermal electronics. *Advanced Materials,* 25(47):6839-6846, 2013.

[133] Dustin Chen and Qibing Pei. Electronic muscles and skins: A review of soft sensors and actuators. *Chemical Reviews,* 117(17):11239-11268, 2017.

[134] Jiangxin Wang and Pooi See Lee. Progress and prospects in stretchable electroluminescent devices. *Nanophotonics,* 6(2):435-451, 2016.

[135] Raymond Adam Bilodeau, Amir Mohammadi Nasab, Dylan Sanjay Shah, and Rebecca Kramer-Bottiglio. Uniform conductivity in stretchable silicones via multiphase inclusions. *Soft Matter,* 2020.

[136] Chaoyi Yan and Pooi See Lee. Stretchable energy storage and conversion devices. *Small,* 10(17):3443-3460, 2014.

[137] Zhenlong Huang, Yifei Hao, Yang Li, Hongjie Hu, Chonghe Wang, Akihiro Nomoto, Taisong Pan, Yue Gu, Yimu Chen, Tianjiao Zhang, Weixin Li, Yusheng Lei, NamHeon Kim, Chunfeng Wang, Lin Zhang, Jeremy W. Ward, Ayden Maralani, Xiaoshi Li, Michael F. Durstock, Albert Pisano, Yuan Lin, and Sheng Xu. Three-dimensional integrated stretchable electronics. *Nature Electronics,* 1(8):473-480, 2018.

[138] D. S. Gray, J. Tien, and C. S. Chen. High-conductivity elastomeric electronics. *Advanced Materials,* 16: No. 5, 2004.

[139] J. A. Rogers, T. Someya, and Y. Huang. Materials and mechanics for stretchable electronics. *Science,* 327 (5973):1603-1607, 2010.

[140] Akihito Miyamoto, Sungwon Lee, Nawalage Florence Cooray, Sunghoon Lee, Mami Mori, Naoji Matsuhisa, Hanbit Jin, Leona Yoda, Tomoyuki Yokota, Akira Itoh, Masaki Sekino, Hiroshi Kawasaki, Tamotsu Ebihara, Masayuki Amagai, and Takao Someya. Inflammation-free, gas-permeable, lightweight, stretchable on-skin electronics with nanomeshes. *Nature Nanotechnology,* 12(9): 907-913, 2017.

[141] Dickey Michael D. Stretchable and soft electronics using liquid metals. *Advanced Materials,* 29(27): 1606425, 2017.

[142] Christoph Keplinger, Jeong-Yun Sun, Choon Chiang Foo, Philipp Rothemund, George M. Whitesides, and Zhigang Suo. Stretchable, transparent, ionic conductors. *Science,* 341(6149):984-987, 2013.

[143] Yue Wang, Chenxin Zhu, Raphael Pfattner, Hongping Yan, Lihua Jin, Shucheng Chen, Francisco Molina-Lopez, Franziska Lissel, Jia Liu, Noelle I. Rabiah, Zheng Chen, Jong Won Chung, Christian Linder, Michael F. Toney, Boris Murmann, and Zhenan Bao. A highly stretchable, transparent, and conductive polymer. *Science Advances,* 3(3):e1602076, 2017.

[144] Hristiyan Stoyanov, Matthias Kollosche, Sebastian Risse, Rémi Waché, and Guggi Kofod. Soft conductive elastomer materials for stretchable electronics and voltage controlled artificial muscles. *Advanced Materials,* 25(4): 578-583, 2013.

[145] Naoji Matsuhisa, Martin Kaltenbrunner, Tomoyuki Yokota, Hiroaki Jinno, Kazunori Kuribara, Tsuyoshi Sekitani, and Takao Someya. Printable elastic conductors with a high conductivity for electronic textile applications. *Nature Communications,* 6(1):1-11, 2015.

[146] Benjamin C. K. Tee and Jianyong Ouyang. Soft electronically functional polymeric composite materials for a flexible and stretchable digital future. *Advanced Materials,* 30(47):1802560, 2018.

[147] Naoji Matsuhisa, Xiaodong Chen, Zhenan Bao, and Takao Someya. Materials and structural designs of stretchable conductors. *Chemical Society Reviews,* 48(11):2946-2966, 2019.

[148] Dae-Hyeong Kim, Nanshu Lu, Rui Ma, Yun-Soung Kim, Rak-Hwan Kim, Shuodao Wang, Jian Wu, Sang Min Won, Hu Tao, Ahmad Islam, et al. Epidermal electronics. *Science,* 333(6044):838-843, 2011.

[149] Daniel Green Marques, Pedro Alhais Lopes, Anibal T. de Almeida, Carmel Majidi, and Mahmoud Tavakoli. Reliable interfaces for EGaIn multi-layer stretchable circuits and microelectronics. *Lab on a Chip,* 19:897-906, 2019.

[150] Shantonu Biswas, Andreas Schoeberl, Yufei Hao, Johannes Reiprich, Thomas Stauden, Joerg Pezoldt, and Heiko O Jacobs. Integrated multilayer stretchable printed circuit boards paving the way for deformable active matrix. *Nature communications,* 10(1):1-8, 2019.

[151] F Scharmann, G Cherkashinin, V Breternitz, Ch Knedlik, G Hartung, Th Weber, and JA Schaefer. Viscosity effect on gainsn studied by xps. *Surface and Interface Analysis: An International Journal devoted to the development and application of techniques for the analysis of surfaces, interfaces and thin films,* 36(8):981-985, 2004.

[152] Collin Ladd, Ju-Hee So, John Muth, and Michael D Dickey. 3d printing of free standing liquid metal microstructures. *Advanced Materials,* 25(36):5081-5085, 2013.

[153] D Zrnic and DS Swatik. On the resistivity and surface tension of the eutectic alloy of gallium and indium. *Journal of the less common metals,* 18(1):67-68, 1969.

[154] Shanliangzi Liu, Michelle C. Yuen, Edward L. White, J. William Boley, Biwei Deng, Gary J. Cheng, and Rebecca Kramer-Bottiglio. Laser sintering of liquid metal nanoparticles for scalable manufacturing of soft and flexible electronics. *ACS Applied Materials & Interfaces,* 10(33):28232-28241, 2018.

[155] Shanliangzi Liu, Serrae N. Reed, Matthew J. Higgins, Michael S. Titus, and Rebecca Kramer-Bottiglio. Oxide rupture-induced conductivity in liquid metal nanoparticles by laser and thermal sintering. *Nanoscale,* 11(38): 17615-17629, 2019.

[156] Naoji Matsuhisa, Daishi Inoue, Peter Zalar, Hanbit Jin, Yorishige Matsuba, Akira Itoh, Tomoyuki Yokota, Daisuke Hashizume, and Takao Someya. Printable elastic conductors by in situ formation of silver nanoparticles from silver flakes. *Nature Materials,* 16(8):834-840, 2017.

[157] Minwoo Park, Jungkyun Im, Minkwan Shin, Yuho Min, Jaeyoon Park, Heesook Cho, Soojin Park, Mun-Bo Shim, Sanghun Jeon, Dae-Young Chung, Jihyun Bae, Jongjin Park, Unyong Jeong, and Kinam Kim. Highly stretchable electric circuits from a composite material of silver nanoparticles and elastomeric fibres. *Nature Nanotechnology,* 7(12):803-809, 2012.

[158] Jiajie Liang, Kwing Tong, and Qibing Pei. A water-based silver-nanowire screen-print ink for the fabrication of stretchable conductors and wearable thin-film transistors. *Advanced Materials,* 28(28):5986-5996, 2016.

[159] Shu Zhu, Ju-Hee So, Robin Mays, Sharvil Desai, William R. Barnes, Behnam Pourdeyhimi, and Michael D. Dickey. Ultrastretchable fibers with metallic conductivity using a liquid metal alloy core. *Advanced Functional Materials,* 23(18):2308-2314, 2013.

[160] Wang Jiangxin, Cai Guofa, Li Shaohui, Gao Dace, Xiong Jiaqing, and Lee Pooi See. Printable superelastic conductors with extreme stretchability and robust cycling endurance enabled by liquid-metal particles. *Advanced Materials,* 30:1706157, 2018.

[161] Tsuyoshi Sekitani, Hiroyoshi Nakajima, Hiroki Maeda, Takanori Fukushima, Takuzo Aida, Kenji Hata, and Takao Someya. Stretchable active-matrix organic light-emitting diode display using printable elastic conductors. *Nature Materials,* 8(6):494-499, 2009.

[162] Carl Thrasher, Zachary Farrell, Nicholas Morris, Carson Willey, and Christopher Tabor. Mechanoresponsive polymerized liquid metal networks. *Advanced Materials,* 31:1903864, 2019.

[163] Kyoung-Yong Chun, Youngseok Oh, Jonghyun Rho, Jong-Hyun Ahn, Young-Jin Kim, Hyouk Ryeol Choi, and Seunghyun Baik. Highly conductive, printable and stretchable composite films of carbon nanotubes and silver. *Nature Nanotechnology,* 5(12):853-857, 2010.

[164] Yun-hui Wu, Zhi-fu Deng, Ze-fei Peng, Rong-min Zheng, Shu-qi Liu, Shu-ting Xing, Jun-yun Li, De-qun Huang, and Lan Liu. A novel strategy for preparing stretchable and reliable biphasic liquid metal. *Advanced Functional Materials,* 29(36):1903840, 2019.

[165] Mahmoud Tavakoli, Mohammad H. Malakooti, Hugo Paisana, Yunsik Ohm, Daniel Green Marques, Pedro Alhais Lopes, Ana P. Piedade, Anibal T. de Almeida, and Carmel Majidi. EGaIn-assisted room-temperature sintering of silver nanoparticles for stretchable, inkjet-printed, thin-film electronics. *Advanced Materials,* 30:1801852, 2018.
[166] Ozutemiz Kadri Bugra, Wissman James, Ozdoganlar Osman Burak, and Majidi Carmel. EGaIn-metal interfacing for liquid metal circuitry and microelectronics integration. *Advanced Materials Interfaces,* 5:1701596, 2018.
[167] Tong Lu, Eric J. Markvicka, Yichu Jin, and Carmel Majidi. Soft-matter printed circuit board with UV laser micropatterning. *ACS Applied Materials & Interfaces,* 9(26):22055-22062, 2017.
[168] G. K. Reeves and H. B. Harrison. Obtaining the specific contact resistance from transmission line model measurements. *IEEE Electron Device Letters,* 3(5):111-113, 1982.
[169] Suin Kim, Jihye Oh, Dahee Jeong, and Joonbum Bae. Direct wiring of eutectic gallium-indium to a metal electrode for soft sensor systems. *ACS Applied Materials & Interfaces,* 11(22):20557-20565, 2019.
[170] Ishan D Joshipura, Hudson R Ayers, Carmel Majidi, and Michael D Dickey. Methods to pattern liquid metals. *Journal of materials chemistry c,* 3(16):3834-3841, 2015.
[171] Edward L. White, Michelle C. Yuen, Jennifer C. Case, and Rebecca K. Kramer. Low-cost, facile, and scalable manufacturing of capacitive sensors for soft systems. *Advanced Materials Technologies,* 2(9):1700072, 2017.
[172] Michael D. Bartlett, Eric J. Markvicka, and Carmel Majidi. Rapid Fabrication of Soft, Multilayered Electronics for Wearable Biomonitoring. *Advanced Functional Materials,* 26(46):8496-8504, December 2016.
[173] Ben O'Brien, Todd Gisby, and lain A. Anderson. Stretch sensors for human body motion. In *Proc. SPIE* 9056, volume 9056, page 905618. International Society for Optics and Photonics, March 2014.
[174] Cutinho, J. et al. Autonomous thermal-oxidative composition inversion and texture tuning of liquid metal surfaces. ACS Nano 12, 4744-4753 (2018).
[175] Daalkhaijav, U., Yirmibesoglu, O. D., Walker, S. & Mengiic, Y. Rheological modification of liquid metal for additive manufacturing of stretchable electronics. Adv. Mater. Technol. 3, 1700351 (2018).
[176] Chang, H. et al. Recoverable liquid metal paste with reversible rheological characteristic for electronics printing. ACS Appl. Mater. Interfaces 12, 14125-14135 (2020).
[177] Markvicka, E. J., Bartlett, M. D., Huang, X. & Majidi, C. An autonomously electrically self-healing liquid metal-elastomer composite for robust soft-matter robotics and electronics. Nat. Mater. 17, 618-624 (2018).
[178] William F Reus, Martin M Thuo, Nathan D Shapiro, Christian A Nijhuis, and George M Whitesides. The sam, not the electrodes, dominates charge transport in metal-monolayer//ga2o3/gallium-indium eutectic junctions. ACS nano, 6(6):4806-4822, 2012.
[179] Young-Joo Lee, Seung-Min Lim, Seol-Min Yi, Jeong-Ho Lee, Sung-gyu Kang, Gwang-Mook Choi, Heung Nam Han, Jeong-Yun Sun, In-Suk Choi, and Young-Chang Joo. Auxetic elastomers: Mechanically programmable meta-elastomers with an unusual poissons ratio overcome the gauge limit of a capacitive type strain sensor. Extreme Mechanics Letters, 31:100516, 2019.
[180] Yakov I Rabinovich, Madhavan S Esayanur, and Brij M Moudgil. Capillary forces between two spheres with a fixed volume liquid bridge: theory and experiment. Langmuir, 21(24):10992-10997, 2005.
[181] N. F. Uvarov. Estimation of composites conductivity using a general mixing rule. Solid State Ionics, 136-137: 1267-1272, November 2000.
[182] C. V. Ramana, E. J. Rubio, C. D. Barraza, A. Miranda Gallardo, Samantha McPeak, Sushma Kotru, and J. T. Grant. Chemical bonding, optical constants, and electrical resistivity of sputter-deposited gallium oxide thin films. Journal of Applied Physics, 115(4):043508, January 2014.
[183] Marcel Pourbaix. Atlas of electrochemical equilibria in aqueous solution. NACE, 307, 1974.
[184] Shigeo Ohira and Naoki Arai. Wet chemical etching behavior of β-ga2o3 single crystal. physica status solidi c, 5(9):3116-3118, 2008.
[185] Sin-Liang Ou, Dong-Sing Wuu, Yu-Chuan Fu, Shu-Ping Liu, Ray-Hua Horng, Lei Liu, and Zhe-Chuan Feng. Growth and etching characteristics of gallium oxide thin films by pulsed laser deposition. Materials Chemistry and Physics, 133(2-3):700-705, 2012.
[186] Ethan B Secor, Alexander B Cook, Christopher E Tabor, and Mark C Hersam. Wiring up liquid metal: Stable and robust electrical contacts enabled by printable graphene inks. Advanced Electronic Materials, 4(1): 1700483, 2018.
[187] Xuelin Wang, Linlin Fan, Jie Zhang, Xuyang Sun, Hao Chang, Bo Yuan, Rui Guo, Minghui Duan, and Jing Liu. Printed conformable liquid metal e-skin-enabled spatiotemporally controlled bioelectromagnetics for wireless multisite tumor therapy. Advanced Functional Materials, 29:1907063, 2019.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

What is claimed is:

1. A stretchable circuit board assembly comprising:
- at least one stretchable substrate layer;
- at least one conductive trace comprising a biphasic composition positioned over at least one surface of the stretchable substrate; and
- at least one electrical component electrically connected to the at least one conductive trace and positioned over the at least one surface of the stretchable substrate;
- wherein the biphasic composition comprises a conductive liquid and a particulate suspended in the conductive liquid;
- wherein the particulate has a median particle size between 100 nm and 200 microns;
- wherein the volumetric ratio of particulate to conductive liquid is between 0.02 and 0.70; and
- wherein the biphasic composition has a maximum normalized resistance of about 1 to about 15 at 400% strain.

2. The stretchable circuit board assembly of claim 1, further comprising:
- an adhesive configured to secure the at least one electrical component to the stretchable substrate; and
- at least one electrical lead electrically connected to the at least one trace, the electrical lead configured to electrically connect the at least one trace to at least one external electrical system.

3. The stretchable circuit board assembly of claim 1, wherein the at least one stretchable substrate is selected from the group consisting of VHB tape, paper, high-porosity foam, rubber, tape, silicone, polyimide, fabric, spandex, latex and combinations thereof.

4. The stretchable circuit board assembly of claim 1, wherein the at least one stretchable substrate is porous.

5. The stretchable circuit board assembly of claim 1, further comprising:

a second stretchable encapsulating layer positioned over the at least one trace;

at least one second trace positioned over the second stretchable encapsulating layer, electrically connected to the at least one electrical component; and at least one vertical interconnect access (VIA) electrically connected to the at least one trace and the at least one second trace.

6. The stretchable circuit board assembly of claim 1, wherein the at least one stretchable substrate comprises at least one additive, at least one tackifier, at least one adhesive, or a combination thereof.

7. The stretchable circuit board assembly of claim 1 further including surface treating the at least one stretchable substrate or the at least one electrical component.

8. The stretchable circuit board assembly of claim 1, wherein the at least one electrical component is surface treated on at least a portion of at least one surface.

9. The stretchable circuit board assembly of claim 1, wherein the at least one electrical component is selected from the group consisting of copper pads, integrated circuits, silicon dies, resistors, capacitors, inductors, wires, optical components, antennas, displays, user interfaces, sensors, actuators, other circuit board assemblies and combinations thereof.

10. The stretchable circuit board assembly of claim 1, further comprising at least one stretchable encapsulating layer positioned over the at least one stretchable substrate, the at least one trace, and the at least one electrical component, configured to cover the at least one trace and the at least one electrical component.

11. The stretchable circuit board assembly of claim 4, wherein the at least one stretchable substrate is modified by drilling, cutting, or a combination thereof of the stretchable substrate.

12. The stretchable circuit board assembly of claim 7, wherein the surface treating is plasma treatment.

13. The stretchable circuit board assembly of claim 8, wherein the at least one surface treated electrical component is plasma treated or coated with silanes, coupling agents, adhesives, oxidizers, acids, bases or combinations thereof.

14. The stretchable circuit board assembly of claim 10, wherein the stretchable encapsulating layer is porous.

15. The stretchable circuit board assembly of claim 10, further comprising at least one vertical interconnected access (VIA) connecting at least two traces across the at least one stretchable substrate layer, the at least one encapsulating layer, or a combination thereof.

16. The stretchable circuit board assembly of claim 14, wherein the stretchable encapsulating layer is modified by drilling, cutting, or a combination thereof of the stretchable encapsulating layer.

17. The stretchable circuit board assembly of claim 14, wherein the at least one additive is selected from the group consisting of silanes, primers, coupling agents, tactile mutators, oxidizers, acids, bases and combinations thereof.

18. A method of using a stretchable circuit board assembly comprising;

providing at least one stretchable circuit board assembly comprising:

at least one stretchable substrate layer;

at least one conductive trace comprising a biphasic composition positioned over at least one surface of the stretchable substrate;

at least one electrical component electrically connected to the at least one conductive trace and positioned over the at least one surface of the stretchable substrate;

at least one stretchable encapsulating layer positioned over the at least one stretchable substrate, the at least one trace, and the at least one electrical component, configured to cover the at least one trace and the at least one electrical component, and at least one vertical interconnected access (VIA) connecting at least two traces across at least one stretchable substrate layer, at least one encapsulating layer or a combination thereof, incorporating the at least one stretchable circuit board assembly into a wearable garment for sleep studies, diagnosis of sleep disorders, health tracking, fitness tracking, physical rehabilitation or combinations thereof;

wherein the biphasic composition comprises a conductive liquid and a particulate suspended in the conductive liquid;

wherein the particulate has a median particle size between 100 nm and 200 microns;

wherein the volumetric ratio of particulate to conductive liquid is between 0.02 and 0.70; and wherein the biphasic composition has a maximum normalized resistance of about 1 to about 15 at 400% strain.

19. A method of using a stretchable circuit board assembly comprising;

providing at least one stretchable circuit board assembly comprising:

at least one stretchable substrate layer;

at least one conductive trace comprising a biphasic composition positioned over at least one surface of the stretchable substrate;

at least one electrical component electrically connected to the at least one conductive trace and positioned over the at least one surface of the stretchable substrate;

at least one stretchable encapsulating layer positioned over the at least one stretchable substrate, the at least one trace, and the at least one electrical component, configured to cover the at least one trace and the at least one electrical component;

at least one vertical interconnected access (VIA) connecting at least two traces across at least one stretchable substrate layer, at least one encapsulating layer or a combination thereof; and incorporating the at least one stretchable circuit board assembly into a robotic system comprising one or more robots, robot-robot interfaces, human-robot interfaces, or combinations thereof;

wherein the biphasic composition comprises a conductive liquid and a particulate suspended in the conductive liquid;

wherein the particulate has a median particle size between 100 nm and 200 microns;

wherein the volumetric ratio of particulate to conductive liquid is between 0.02 and 0.70; and wherein the biphasic composition has a maximum normalized resistance of about 1 to about 15 at 400% strain.

20. A method of using a stretchable circuit board assembly comprising;

providing at least one stretchable circuit board assembly comprising:

at least one stretchable substrate layer;

at least one conductive trace comprising a biphasic composition positioned over at least one surface of the stretchable substrate;

at least one electrical component electrically connected to the at least one conductive trace and positioned over the at least one surface of the stretchable substrate;

at least one stretchable encapsulating layer positioned over the at least one stretchable substrate, the at least one trace, and the at least one electrical component, configured to cover the at least one trace and the at least one electrical component;

at least one vertical interconnected access (VIA) connecting at least two traces across at least one stretchable substrate layer, at least one encapsulating layer or a combination thereof; and incorporating the at least one stretchable circuit board assembly into an electronic device selected from the group consisting of a cell phone, a haptic device, a tablet, a display, a virtual reality headset, a handset, a sensor, an array of sensors, a gaming device, and combinations thereof;

wherein the biphasic composition comprises a conductive liquid and a particulate suspended in the conductive liquid;

wherein the particulate has a median particle size between 100 nm and 200 microns;

wherein the volumetric ratio of particulate to conductive liquid is between 0.02 and 0.70; and wherein the biphasic composition has a maximum normalized resistance of about 1 to about 15 at 400% strain.

* * * * *